United States Patent
Hampel et al.

(10) Patent No.: US 11,232,827 B2
(45) Date of Patent: Jan. 25, 2022

(54) MEMORY COMPONENT WITH PATTERN REGISTER CIRCUITRY TO PROVIDE DATA PATTERNS FOR CALIBRATION

(71) Applicant: Highlands LLC, Garrison, NY (US)

(72) Inventors: Craig E. Hampel, Los Altos, CA (US); Richard E. Perego, Thornton, CO (US); Stefanos Sidiropoulos, Palo Alto, CA (US); Ely K. Tsern, Los Altos, CA (US); Frederick A. Ware, Los Altos Hills, CA (US)

(73) Assignee: Highlands, LLC, Garrison, NY (US)

( * ) Notice: Subject to any disclaimer, the term of this patent is extended or adjusted under 35 U.S.C. 154(b) by 0 days.

(21) Appl. No.: 17/018,248

(22) Filed: Sep. 11, 2020

(65) Prior Publication Data
US 2021/0098048 A1  Apr. 1, 2021

Related U.S. Application Data

(63) Continuation of application No. 16/215,275, filed on Dec. 10, 2018, now Pat. No. 10,811,080, which is a
(Continued)

(51) Int. Cl.
*H04L 29/08* (2006.01)
*G11C 11/4076* (2006.01)
(Continued)

(52) U.S. Cl.
CPC .......... *G11C 11/4076* (2013.01); *G06F 3/061* (2013.01); *G06F 3/0629* (2013.01);
(Continued)

(58) Field of Classification Search
CPC ..... H04L 67/10; H04L 7/0087; H04L 7/0331; G06F 12/0246; G06F 21/44;
(Continued)

(56) References Cited

U.S. PATENT DOCUMENTS

| 3,753,232 A | 8/1973 | Sporer |
| 4,893,318 A | 1/1990 | Potash et al. |

(Continued)

FOREIGN PATENT DOCUMENTS

| GB | 2355571 A | 4/2001 |
| WO | WO-1999-061971 A1 | 12/1999 |

(Continued)

OTHER PUBLICATIONS

American National Standard for Information Technology, "High-Performance Parallel Interface-Framing Protocol (HIPPI-FP)," ANSI NCITS 210-1998, approved Jun. 9, 1998. 31 pages.
(Continued)

*Primary Examiner* — Eva Y Puente
(74) *Attorney, Agent, or Firm* — Kinney & Lange, P. A.

(57) ABSTRACT

A memory component includes a memory core comprising dynamic random access memory (DRAM) storage cells and a first circuit to receive external commands. The external commands include a read command that specifies transmitting data accessed from the memory core. The memory component also includes a second circuit to transmit data onto an external bus in response to a read command and pattern register circuitry operable during calibration to provide at least a first data pattern and a second data pattern. During the calibration, a selected one of the first data pattern and the second data pattern is transmitted by the second circuit onto the external bus in response to a read command received during the calibration. Further, at least one of the first and second data patterns is written to the pattern register circuitry in response to a write command received during the calibration.

20 Claims, 44 Drawing Sheets

Related U.S. Application Data continuation of application No. 15/633,677, filed on Jun. 26, 2017, now Pat. No. 10,192,609, which is a continuation of application No. 15/155,794, filed on May 16, 2016, now Pat. No. 9,721,642, which is a continuation of application No. 14/745,746, filed on Jun. 22, 2015, now Pat. No. 9,367,248, which is a continuation of application No. 13/967,245, filed on Aug. 14, 2013, now Pat. No. 9,099,194, which is a continuation of application No. 13/163,618, filed on Jun. 17, 2011, now Pat. No. 8,542,787, which is a continuation of application No. 11/855,993, filed on Sep. 14, 2007, now Pat. No. 7,965,567, which is a continuation of application No. 10/278,708, filed on Oct. 22, 2002, now Pat. No. 7,668,276.

(60) Provisional application No. 60/343,905, filed on Oct. 22, 2001, provisional application No. 60/376,947, filed on Apr. 30, 2002.

(51) Int. Cl.
| | |
|---|---|
| *G11C 7/10* | (2006.01) |
| *G11C 7/22* | (2006.01) |
| *G11C 11/4078* | (2006.01) |
| *H04L 7/00* | (2006.01) |
| *G06F 12/02* | (2006.01) |
| *G11C 11/406* | (2006.01) |
| *G11C 21/00* | (2006.01) |
| *G06F 3/06* | (2006.01) |
| *G11C 11/4072* | (2006.01) |
| *G11C 11/4093* | (2006.01) |
| *H01L 27/11582* | (2017.01) |

(52) U.S. Cl.
CPC ........ *G06F 3/0671* (2013.01); *G06F 12/0246* (2013.01); *G11C 7/10* (2013.01); *G11C 7/106* (2013.01); *G11C 7/1051* (2013.01); *G11C 7/1066* (2013.01); *G11C 7/1078* (2013.01); *G11C 7/1087* (2013.01); *G11C 7/22* (2013.01); *G11C 7/222* (2013.01); *G11C 11/4072* (2013.01); *G11C 11/4078* (2013.01); *G11C 11/4093* (2013.01); *G11C 11/40611* (2013.01); *G11C 21/00* (2013.01); *H04L 7/0091* (2013.01); *G11C 2207/2254* (2013.01); *H01L 27/11582* (2013.01); *H04L 7/0025* (2013.01); *H04L 7/0079* (2013.01); *H04L 67/10* (2013.01)

(58) Field of Classification Search
CPC .. G06F 21/575; G06F 21/602; G06F 11/0772; G06F 11/1044; G06F 21/76; G06F 3/0659; G06F 3/0679; G06F 9/30101; G06F 11/1004; G06F 11/1052; H04W 24/08; H04W 4/06; H04W 60/00; H04W 84/18; H04W 8/005; H04W 8/26; H04W 48/08; H04W 4/029; H04W 4/48; H04W 4/80; H04W 52/0254; H04W 88/06; H04W 12/084
USPC .............................. 365/189, 230.05
See application file for complete search history.

(56) References Cited

U.S. PATENT DOCUMENTS

| | | |
|---|---|---|
| 5,077,759 A | 12/1991 | Nakahara |
| 5,097,489 A | 3/1992 | Tucci |
| 5,268,639 A | 12/1993 | Gasbarro et al. |
| 5,274,648 A | 12/1993 | Eikill et al. |
| 5,325,053 A | 6/1994 | Gasbarro et al. |
| 5,357,195 A | 10/1994 | Gasbarro et al. |
| 5,410,718 A | 4/1995 | Masumura et al. |
| 5,485,490 A | 1/1996 | Leung et al. |
| 5,521,878 A | 5/1996 | Yamazaki et al. |
| 5,554,945 A | 9/1996 | Lee et al. |
| 5,577,236 A | 11/1996 | Johnson et al. |
| 5,579,352 A | 11/1996 | Llewellyn |
| 5,589,788 A | 12/1996 | Goto |
| 5,598,540 A | 1/1997 | Krueger |
| 5,614,855 A | 3/1997 | Lee et al. |
| 5,615,358 A | 3/1997 | Vogley |
| 5,657,481 A | 8/1997 | Farmwald et al. |
| 5,671,231 A | 9/1997 | Cooper |
| 5,684,421 A | 11/1997 | Chapman et al. |
| 5,793,822 A | 8/1998 | Anderson et al. |
| 5,805,603 A | 9/1998 | Araki et al. |
| 5,828,568 A | 10/1998 | Sunakawa et al. |
| 5,831,929 A | 11/1998 | Manning |
| 5,872,736 A | 2/1999 | Keeth |
| 5,892,981 A | 4/1999 | Wiggers |
| 5,910,920 A | 6/1999 | Keeth |
| 5,917,760 A | 6/1999 | Millar |
| 5,926,034 A | 7/1999 | Seyyedy |
| 5,926,369 A | 7/1999 | Ingraham |
| 5,940,608 A | 8/1999 | Manning |
| 5,940,609 A | 8/1999 | Harrison |
| 5,946,244 A | 8/1999 | Manning |
| 5,948,083 A | 9/1999 | Gervasi |
| 5,950,115 A | 9/1999 | Momtaz et al. |
| 5,953,284 A | 9/1999 | Baker et al. |
| 5,963,502 A | 10/1999 | Watanabe et al. |
| 5,986,955 A | 11/1999 | Siek et al. |
| 6,000,022 A | 12/1999 | Manning |
| 6,006,339 A | 12/1999 | McClure |
| 6,011,732 A | 1/2000 | Harrison et al. |
| 6,016,282 A | 1/2000 | Keeth |
| 6,026,050 A | 2/2000 | Baker et al. |
| 6,029,250 A | 2/2000 | Keeth |
| 6,032,282 A | 2/2000 | Masuda et al. |
| 6,047,346 A | 4/2000 | Lau et al. |
| 6,058,066 A * | 5/2000 | Norris ................... G06F 7/026 365/200 |
| 6,078,623 A | 6/2000 | Isobe et al. |
| 6,101,152 A | 8/2000 | Horowitz et al. |
| 6,125,157 A | 9/2000 | Donnelly et al. |
| 6,128,244 A | 10/2000 | Thompson et al. |
| 6,131,149 A | 10/2000 | Lu et al. |
| 6,154,821 A | 11/2000 | Barth et al. |
| 6,160,423 A | 12/2000 | Haq |
| 6,169,434 B1 | 1/2001 | Portmann |
| 6,240,128 B1 | 5/2001 | Banerjea et al. |
| 6,247,138 B1 | 6/2001 | Tamura et al. |
| 6,262,611 B1 | 7/2001 | Takeuchi |
| 6,262,921 B1 | 7/2001 | Manning |
| 6,279,073 B1 | 8/2001 | McCracken et al. |
| 6,282,210 B1 | 8/2001 | Rapport et al. |
| 6,292,903 B1 | 9/2001 | Coteus et al. |
| RE37,452 E | 11/2001 | Donnelly et al. |
| 6,316,980 B1 | 11/2001 | Vogt et al. |
| 6,330,683 B1 | 12/2001 | Jeddeloh |
| 6,346,911 B1 | 2/2002 | King |
| 6,397,042 B1 | 2/2002 | Prentice et al. |
| 6,359,815 B1 | 3/2002 | Sato et al. |
| 6,362,995 B1 | 3/2002 | Moon et al. |
| 6,369,627 B1 | 4/2002 | Tomita |
| 6,370,661 B1 | 4/2002 | Miner |
| 6,373,293 B1 | 4/2002 | Best |
| 6,374,360 B1 | 4/2002 | Keeth et al. |
| 6,378,079 B1 | 4/2002 | Mullarkey |
| 6,434,081 B1 | 8/2002 | Johnson et al. |
| 6,473,852 B1 * | 10/2002 | Hanjani ................... G06F 1/24 327/143 |
| 6,498,522 B2 | 12/2002 | Ikeda et al. |
| 6,510,503 B2 | 1/2003 | Gillingham et al. |
| 6,525,615 B1 | 2/2003 | Masenas et al. |
| 6,532,179 B2 | 3/2003 | Yagishita |
| 6,553,472 B2 | 4/2003 | Yang et al. |

(56) References Cited

U.S. PATENT DOCUMENTS

| | | | |
|---|---|---|---|
| 6,587,525 | B2 | 7/2003 | Jeong et al. |
| 6,608,829 | B1 | 8/2003 | Johnson |
| 6,611,905 | B1 | 8/2003 | Grundon et al. |
| 6,643,787 | B1 | 11/2003 | Zerbe et al. |
| 6,646,953 | B1 | 11/2003 | Stark |
| 6,675,272 | B2 | 1/2004 | Ware et al. |
| 6,686,759 | B1 * | 2/2004 | Swamy .......... G01R 31/318558 324/750.15 |
| 6,691,214 | B1 | 2/2004 | Li et al. |
| 6,724,846 | B1 | 4/2004 | Lo |
| 6,735,709 | B1 | 5/2004 | Lee et al. |
| 6,754,126 | B2 | 6/2004 | Yamaguchi et al. |
| 6,779,096 | B1 | 8/2004 | Cornelius et al. |
| 6,804,764 | B2 | 10/2004 | LaBerge et al. |
| 6,807,614 | B2 | 10/2004 | Chung |
| 6,839,393 | B1 | 1/2005 | Sidiropoulos |
| 6,889,357 | B1 | 5/2005 | Keeth et al. |
| 6,895,062 | B1 | 5/2005 | Wilson |
| 6,928,571 | B1 | 8/2005 | Bonnella et al. |
| 6,949,958 | B2 | 9/2005 | Zerbe et al. |
| 6,970,988 | B1 | 11/2005 | Chung |
| 7,010,077 | B1 | 3/2006 | Dunlop et al. |
| 7,076,678 | B2 | 7/2006 | LaBerge |
| 7,076,745 | B2 | 7/2006 | Togo |
| 7,100,066 | B2 | 8/2006 | Jeong |
| 7,116,744 | B2 | 10/2006 | Saze et al. |
| 7,159,092 | B2 | 1/2007 | Johnson et al. |
| 7,224,595 | B2 | 5/2007 | Dreps et al. |
| 7,466,724 | B2 | 12/2008 | Holaday et al. |
| 7,602,859 | B2 | 10/2009 | Cheng et al. |
| 7,646,835 | B1 | 1/2010 | Rozas |
| 7,668,276 | B2 | 2/2010 | Hampel et al. |
| 7,702,057 | B2 | 4/2010 | Sidiropoulos |
| 7,778,093 | B2 | 8/2010 | Tseng |
| 10,192,609 | B2 | 1/2019 | Hampel et al. |
| 2001/0021141 | A1 | 9/2001 | Ikeda et al. |
| 2001/0026479 | A1 | 10/2001 | Yagishita |
| 2001/0047450 | A1 | 11/2001 | Gillingham et al. |
| 2002/0004922 | A1 | 1/2002 | Manning |
| 2002/0075748 | A1 | 6/2002 | Benzinger et al. |
| 2002/0131539 | A1 | 9/2002 | Li et al. |
| 2002/0174311 | A1 | 11/2002 | Ware et al. |
| 2002/0191475 | A1 | 12/2002 | Lee et al. |
| 2002/0194546 | A1 | 12/2002 | Ooishi |
| 2002/0196885 | A1 | 12/2002 | Kim et al. |
| 2003/0065500 | A1 | 4/2003 | Holaday et al. |
| 2003/0212930 | A1 | 11/2003 | Aung et al. |
| 2005/0193293 | A1 | 9/2005 | Shikata |
| 2009/0271652 | A1 | 10/2009 | Song et al. |
| 2015/0229467 | A1 | 8/2015 | Lee et al. |

FOREIGN PATENT DOCUMENTS

| | | |
|---|---|---|
| WO | WO-2001-029680 A1 | 4/2001 |
| WO | WO-2001-048972 A1 | 7/2001 |
| WO | WO-2001-085884 A2 | 11/2001 |

OTHER PUBLICATIONS

Cecchi et al., "FP 20.2: A 1GB/S 8-CI Link in 0.8um BICMOS," IEEE International Solid-State Circuits Conference, Digest of Technical Papers, Feb. 1995, pp. 326-327. 2 pages.

Chang et al., "A 2 GB/s Asymmetric Serial Link for High-Bandwidth Packet Switches," Hot Interconnects V, Stanford University, Aug. 1997. 9 pages.

Chang et al., "A 2 GB/s/pin CMOS Asymmetric Serial Link," Symposium on VLSI Circuits Digest of Technical Papers, Dept. of Electrical Engineering, Stanford University, Serial Link:1-24. 1998. 2 pages.

EP Extended Search Report dated Apr. 2, 2008 re EP Application No. 07117256.3. 11 pages.

EP Office Action dated Feb. 3, 2012 re EP Application 07117256.3. 4 pages.

EP Office Action dated Jul. 8, 2010 re EP Application No. 07117256. 3. 5 Pages.

EP Response dated Apr. 11, 2012 to the Official Communication dated Feb. 3, 2012 re EP Applcation No. 07117256.3, Includes New Claims (Highlighted and Clear Copy) and New Description Page. 11 pages.

EP Response dated Jan. 7, 2011 to the Official Communication dated Jul. 8, 2010 re EP Application No. 07117256.3. 17 Pages.

EP Supplemental Search Report dated Jul. 14, 2006 in EP Application No. 02802180.6. 4 pages.

Gillingham et al., "SLDRAM: High Performance Open-Standard Memory," IEEE Micro, Nov./Dec. 1997, pp. 29-39, vol. 17, No. 6, Institute of Electrical and Electronics Engineers, Inc., Los Alamitos, California. 11 pages.

Gillingham, Peter, "SLDRAM Architectural and Functional Overview," SLDRAM Consortium, Aug. 29, 1997, pp. 1-14. 14 pages.

Hammamoto et al., "400-MHz Random Column Operating SDRAM Techniques With Self-Skew Compensation," IEEE Journal of Solid-State Circuits, vol. 33, No. 5, May 1998, pp. 770-778. 9 pages.

IBM, "Binarly Weighted Element Pulse Delay Line," Technical Disclosure Bulletin, vol. 39, No. 6, Jun. 1996, pp. 153-154, XP000678555. 2 pages.

IEEE, "Media Access Control (MAC) Parameters, Physical Layer, Repeater and Management Parameters for 1000 Mb/s Operation," Draft P802.3z/D5.0, May 1998, Supplement to Carrier Sense Multiple Access with Collision Detection (CSMA/CD) Access Method & Physical Layer Specifications, LAN MAN Standards Committee of the IEEE Computer Society. 384 pages.

Koo et al., "A4-400 MHz Jitter-Suppressed Delay-Locked Loop With Frequency Division Method," 6th International Conference on Seoul, South Korea, Oct. 26-27, 1999, Piscataway, NJ, pp. 339-341, XP010370138. 3 pages.

Kushiyama et al., "A 500-Megabyte/s Data-Rate 4.5M DRAM," IEEE Journal of Solid State Circuits, IEEE Service Center, Piscataway, NJ, US, vol. 28, No. 4, Apr. 1, 1993, pp. 490-498. 9 pages.

Maheshwari et al., "Optimizing Large Multiphase Level-Clocked Circuits," IEEE Transactions on Computer-Aided Design of Integrated Circuits and Systems, vol. 18, No. 9, Sep. 1999, pp. 1249-1264. 16 pages.

Manjikian et al., "Scheduling of Wavefront Parallelism on Scalable Shared-Memory Multiprocessors," 1996 International Conference on Parallel Processing, vol. 3, pp. 122-131. 10 pages.

Mckeown et al., "The Tiny Tera: A Packet Switch Core," Depts. Of Electrical Engineering and Computer Science, Stanford University, pp. 1-13, Mar. 24, 1997. 13 pages.

Park et al., "A Semi-Digital Delay Locked Loop for Clock Skew Minimization," 12th International Conference on VLSI Design, Jan. 1999, pp. 584-588. 5 pages.

PCT International Search Report dated Feb. 10, 2003 re International Application No. PCT/US2002/33707. 1 page.

Sato et al., "5GByte/s data transfer scheme with bit-to-bit skew control for synchronous DRAM," 1998 Symposium on VLSI Circuits—Digest of Technical Papers, Jun. 11-13, 1998, Honolulu, Hawaii, pp. 64-65. 3 pages.

Sato et al., "A 5-GByte/s Data-Transfer Scheme With Bit-to-Bit Skew Control for Synchronous DRAM," IEEE Journal of Solid-State Circuit, vol. 34, No. 5, May 1999, pp. 653-660. 8 pages.

Sidiropoulos et al., "A 700 Mb/s/pin CMOS Signaling Interface Using Current Integrating Receivers," IEEE Journal of Solid-State Circuits, vol. 32, No. 5, pp. 681-690, May 1997. 10 pages.

SLDRAM Inc., "SLD4M18DR400 4 MEG X 18 SLDRAM: 400 Mb/s/pin SLDRAM 4 M x 18 SLDRAM Pipelined, Eight Bank, 2.5 V Operation," Jul. 9, 1998. 69 pages.

Wang et al., "A 500-Mb/s quadruple data rate SDRAM interface using a skew cancellation technique," Apr. 2001, IEEE Journal of Solid-State Circuits, pp. 648-657, vol. 36, No. 4. 10 pages.

Yeung et al., "A 2.4 GB/s/pin Simultaneous Bidirectional Parallel Link with Per-Pin Skew Compensation," IEEE Journal of Solid-State Circuits, vol. 35, No. 11, pp. 1619-1627, Nov. 2000. 10 pages.

Yeung, E., et al., "A 2.4Gbps per pin Simultaneous Bidirectional Parallel Link with per Pin Skew Compensation", ISSCC 2000, in press as of Jan. 9, 2000, pp. 1-11. 11 pages.

(56) References Cited

OTHER PUBLICATIONS

Yoshimura et al., "A 622-Mb/s Bit/Frame Synchronizer for High-Speed Backplane Data Communication," IEEE Journal of Solid-State Circuits, vol. 31, No. 7, Jul. 1996, pp. 1063-1066. 4 pages.

\* cited by examiner

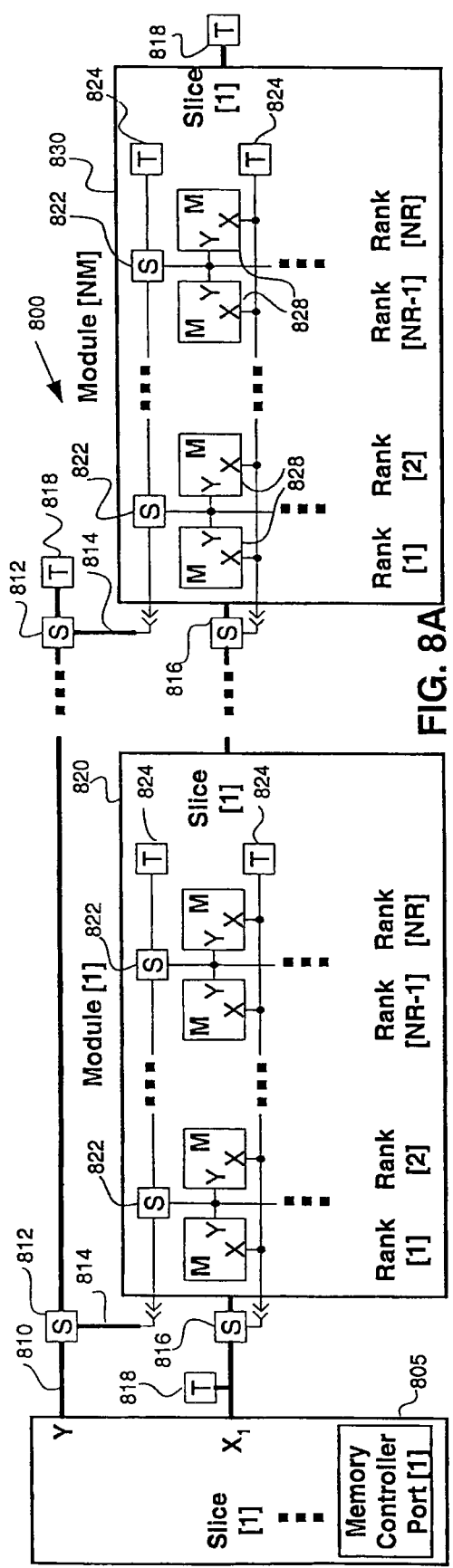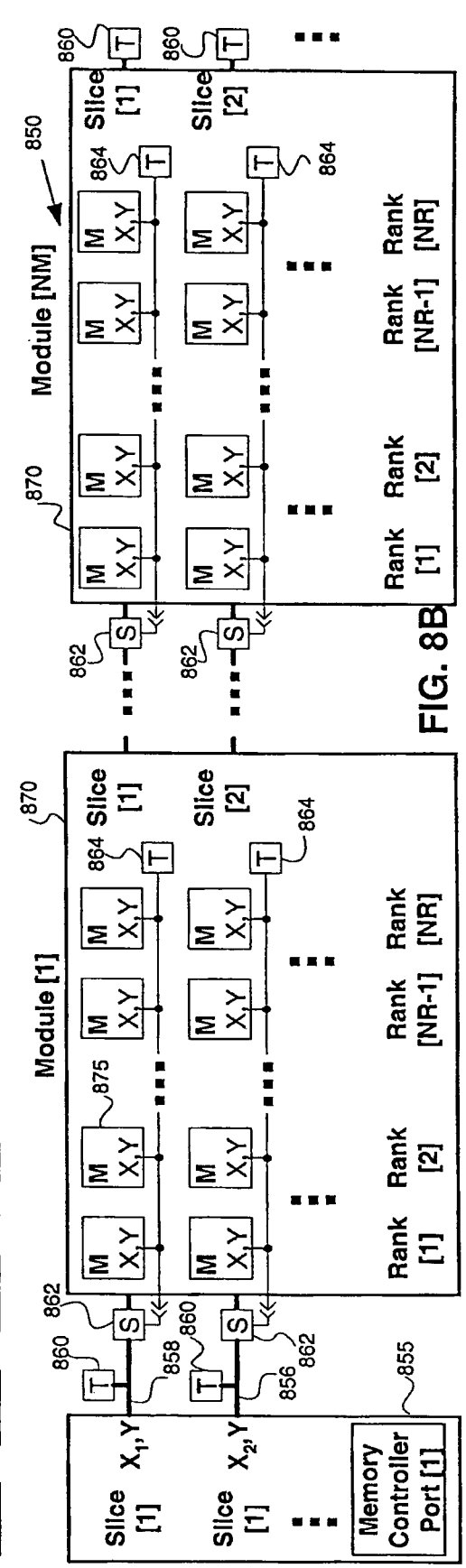
FIG. 8A  Topology Variation Yb - One Y bus shared by all modules using splitter (S) elements
FIG. 8B  Topology Variation Yc - Y bus signals duplicated on each X bus slice Memory System - Topology Variation Xb "S" Element Variation Sa - Clocked or unclocked buffer "S" Element Variation Sc - Wire stub with series damping "S" Element Variation Sb - Pass-through switch or buffer "S" Element Variation Sd - Impedance-matching splitter

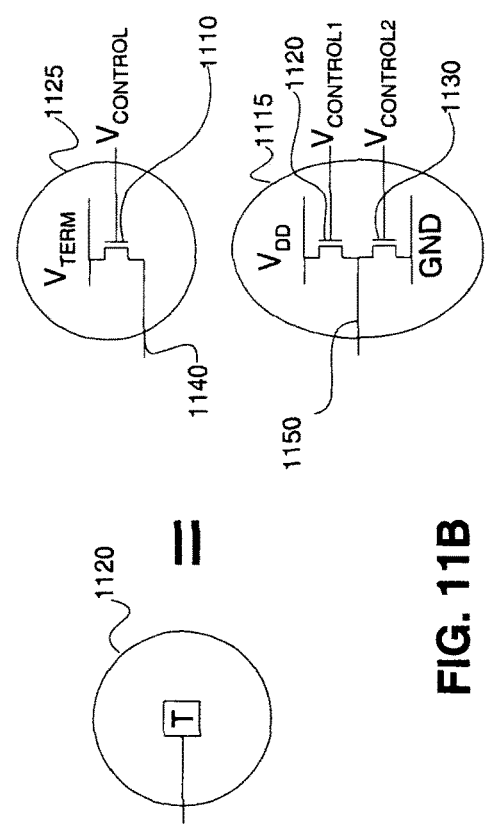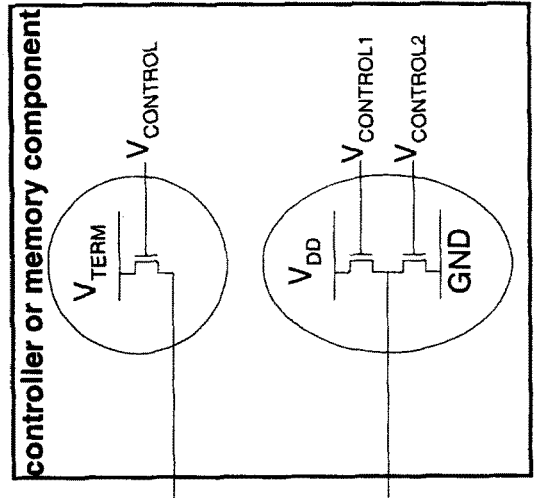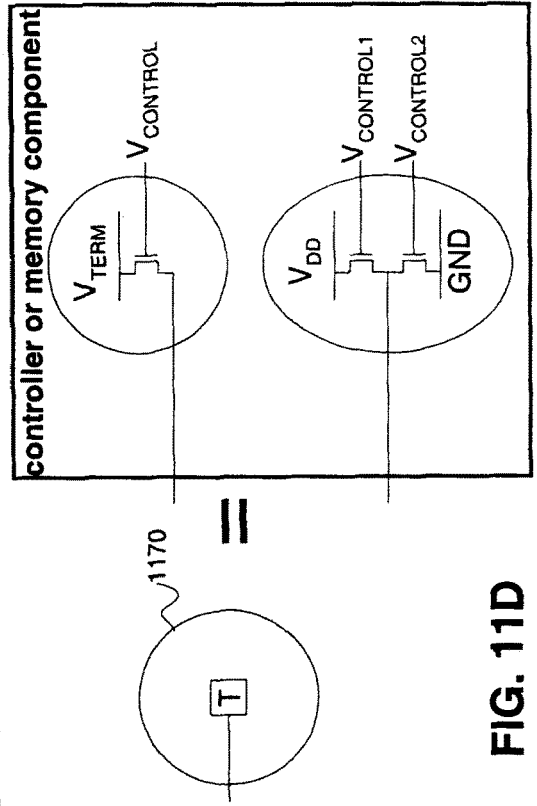
FIG. 11A
"T" Element Variation Ta - Passive external component
FIG. 11B
"T" Element Variation Tb - Active external component
FIG. 11C
"T" Element Variation Tc - Passive internal component
FIG. 11D
"T" Element Variation Td - Active internal component

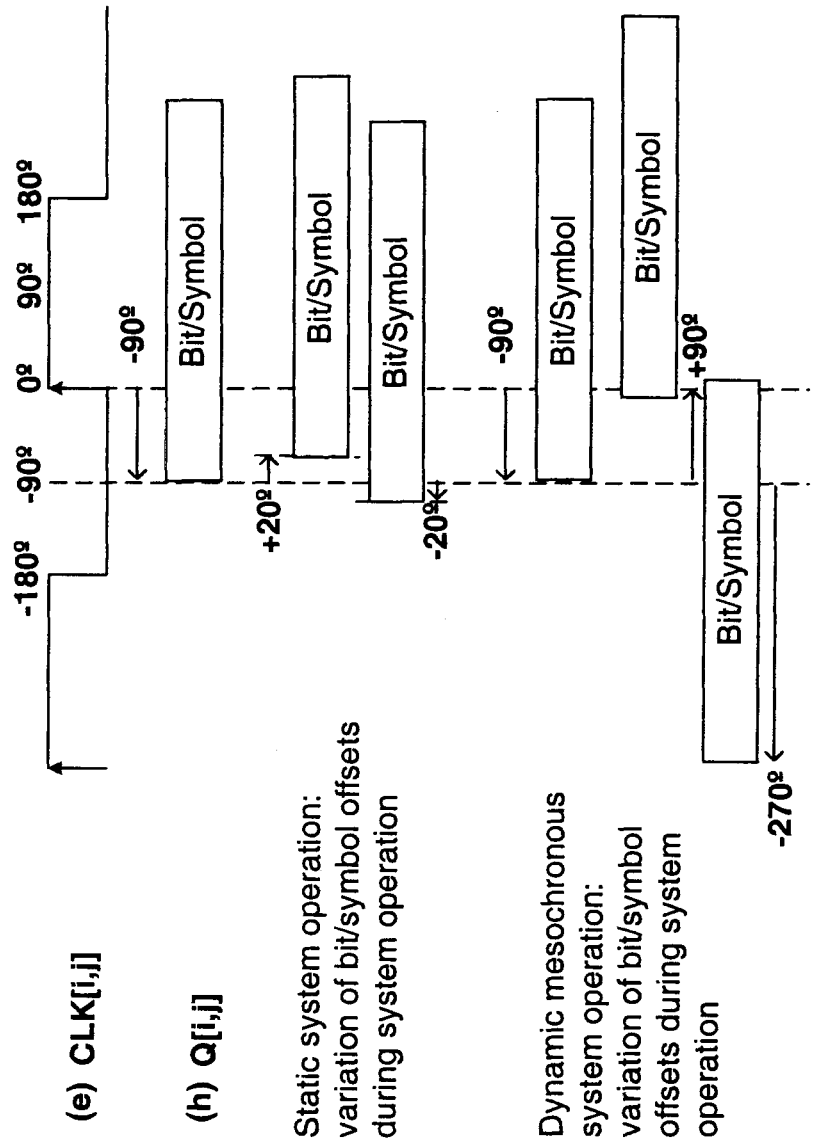

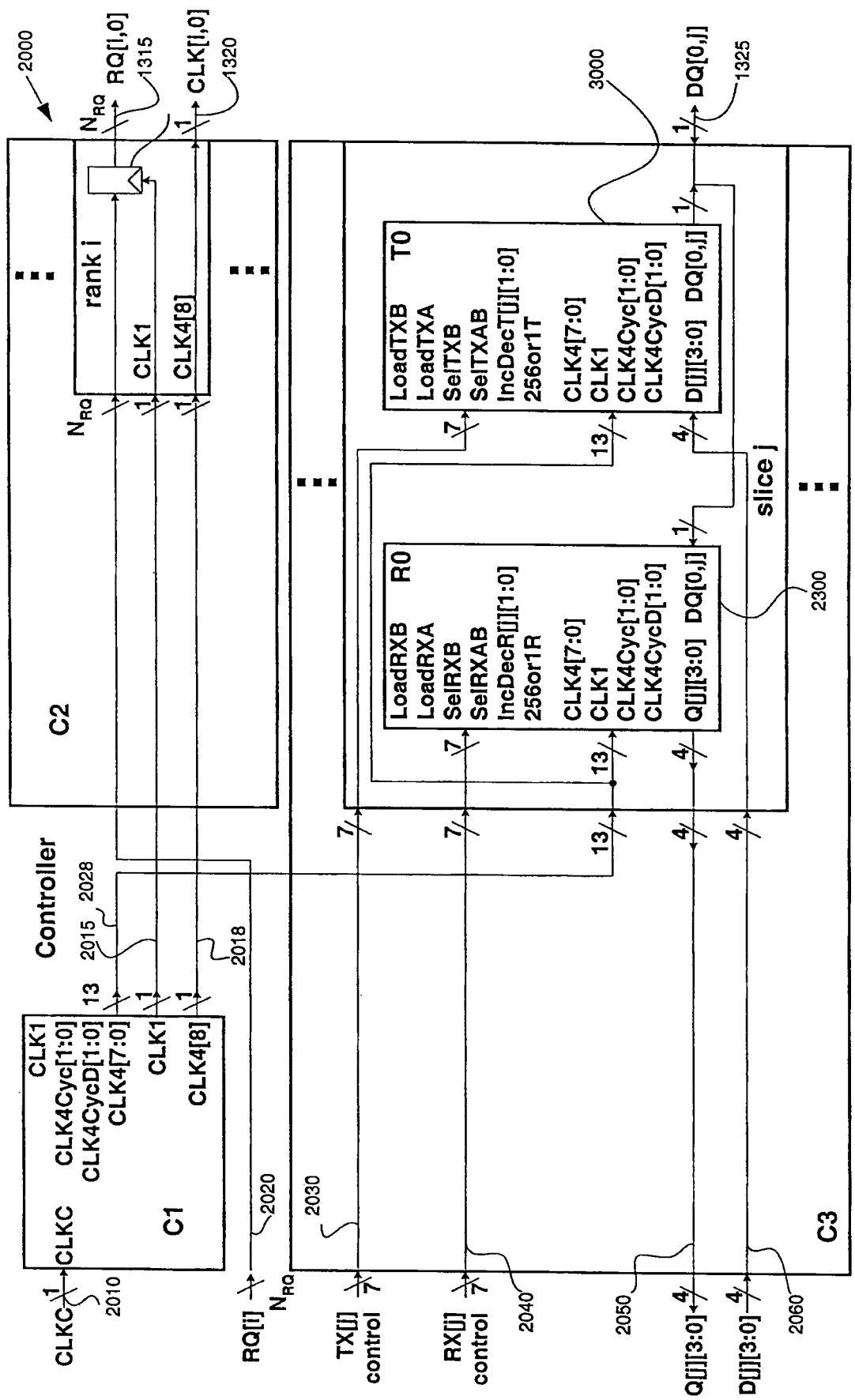
FIG. 20  Controller Clock, Rank, and Slice - Logic Diagram

MEMORY COMPONENT WITH PATTERN REGISTER CIRCUITRY TO PROVIDE DATA PATTERNS FOR CALIBRATION

FIELD OF THE INVENTION

This invention generally relates to the field of digital circuits, and more particularly to an apparatus and method for phase adjustment and memory device signaling systems.

BACKGROUND OF THE INVENTION

Integrated circuits connect to and communicate with each other, typically using a bus with address, data and control signals. Today's complex digital circuits contain storage devices, finite-state machines, and other such structures that control the movement of information by various clocking methods. Transferred signals must be properly synchronized or linked so that information from a transmit point is properly communicated to and received by a receive point in a circuit.

The term "signal" refers to a stream of information communicated between two points within a system. For a digital signal, this information consists of a series of "symbols," with each symbol driven for an interval of time. In digital applications, the symbols are generally referred to as "bits" in which values are represented by "zero" and "one" symbols, although other symbol sets are possible. The values commonly used to represent the zero and one symbols are voltage levels, although other variations are possible.

In some cases, a signal will be given more than one name (using an index notation), with each index value representing the signal value present at a particular point on a wire. The two or more signal names on a wire represent the same information, with one signal value being a time-shifted version of the other. The time-shifting is the result of the propagation of voltage and current waveforms on a physical wire. Using two or more signal names for the same signal information allows for easy accounting of the resulting propagation delays.

The term "wire" refers to the physical interconnection medium which connects two or more points within a system, and which serves as the conduit for the stream of information (the signal) communicated between the points. For example, but without limitation, a wire can be a copper wire, a metal (e.g., copper) trace on a printed circuit board, or a fiber optic cable. A "bus" is a wire or a set of wires. These wires are collected together because they may share the same physical topology, or because they have related timing behavior, or for some other reason. The assignment of wires into a bus is often a notational convenience. The terms "line," "connection" and "interconnect" mean either a bus, wire or set of wires as appropriate to the context in which those terms are used.

The term "signal set" refers to one or more signals. Whenever a signal or signal set is described herein as being coupled to or attached to a device or component, it is to be understood that the device or component is coupled to a wire, set of wires or bus that carries the signal.

The mapping of a signal onto a physical wire involves tradeoffs related to system speed. The use of one physical wire per signal (single-ended signaling) uses fewer wires. The use of two physical wires per signal (differential signaling) permits shorter bit intervals. The mapping of signals onto physical wires can also involve optimization related to system resources. Two different signals can share the same wire (i.e., they are multiplexed) to minimize the number of physical wires. Typically, this must be done so that the potential timing conflicts that result are acceptable (in terms of system performance, for instance). The interval of time during which a bit or symbol is transmitted or received at a particular point on a wire or at a device interface is the "symbol time interval," "bit time," "bit time interval," "bit window," or "bit eye." These time interval terms for transmitting and receiving are used interchangeably. Usually, the bit interval for transmit signals must be greater than or equal to the bit interval for receive signals.

In FIG. 1, a bus 20 interconnects a memory controller 22 and memory components (MEMS) 24. Physically, the bus 20 comprises traces on a printed circuit board or wiring board, wires or cables and connectors. Each of these devices 22, 24 has a bus output driver or transmitter circuit 30 that interfaces with the bus 20 to drive data signals onto the bus to send data to other integrated circuits. Each of these devices also has a receiver. In particular, the bus output drivers 30 in the memory controller 22 and MEMS 24 are used to transmit data over the bus 20. The bus 20 transmits signals at a rate that is a function of many factors such as the system clock speed, the bus length, the amount of current that the output drivers can drive, the supply voltages, the spacing and width of the wires or traces making up the bus, and the physical layout of the bus itself. Clock, or control, signals serve the purpose of marking the passage of time, thereby controlling the transfer of information from one storage location to another. The memory controller 22 is connected to a central processing unit (CPU) 40 and other system components 50, such as a graphics control unit, over bus 45.

As signals pass over a bus and through device interfaces, the signals experience propagation delays. Propagation delays are affected by variables such as temperature, supply voltage and process parameters (which determine physical characteristics of the devices sending and receiving the signals). For example, at a low operating temperature with a high supply voltage, signals may be transmitted with a relatively short delay. Alternatively, at a low supply voltage and high operating temperature, a significantly longer delay may be experienced by transmitted signals.

Variations in the process parameters, which result in variations in the performance of otherwise identical devices, cause devices either on a single bus, or devices on parallel buses to experience different signal propagation delays. The load on each bus, which depends on the number of devices connected to the bus, may also affect signal propagation. In sum, the phase relationships between transmitted and received signals, are affected by numerous factors, some of which may change during the operation of a system. Small changes in propagation delays can result in data transfer errors, especially in systems with very high bit (or more generally, symbol) transfer rates, and thus very short bit (or symbol) times. In order to account for actual propagation delays, it is desirable, especially in systems with very high bit (or symbol) transfer rates (e.g., without limitation, 250 Mb/s or higher) to synchronize signal transmitters and receivers, to account for actual propagation delays. The present invention provides systems and methods for dynamically synchronizing signal transmitters and receivers, even when the variations in propagation delays caused by temperature, voltage, process and loading variations exceed an average symbol time interval. Normally, a variation in propagation delay of even a half symbol time interval will cause a memory system or data transfer system to fail, because movement of a half symbol time will cause the data sample point to move from the center of the data eye to the edge of the data eye. Change in the propagation delay of more than a half symbol time will, in conventional prior art systems, cause the wrong symbol to be sampled by the receiving device. In the present invention, such changes in propagation delay are automatically "calibrated out" by the use of dynamic propagation delay calibration apparatus and methods.

SUMMARY OF THE INVENTION

This invention generally relates to apparatus and methods for adjusting phase of data signals to compensate for phase-offset variations between devices during normal operation. Systems designed in accordance with the present invention allow for adjusting phase of data signals individually in each transmit data unit and receive data unit across multiple data slices with a common set of phase vector clock signals and a corresponding clock cycle count signal. One of the benefits of the invention is that the transmission of signal information between a first device (such as for example a memory controller) and a second device (such as for example a memory component) occurs without errors even when the accumulated delays between the first device and second device change by a half symbol time interval or more during operation of the system. Another benefit of the invention is the reduction of circuitry required, such as phase-lock-loops, for individually adjusting the phase of each transmit data unit and receive data unit across multiple data slices, which in turn results in reduction in complexity and cost of the system.

BRIEF DESCRIPTION OF THE DRAWINGS

For a more complete understanding of the present invention and advantages thereof, reference is now made to the following description taken in conjunction with the accompanying drawings:

FIGS. 8A and 8B depict dynamic mesochronous memory systems in which the X and Y buses are parallel to each other.

FIGS. 11A-11D depict sample internal and external termination component variations.

FIGS. 14A and 14B depict a sequence of timing signals for a read transfer of the system topology of FIG. 13.

FIG. 20 is a block diagram for a controller of the topology of FIG. 13 comprising three blocks, C1-C3, and interconnecting buses between the blocks.

DETAILED DESCRIPTION OF THE PREFERRED EMBODIMENTS

The term "mesochronous" refers to a relationship between two signals having the same average rate or frequency, but which may have arbitrarily different phases. The term "mesochronous system" refers to a set of clocked components in which the clock signal for each clocked component has the same frequency, but can have a relative phase offset. The term "static mesochronous system" means that the relative phase offsets are fixed and do not vary during normal system operation. The approach of using fixed relative phase offsets that do not vary during normal system operation has been the method practiced in prior art systems. The present invention is directed to "dynamic mesochronous systems" in which the phase offsets of the clocked components are allowed to drift over some range during system operation. The term "normal system operation" is used in this document to refer to ordinary memory access operations, such as read, write and refresh operations. Calibration operations, which are used to determine timing offsets required for successful command and data transmission between the memory controller and memory components of a memory systems, are generally not considered to be normal memory operations. In the preferred embodiment, the calibration hardware in the memory controller is configured to perform calibration operations periodically, and/or during periods of little memory system usage, and such calibration operations are generally separated by periods during which normal memory operations are performed.

This document describes apparatus and techniques for managing the timing of signals within a system that can be beneficially applied to systems having a wide variety of signals, signal rates, time intervals, buses, signal-to-wire mappings, and so on. While the disclosed description will often identify a preferred embodiment or implementation to illustrate a concept, it should be understood that the concept is not limited to the embodiment or implementation employed in the discussion.

All of the variations of signal, symbol, bit, values, time intervals, buses, and signal-to-physical wire mapping are independent of the methods described in this document. This document describes a set of techniques for managing the timing of signals within a system that can be beneficially applied to all the variations described above. The following description will often choose a preferred variation to illustrate each concept. However, it should be understood that the concept under discussion is not limited to the particular variation that is employed in the discussion.

Figure 1:
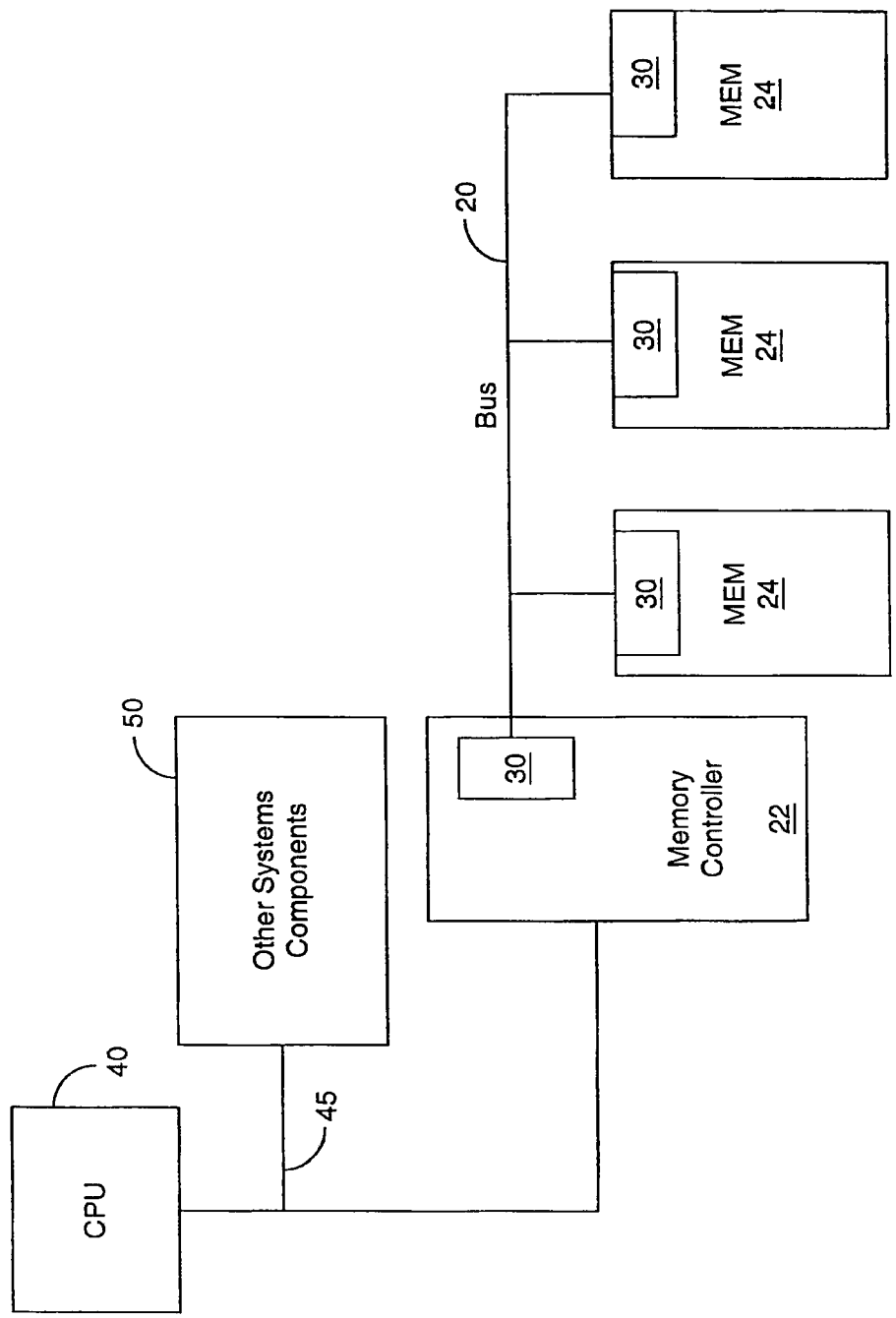
FIG. 1 is a block diagram of a prior art bus connecting a memory controller and a number of memory components.
Figure 2:
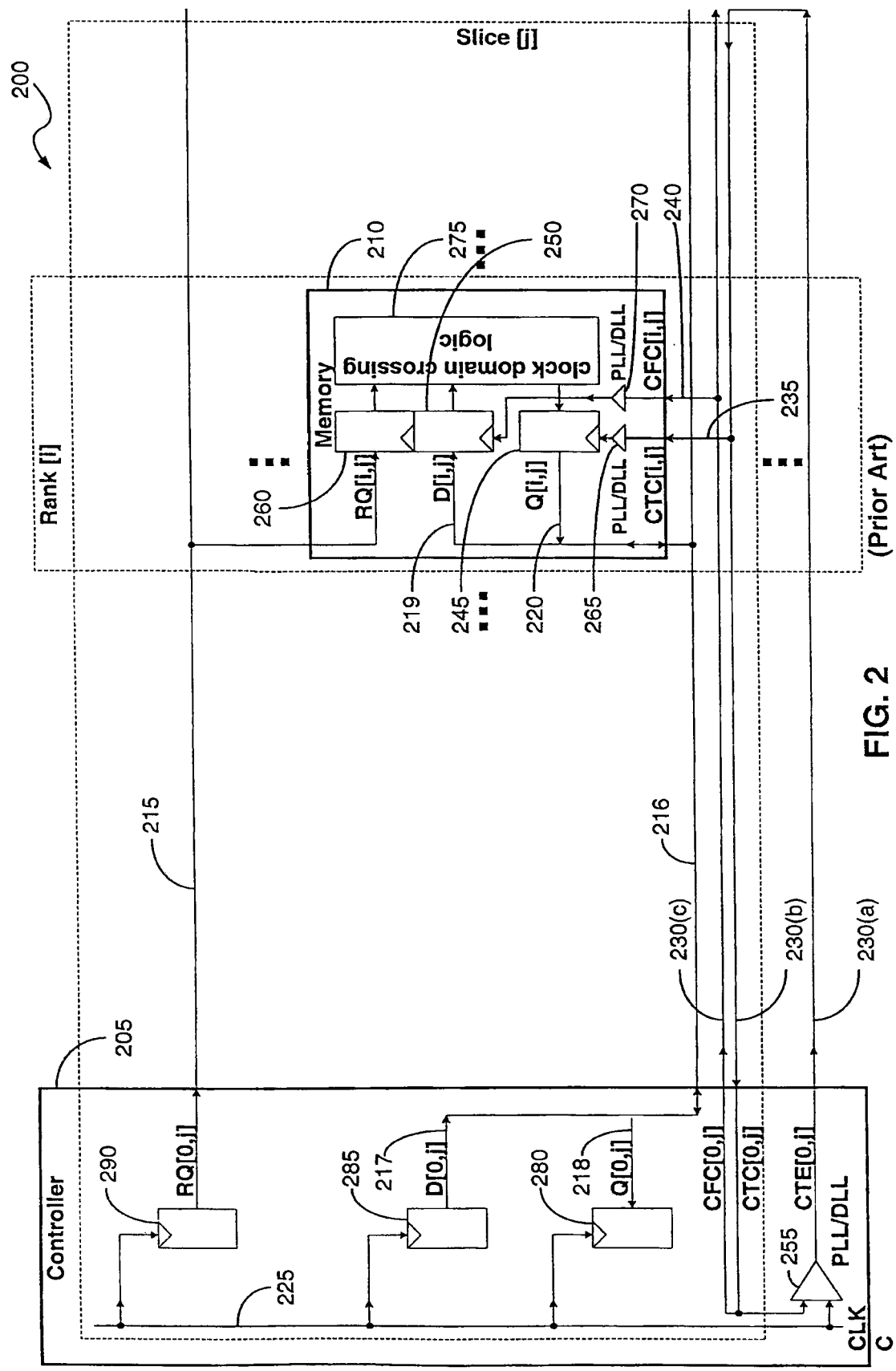
FIG. 2 is a block diagram of a prior art static mesochronous memory system connecting a controller and a memory.

FIG. 2 shows an example of a prior art static mesochronous memory system 200. The memory system comprises a controller 205 communicating to and from memory 210 via unidirectional bus 215 and bi-directional bus 216. Bus 215 carries address and control information from the controller to the memory. Bus 216 carries data information from the controller to the memory during write operations and carries data information from the memory to the controller during read operations. Bus 215 is also referred to here as the RQ bus, and bus 216 is also referred to here as the DQ bus. This description will also refer to separate D and Q signal sets, i.e., signal sets 217, 218 at the controller and signal sets 219, 220 at the memory, even though such signal sets share the same physical wires in this system.

Memory component 210 in FIG. 2, is one component of a two dimensional array of memory components, with ranks (rows) indexed by the variable "i" and slices (columns) indexed by the variable "j". Index values for the ranks are zero at the memory controller and assume integer values greater than zero as you move further away from the controller 205. In system 200, there is a single memory component in each rank. Other memory systems may have more than one memory component per rank. In this document, notation "[i,j]" is used to label a wire or bus at different physical points along a physical length. For example, the CTC[0,j] and CTC[i,j] signals are associated with two different points along the same physical wire. The notation is used throughout this document so that a wire or bus can be labeled or identified at any point along a signal transmission path.

Each slice of the memory components is attached to the DQ and RQ busses, which carry data signals and request signals, and to bus 230 (for receiving timing information or signals). Bus 230 (which is shown as three sub-buses 230(a), 230(b) and 230(c)), communicating a clock signal (CLK), carries timing information from the controller 205 to the memory component 210 so that information transfers on the other two buses can be coordinated.

The controller uses internal clock signal CLKC for its internal operations, including transmitting and receiving on the RQ and DQ buses. CLKC is routed so that it passes the memory controller and memory components a total of three times. Clock signal 225 is made up of three sub-signals: CTE (clock-to-end), CTC (clock-to-controller), and CFC (clock-from-controller). The controller drives the CTE signal, which travels to the end of the slice of components, and returns as CTC. CTC enters the controller, and leaves the controller (unbuffered) as CFC, and then travels back to the end of the slice. While a single pair of physical wires generally carries the three clock signals (with CTC and CFC being carried by the same physical wire), three different signal lines (i.e., wires) are shown in FIG. 2 for clarity.

CLKC is also used as a reference for the phase-loop lock (PLL) or delay-loop lock (DLL) circuit 255 that drives CTE[0,j] signals onto bus 230(a). The PLL/DLL circuit 255 internally generates the CTE[0,j] signal and adjusts the phase of the CTE[0,j] signal until the CTC[0,j] and CFC[0,j] signals have the same phase as the CLKC signal.

Memory components receive the CTC and CFC signals on buses 235 and 240, respectively. More specifically, each memory component has its own pair of clock input connections for receiving the CTC and CFC signals, respectively. The CTC[i,j] and CFC[i,j] signals that are received by a memory component [i,j] on buses 235, 240, respectively, have phases that are offset from CLKC and from each other due to propagation delays. The propagation delays on the clock bus 230 are essentially identical to propagation delays on the RQ and DQ busses, and thus the CTC[i,j] and CFC[i,j] signals are used by the memory component [i,j] to control the transmission of data signals on the DQ bus 216 and to control the receipt of control and data signals from the RQ and DQ buses, respectively.

The CTC and CFC signals on buses 235, 240 pass through PLL/DLL circuits 265, 270, respectively, within the memory component 210. Memory components use PLL or DLL circuits to ensure that the clock domains within the memory are phase-aligned with the external memory clock signals that provide the timing references. By phase aligning the clock signals in this fashion, memory sub-components 245, 250 receive timing information for transmitting and receiving on internal D and Q buses 219, 220.

Clock domain crossing logic 275 links the portions of the memory component 210 that operate in two clock domains. One domain is used for transmitting read data. The other domain is used for receiving write data and address/control information. Each memory component needs to pass information between the two clock domains, and this is controlled by the clock domain crossing logic 275.

Figure 3:
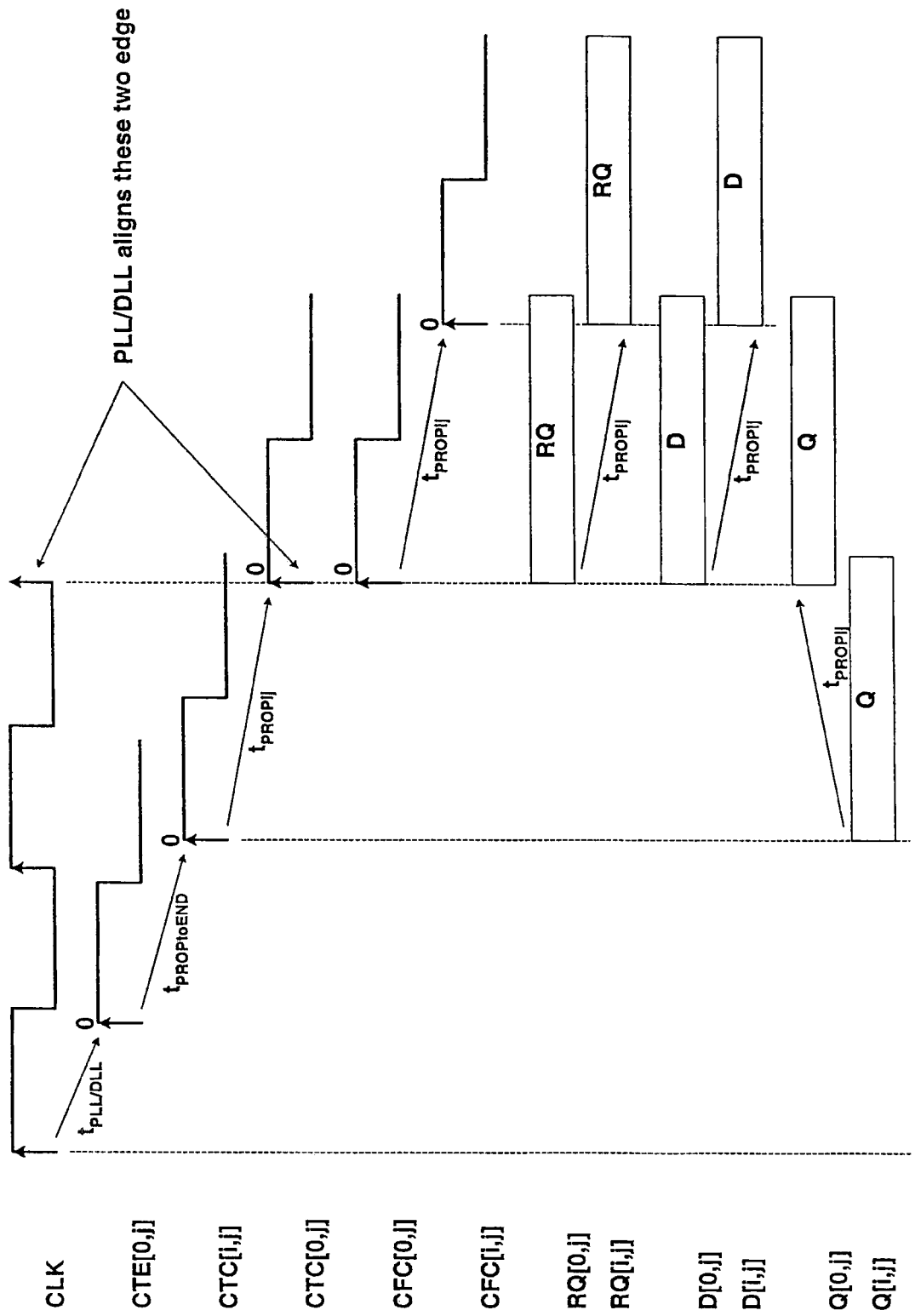
FIG. 3 is a timing diagram for the signals of the static mesochronous memory system in FIG. 2.

FIG. 3 shows a timing diagram for system 200 (FIG. 2). The CLK signal 225 drives the PLL/DLL 255, which produces CTE[0,j] after a delay of $t_{PLL/DLL}$ CTE[0,j] propagates to the end of the wire 230(a) and returns as the CTC signal to memory component [i,j]. The CTC[i,j] signal is delayed by $t_{PROPtoEND}$ relative to the CTE[0,j] signal. Read data Q[i,j] transmitted by the memory component to the controller is synchronized by the memory component [i,j] with the CTC[i,j] clock. The read data Q[i,j] signal set and the CTC[i,j] clock signal requires an additional delay of $t_{PROPij}$ to reach the controller to become Q[0,j] and CTC[0,j].

The PLL/DLL 255 adjusts the $t_{PLL/DLL}$ delay so that the CTC[0,j] and CLK signals have the same phase alignment. This means that $t_{PLL/DLL} + t_{PROPtoEND} + t_{PROPij} = C \cdot t_{CYCLE}$, where C is an integer and denotes the number of CLK cycles required for the round trip of the clock signal from CTE[0,j] to CTC[0,j]. The CTC[0,j] signal becomes the CFC[0,j] signal and exits the controller. After a delay of $t_{PROPij}$ CFC[0,j] reaches a memory component as CFC[i,j], where it is used to receive the RQ[i,j] address/control information and D[i,j] write data information. The information on these two buses are delayed by $t_{PROPij}$ from the RQ[0,j] and D[0,j] buses, respectively.

In system 200, the controller is able to perform all transfer operations within the single clock domain of the CLKC signal. Each memory component, on the other hand, operates in two clock domains, as noted above. One domain is earlier in time than CLKC by $t_{PROPij}$ and is used for transmitting read data. The other domain is later than CLKC by $t_{PROPij}$ and is used for receiving write data and address/control information.

Note that in all of these cases of transfers on the RQ and DQ buses, the sampling (e.g., rising) edge of the clock that is used to receive a set of bits from a bus is shown as being aligned with the start of the valid window of the bits. In practice, the receiving clock will have its sampling edge aligned with the center of the valid window of the bits. The clock recovery circuits (PLL or DLL) present on both the controller and memory component can perform this alignment easily. For simplicity, this detail is not shown in the timing diagram. Although other static alignments of the clock with respect to the data may be used, one key point with respect to static systems is that the alignment does not change during system operation.

Phase offsets required for normal operation of system 200 are known or can be generated automatically by the system hardware. This determination of phase offsets can be done because the clock signals travel through a path that is essentially the same as the path of the data and address/control signals for which they provide a timing reference. The determination of phase offsets also requires that PLL or DLL circuits be used to maintain the static phase relationships.

In practice, such PLL or DLL circuits will not align the phase of two signals exactly; there will be some small error due to, for example, circuit jitter. Such jitter must be factored into the overall timing budget for transferring each bit of information on a signal. This timing budget for transmitting and receiving a bit includes, for instance, setup and hold times of receive circuits and the variation of the output valid delay of the transmit circuits. However, the timing budget does not include a component for the round-trip propagation delay $2 \cdot t_{PROPij}$ between the memory component and memory controller. The round-trip propagation delay $2 \cdot t_{PROPij}$ is accounted for in the clock domain crossing logic 275. The accounting for round-trip propagation delay $2 \cdot t_{PROPij}$ increases the latency of a read operation, but does not impact the bandwidth of read and write transfers. Such transfers will occur at a bandwidth that is determined by the circuits of the components, and not by the length of the wires that connect the components. The bandwidth determination based on circuit components is a critical factor in the advantage of static mesochronous systems over synchronous systems in which all components use clock signals that are at essentially the same phase. Since the transfers in the synchronous system must include the propagation delay term in the timing budget for a bit transfer, such inclusion of the delay term limits the bandwidth of transfers.

Figure 4:
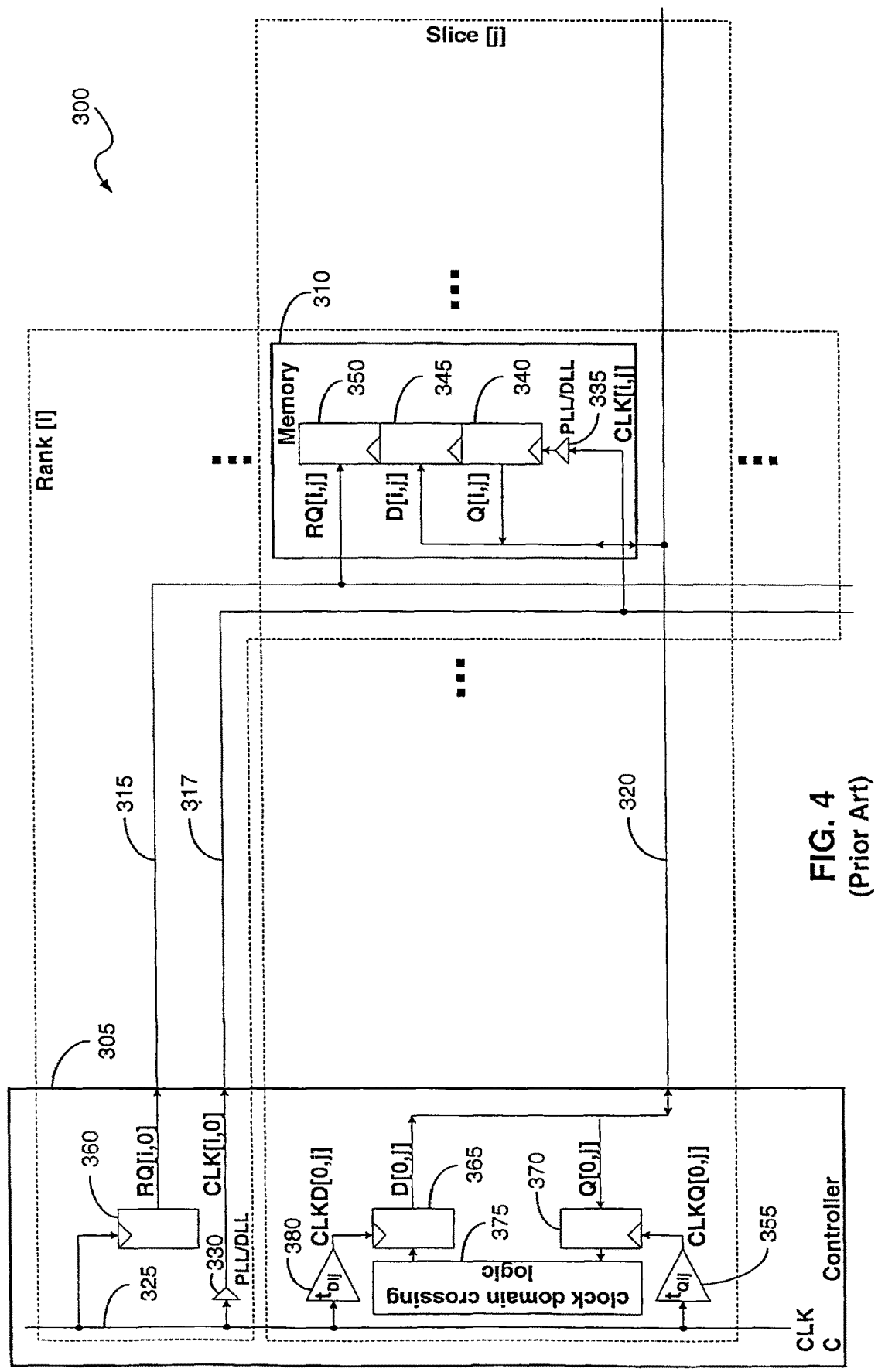
FIG. 4 is second example of a block diagram of a prior art static mesochronous memory system connecting a controller and a memory.

FIG. 4 shows a second example of a prior art static mesochronous memory system 300 comprising a controller 305 communicating to and from a memory component 310, which may be in an array of similar memory components. Like system 200, memory components form a two dimensional array, with ranks (rows) indexed by the variable "i" and slices (columns) indexed by the variable "j". As throughout this document, the index values are zero at the memory controller, and assume integer values greater than zero as you move further away from the controller. For example, in a system with a 2×3 array of memory components (i.e., three memory components in each of two ranks) the value of the "i" variable increases from zero at the controller to "1" for each of the three memory components in the first rank and to "2" for each of the three memory components in the second rank. Furthermore, in this exemplary system the value "j" increases from zero at the controller to "1" for each of the two memory components in the first slice, to "2" for each of the two memory components in the second slice, and to "3" for each of the two memory components in the third slice.

Unlike system 200, in system 300 there can be more than a single memory component in each rank. Each rank of memory components is attached to an RQ bus 315 and a DQ bus 320. Other ranks are connected to different RQ buses and other slices are connected to different DQ buses. The RQ bus 315 is unidirectional and carries address and control information from the controller to the rank of memory components. The CLK bus 317 is unidirectional and carries timing information from the controller to the memory components so that information transfers on the other two buses can be coordinated. The CLK bus 317 has the same topology as the RQ bus it accompanies. The slice of memory components is attached to DQ bus 320, which connects the controller and memory and is bi-directional, and carries data information from the controller to a memory component during write operations, and carries data information from a memory component to the memory controller during read operation.

The controller uses an internal clock CLKC, carried by internal bus 325, for its internal operations, including transmitting on the RQ bus 315. The CLKC signal is also used as a reference for the PLL or DLL circuit 330 that drives CLK[i,0]. The PLL/DLL 330 adjusts the phase of the CLK[i,0] signal to have the same phase as CLKC.

At the memory component 310, the CLK[i,j] signal is received offset in phase by a PLL or DLL circuit 335, which produces a buffered internal clock that is of essentially the same phase as received. This internal buffered clock signal is used to control transmission of read data onto the DQ bus 320 and to control the receipt of control and data signals from the RQ and DQ buses, as appropriate, generally to control the timing of operations performed by internal memory sub-components 340, 345 and 350. Because there is a single clock domain inside the memory component 310, there is no need for clock domain crossing logic in the memory component 310 as there was in system 200.

Instead, the clock domain crossing logic has been shifted to the controller 305 as clock domain crossing logic 375. The shift in logic 375 to the controller is because the write data D[0,j] transmit logic 365 and the read data Q[0,j] receive logic 370, must be operated in two clock domains, CLKD [0,j] and CLKQ[0,j], that have different phases than the CLKC domain used by the rest of the controller. As a result, phase adjustment logic is needed that delays CLKC by $t_{Dij}$ and $t_{Qij}$ to form the CLKD[0,j] and CLKQ[0,j] signals, respectively. The phase adjustment logic for the CLKD[0,j] and CLKQ[0,j] signals, are shown as circuit elements 380 and 355, respectively.

Figure 5:
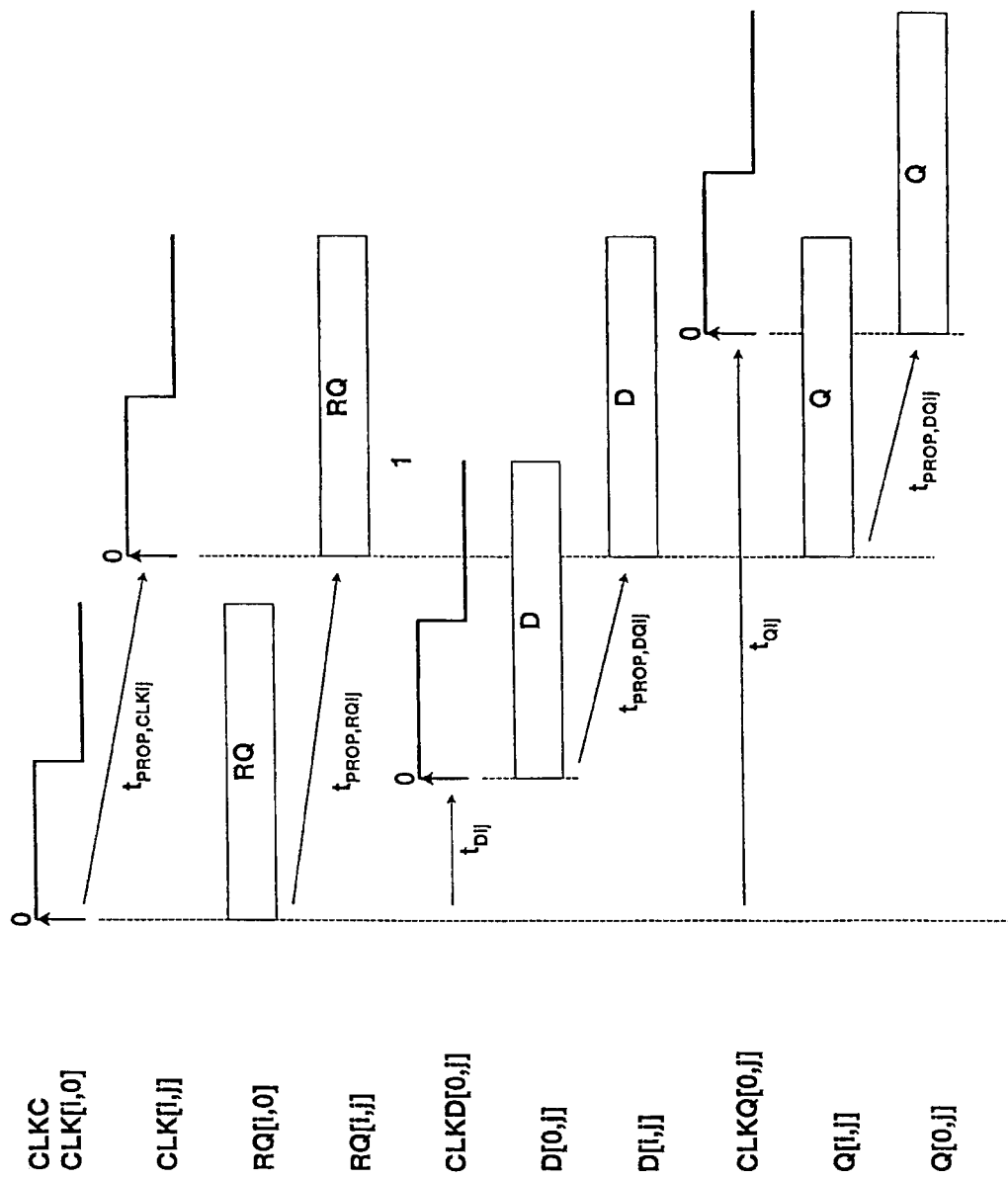
FIG. 5 is a timing diagram for the signals of the static mesochronous memory system in FIG. 4.

FIG. 5 shows a timing diagram for system 300 (FIG. 4). The CLK signal drives the PLL/DLL 330 to produce CLK [i,0]. The CLK[i,0] signal is delayed by $t_{PROPCLKij}$ as it propagates to memory component [i,j] to become signal CLK[i,j]. The RQ[i,0] signal transmitted by controller element 360 is delayed by $t_{PROPRQij}$ as it propagates to memory component [i,j] to become the RQ[i,j] signal at internal memory component 350. The CLK and RQ buses are routed together, so that the two propagation delays are essentially the same.

In the controller, phase adjustment logic 380 delays CLK by $t_{Dij}$ to form the CLKD[0,j] signal. This clock signal is used by the controller's data transmit element 365 to control the phase of the write data D[0,j]. The D[0,j] signal set is delayed by $t_{PROPDij}$ as it propagates to memory component [i,j] to become signal set D[i,j]. The controller selects $t_{Dij}$ so that $t_{PROPCLKij} = t_{Dij} + t_{PROPDij}$. There is also phase adjustment logic 355 in the controller that delays CLK by $t_{Qij}$ to form the CLKQ[0,j] signal. This clock signal is used to receive the read data Q[0,j] at 370. The Q[i,j] signal set is delayed by $t_{PROPQij}$ as it propagates from memory component [i,j] to become signal set Q[0,j]. The controller selects $t_{Qij}$ so that $t_{Qij} = t_{PROPCLKij} + t_{PROPQij}$.

In the transfers on the RQ and DQ buses, the sampling (rising) edge of the clock that is used to receive a set of bits (or more generally, symbols) on a bus is shown aligned with the start of the valid window of the bits. In the real system, the receiving clock will typically have its sampling edge aligned with the center of the valid window of the bits. The clock recovery circuitry (PLL or DLL) that is present on both the memory controller and memory component can perform this alignment easily. Other static phase alignments of the signals on the CLK, RQ, and DQ buses are also possible. Memory components are able to perform all transfer operations within the single clock domain of the internal buffered clock signal. Each memory component will operate in its own unique clock domain. The phase of each clock domain will stay fixed relative to the phase of CLK in the controller; hence the reason for the term "static" mesochronous system.

The controller, on the other hand, has multiple clock domains. CLK is the principle domain, and CLKD[0,j] and CLKQ[0,j] are the domains (two for each slice [j]) used for transmitting and receiving, respectively. The phase offsets of CLKD[0,j] and CLKQ[0,j] are dependent, for example, upon the lengths of the wires that connect the components, and may have a range that is greater than the cycle time of CLK. Typically, the range of phase offsets ($t_{Dij}$ and $t_{Qij}$) for CLKD and CLKQ is many times greater than the cycle time of CLK. The domain crossing logic 375 must accommodate these ranges of phase offsets.

Typically, the phase offsets or adjustment values $t_{Dij}$ and $t_{Qij}$ are determined at system initialization time. The values are stored and then used during normal system operation. Each rank [i] in the system needs its own set of phase adjustment values $t_{Dij}$ and $t_{Qij}$ that must be loaded prior to transferring data to or from a memory device in the rank. In practice, the PLL or DLL circuits of system 300 do not align the phase of two signals exactly, as there is always at least a small error because of circuit jitter, as described earlier. This jitter must be absorbed into the overall timing budget for transferring each bit of information.

As with system 200, the timing budget for transmitting and receiving a bit for system 300 does not include a budget allocation for the round-trip propagation delay, $2*t_{PROPij}$, between the memory component and controller. Instead, the round-trip propagation delay, $2*t_{PROPij}$, is accounted for by the clock domain crossing logic 375. The round-trip propagation delay increases the latency of read operations, but does not impact the bandwidth of read and write transfers. The transfers occur at a bandwidth that is determined by the circuits of the components, and not by the length of the signal wires that connect the components.

Dynamic Mesochronous Memory System

Figure 6:
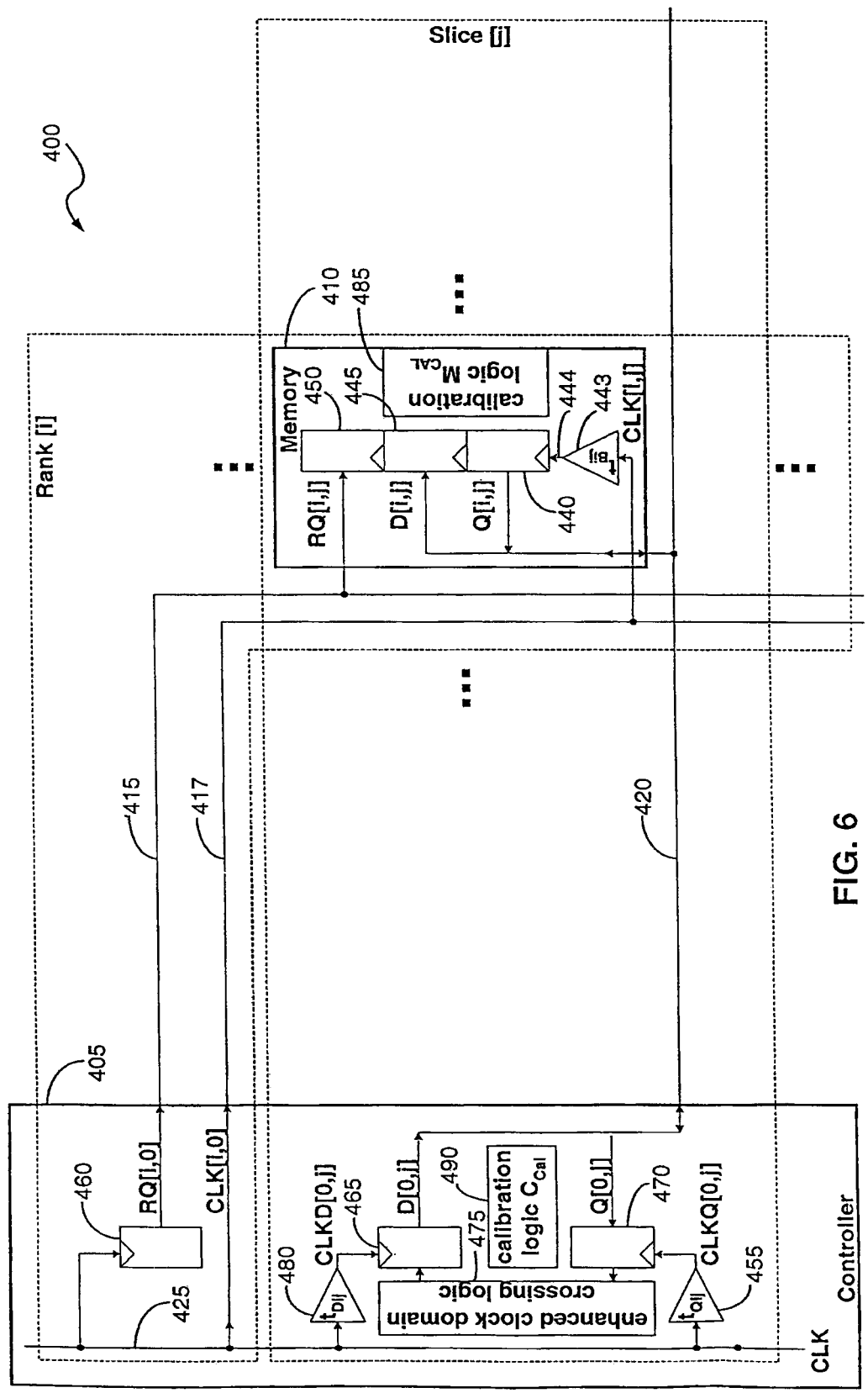
FIG. 6 is a block diagram of a dynamic mesochronous memory system connecting a controller and a memory in accordance with a preferred embodiment of the present invention.

FIG. 6 shows an overview of a preferred embodiment of a dynamic mesochronous memory system 400 in accordance with the present invention. This system is topologically similar to system 300 with respect to the interconnection of components by buses and comprises a controller 405 for communicating to and from the memory components 410. In this system, there can be more than a single memory component in each rank and/or in each slice. Unless otherwise noted or described, reference numbers that differ by 100 for systems 300 and 400 represent circuit elements at the same topological locations and having at least some functional aspects in common, even if their internal design and operation differs substantially.

While the preferred embodiments will be described in terms of a memory controller and memory components, it is to be understood that the term "memory controller" includes any device that performs the functions of a memory controller described herein, and that the term "memory component" includes any device that performs the functions of a memory component or device described herein. For instance, if the functions of a memory controller are integrated with a central processing unit or with another controller device, the resulting device will be considered a "memory controller" in the context of the present invention. Similarly, if the memory storage, access and calibration functions of a memory device are integrated into another device, such as an application specific integrated circuit (ASIC), that device will be considered a "memory component" in the context of the present invention.

System 400 differs from system 300 in numerous respects. The following is a partial listing of significant differences between the two systems: (1) the memory component 410 has a clock buffer 443 instead of the PLL/DLL clock recovery circuits 330 and 335 of memory component 310; the clock buffer can have varying delay during system operation; (2) unlike memory component 310 and controller 305, the memory component 410 and controller 405 include calibration logic 485 and 490, respectively, to support a calibration process; (3) controller 405 includes enhanced clock domain crossing logic 475 to improve the efficiency of the calibration process. In addition, certain elements of the memory component 410, such as the RQ and DQ handling logic 450, 445, 440 include new logic or circuitry to support the calibration process. These new aspects of the memory component 410 and controller 405, as well as many others, are discussed below.

The clock signal used to time the transmission of signals (sometimes called requests) on the RQ[i,0] bus 415 is called CLK[i,0]. CLK[i,0] has essentially the same phase as CLKC. The CLK[i,j] signal that is received by memory component [i,j] will have a phase that is offset from CLKC. This CLK[i,j] signal is received by a simple clock buffer 443, which is much less complex and consumes much less power than the PLL or DLL circuits 330 and 335 in system 300. Buffer 443 produces a buffered internal clock CLKB [i,j] at 444 that is at a different phase than the CLK[i,j] signal, received by buffer 443. The CLKB[i,j] signal is used to transmit data onto the DQ bus 420, to receive signals (e.g., requests and data) from the RQ and DQ buses 415, 420, respectively, and to perform all other internal operations in the memory 410. Because there is a single clock domain inside the memory, there is no need for clock domain crossing logic in the memory component, such as logic 275 of system 200.

Additionally, system 400 includes calibration logic 485 and 490. Calibration logic 485 is added to the memory 410, and logic 490 is added to the controller 405. The calibration logic circuits 485 and 490 operate in conjunction with one another so that delay variations during system operation are detected and complementary delay elements in logic 480, 455 are adjusted.

As in system 300, the write data D[0,j] transmit logic 465 and the read data Q[0,j] receive logic 470 must be operated in two clock domains, CLKD[0,j] and CLKQ[0,j], having different phases than the CLK signal domain used by the rest of the controller. As a result, there is phase adjustment logic 480 and 455 that delays CLK by $t_{Dij}$ and $t_{Qij}$, respectively, to form the CLKD[0,j] and CLKQ[0,j] signals.

Also as in system 300, the values $t_{Dij}$ and $t_{Qij}$ are functions of the propagation delay parameters $t_{PROPCLKij}$, $t_{PROPDij}$, and $t_{PROPQij}$. These propagation delay parameters are relatively insensitive to temperature and supply voltage changes. In system 300, once the values $t_{Dij}$ and $t_{Qij}$ have been generated during system initialization, they may be left static (unchanged) during system operation. But in system 400, the values $t_{Dij}$ and $t_{Qij}$ are also a function of the delay of the clock buffer $t_{Bij}$ (as well as delay of other circuits such as the transmitters and receivers). This clock buffer delay will change during system operation because it is relatively sensitive to temperature and supply voltage changes. The values $t_{Dij}$ and $t_{Qij}$ that are generated during system initialization are dynamic (changing) during system operation, and a calibration process, using the calibration logic 485 and 490, keeps the values $t_{Dij}$ and $t_{Qij}$ updated.

In addition, enhancements are made to the clock domain crossing logic 475 in system 400 (relative to system 300) to improve the efficiency of the calibration process and so that the calibration process can be handled completely by hardware. Because the enhancement (i.e., hardware for implementing the calibration process) is implemented in hardware, primarily in the controller but also in the memory components, the performance of the system 400 is not significantly impacted by the overhead of the calibration process.

Within the memory component 410, receiver and transmitter circuits 440, 445, and 450 are able to perform all transfer operations within a single clock domain that is defined by the internal buffered clock signal generated by buffer 443. A clock domain is defined by a set of one or more clock signals that have the same frequency and phase. For convenience, a clock domain is often named using the name of the clock signal that defines the clock domain (e.g., "the CLK clock domain" is a clock domain defined by the CLK clock signal). Each memory component operates in its own clock domain, which may be unique for each memory component. The phase of the clock domain for each memory component can change relative to the phase of CLK in the controller; hence, the term "dynamic" mesochronous memory system.

The controller 405, on the other hand, has multiple clock domains defined by the CLK, CLKD[0,j] and CLKQ[0,j] clock signals. CLK on bus 425 is considered a principle clock domain, and CLKD[0,j] and CLKQ[0,j] are derived clock domains in that they are based on CLK by way of phase adjustment logic 480 and 455, respectively. CLKD[0,j] and CLKQ[0,j] are used for transmitting and receiving, respectively. The phase offsets $t_{Dij}$ and $t_{Qij}$ of CLKD[0,j] and CLKQ[0,j] are dependent upon the lengths of the wires that connect the components, parasitic capacitance along these wires, and upon the changing delay $t_{Bij}$ of the memory component clock buffer 443. These phase offsets may have a range that is greater than the cycle time of CLK. In some cases the range may be many times greater. The domain crossing logic 475 accommodates these ranges of phase offsets and handles the phase offset range in hardware during calibration process updates.

Each rank [i] in the system will have its own set of phase adjustment values $t_{Dij}$ and $t_{Qij}$ that are loaded prior to transferring data to or from the rank. Each set of values are kept updated by the calibration process involving logic 485, 490.

The dynamic mesochronous system 400 has similar timing benefits to that of the static mesochronous system 300. For example, in system 400 the timing budget for transmitting and receiving a bit does not include the propagation delay $t_{PROPij}$ between the memory component and controller. Instead, the round-trip propagation delay $2*t_{PROPij}$ is accounted for in the clock domain crossing logic 475. This round-trip propagation delay increases the latency of a read operation, but does not impact the bandwidth of read and write transfers. The transfers occur at a bandwidth that is determined by the circuits of the memory controller and memory components, and not by the length of the signal wires that connect the memory controller and memory components.

As noted, the clock recovery circuit 335 of the memory 310 is replaced by a simple clock buffer 443 in system 400. This change in system 400 results in a number of benefits. First, circuit area on the memory component is reduced. Additionally, the design complexity of the memory component is substantially reduced, particularly as the clock recovery circuit 335 often is a complex part of the memory design. Further, the standby power of the clock recovery circuit is eliminated. Standby power refers to the power dissipated when there are no read or write transfers taking place. Typically a PLL or DLL must dissipate some minimum amount of power to keep the output clock in phase with the input clock. In practice, this standby power requirement has made memory components with a DLL or PLL difficult to use in portable applications, where standby power is important.

System 400 introduces a memory system topology based on dynamic mesochronous clocking. A number of variations in system topology, element composition, and memory component organization are possible, and some preferred and representative variations will be described. Individual variations may, in general, be combined with any of the others to form composite variations. Any of the alternate systems formed from the composite variations can benefit from the method of dynamic mesochronous clocking.

Figure 7:
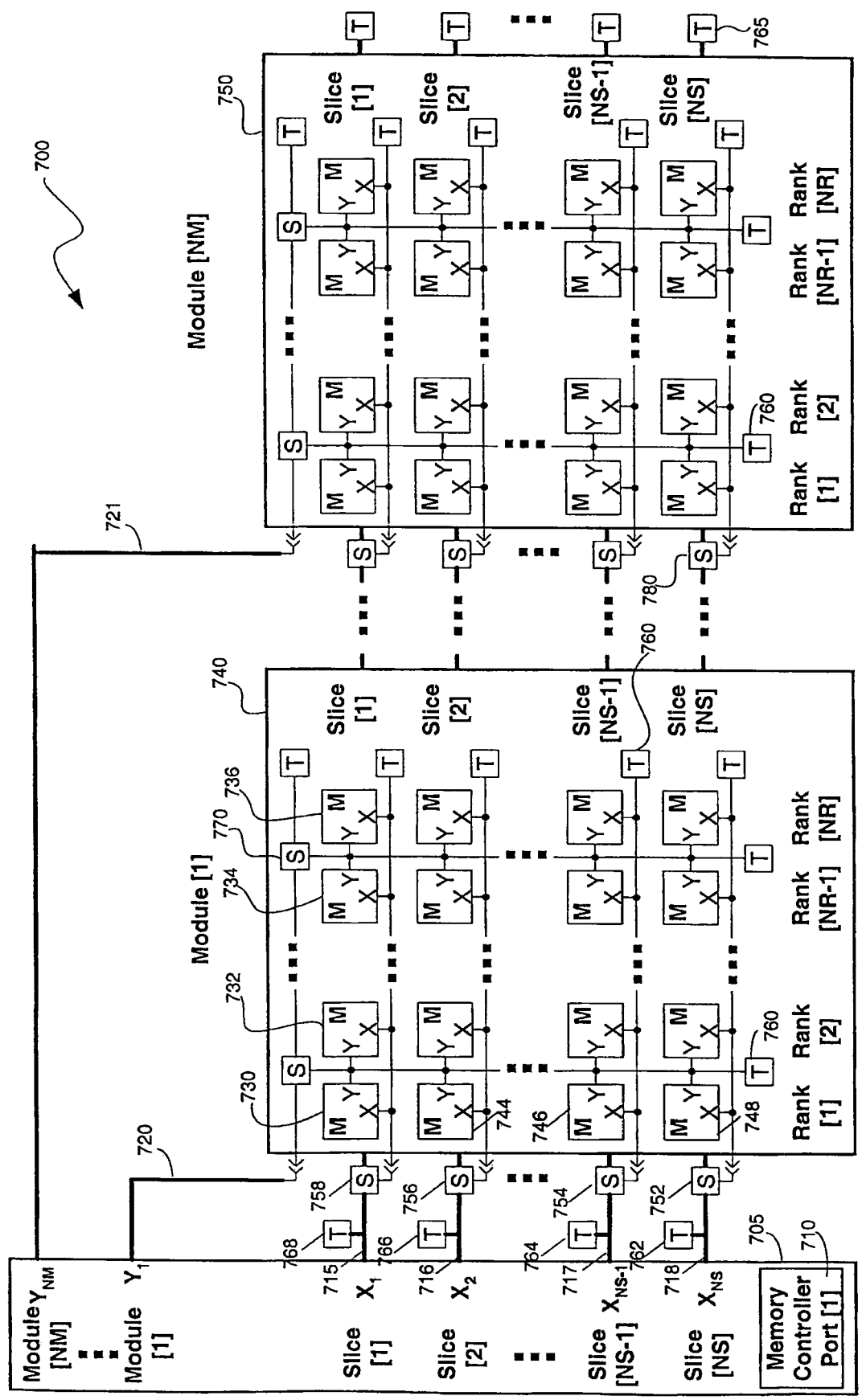
FIG. 7 is a block diagram of a dynamic mesochronous memory system in accordance with an alternate preferred embodiment of the present invention.

FIG. 7 shows a baseline memory system topology 700. Topology 700 is similar to the topology of system 400, but with some modifications as described below.

The memory controller 705 is shown in FIG. 7. A single memory port 710, (labeled Port[1]) is shown, but the controller 705 could have additional memory ports. In general, a controller has other external signals and buses that are not directly related to the memory system(s), which for clarity purposes are not shown in FIG. 7.

The port 710 of the controller consists of two types of buses: the X bus and the Y bus. The X and Y buses are composed of wires for carrying different sets of signals and have different routing paths through the memory system. The X bus is depicted as comprising NS X buses shown as 715, 716, 717 and 718. System 700 also depicts the Y bus comprising the NM Y buses, shown as buses 720, 721. The NS X buses usually carries data signals and the NM Y buses usually carries address signals, but other signal information configurations are possible. NM and NS are integers having values greater than zero.

Each of the NS X buses connect to the memory components along one "slice" (column). For example, the memory components along a slice are shown as components 730, 732, 734 and 736 in memory module 740. As shown, each of the NS X buses connect to one of the NS slices of each of the NM memory modules 740, 750. Typically, only the memory components along one slice will be active at a time, although variations to this are possible.

There are NM of the Y buses, with each Y bus connecting memory components on one "module" (set of ranks). For example, the memory components of the first rank (e.g., the leftmost rank shown in FIG. 7) are shown as components 730, 744, 746 and 748. Each of the NM memory modules can consist of NR ranks (rows) of memory components. Typically, all of the memory components of one rank of one module will be active at a time, although variations to this are possible. NM and NR are integers having values greater than zero. In some systems, the memory system may consist of NR ranks of memory components attached to the same printed circuit board (also called a wiring board) that holds the memory controller 705.

Each of the NM modules 740, 750 have a dedicated Y bus, i.e., one of the NM Y buses 720, 721, but typically most or all of the signals on a Y bus are duplicates of the signals on other Y buses. Some signals carried on the NM Y buses may be used to perform module or rank selection. These selection signals are generally not duplicated, but are dedicated to a particular module or rank.

Likewise, each of the NR ranks on a module connects to the module's dedicated Y bus. Typically, most or all of the signals composing the Y bus are connected to the memory components of each rank. Some signals on the NR ranks are used to perform rank selection. The rank selections signals are generally not duplicated, and connect to only the memory component(s) of one rank.

Generally, all signals transmitted on the X and Y buses are operated at the maximum signaling rates permitted by the signaling technology utilized. Maximum signaling rates often rely on the sequential connection of memory components to a physical wire by short stub wires branching from the physical wire. Maximum signaling rates also imply careful impedance matching when signals are split (a physical wire becomes two physical wires) and when signals are terminated (the end of a physical wire is reached).

The Y bus signals on a module may pass through splitting elements (labeled "S" in the figures) in order to make duplicate copies of signals. Alternatively, the signals may connect sequentially to the memory components of one or more of the NR ranks (the figure shows sequential connection to two ranks). A module 740, 750 may contain as few as one or two ranks, in which case no splitting element is needed on the module at all.

Sample splitting element variations are shown in FIG. 10(*a*)-(*d*).

Returning to FIG. 7, the Y bus signals connect to termination elements 760 (labeled "T" in the figures) where the signals reach the end of a rank. Y bus signals are typically unidirectional, so termination elements are shown only at the memory end of the signals. If any Y bus signals were bi-directional, or if any Y bus signals drove information from memory to controller, then termination elements would be required on the controller end of the Y buses.

Sample bus termination element variations 760 are shown in FIG. 11(*a*)-(*d*).

Returning to FIG. 7, the X bus signals can pass through a splitting element on the same printed circuit board that holds the controller 705. One of the duplicate signals from a splitter, such as from splitter 752, 754, 756 or 758, enters one of the NM modules, such as module 740, and the other continues on the printed circuit board to the next module. The X bus signals connect sequentially to the memory components of each slice and end at a termination element such as on bus 765. Alternatively, if the system only contains a single memory module, no splitting elements would be needed for the X bus signals.

The X bus signals are typically bi-directional, so termination elements are needed at the controller end of each signal (e.g., where a termination element 762 connects to bus 718) as well as at the far end of the memory array. For any unidirectional X bus, termination elements would be required only at the end of the X bus that is opposite from the component that drives the signal.

Typically, all of the signals on the X bus are transmitted (or received) by all the memory components of each slice. In some embodiments, there may be some signals on the X bus that are transmitted (or received) by only a subset of the memory components of a slice.

FIG. 8A shows a variation on the Y bus topology in which the controller 805 drives a single Y bus 810 to all the modules. A splitting element 812 is used to tap off a duplicate Y bus signal bus for each memory module, such as modules 820, 830. X bus splitters 816 sequentially connect the slices of each module. The use of external termination elements 818 is desirable when any X bus signals (on X buses $X_1$ to $X_{NS}$, not separately shown) are bi-directional. Internal (i.e., internal to the modules 820, 822) splitter 822 and termination elements 824 are still used for each slice of each of the NM modules having NR ranks of memory components 828. In system 800 the controller drives fewer buses, but each Y bus signal will pass through a larger number of splitting elements. This increase in the number of splitting elements may impact signal integrity or propagation delay.

FIG. 8B shows a second variation on the Y bus topology in which the controller 855 drives the Y buses on the same group of physical wires 856, 858 as the X buses to the modules. In other words, the Y buses run parallel to the X buses in this embodiment. In system 850, there are no buses flowing along each of the NR ranks. There may be some signals in the X or Y bus used to perform a rank and module selection which connect to only a subset of the memory of a slice (only two slices are shown for simplicity). Alternatively, module and rank selection may be performed by comparing X or Y bus signals to an internal storage circuit (which may be located in each memory component) that contains the module or rank identification information. This method of module and rank selection could be used in any of the other topology variations. As with FIG. 8A, external termination elements 860 and external splitter elements 862 may be used, but only internal termination elements 864 are needed for each slice of the NM modules 870 having NR ranks of memory components 875.

Figure 9:
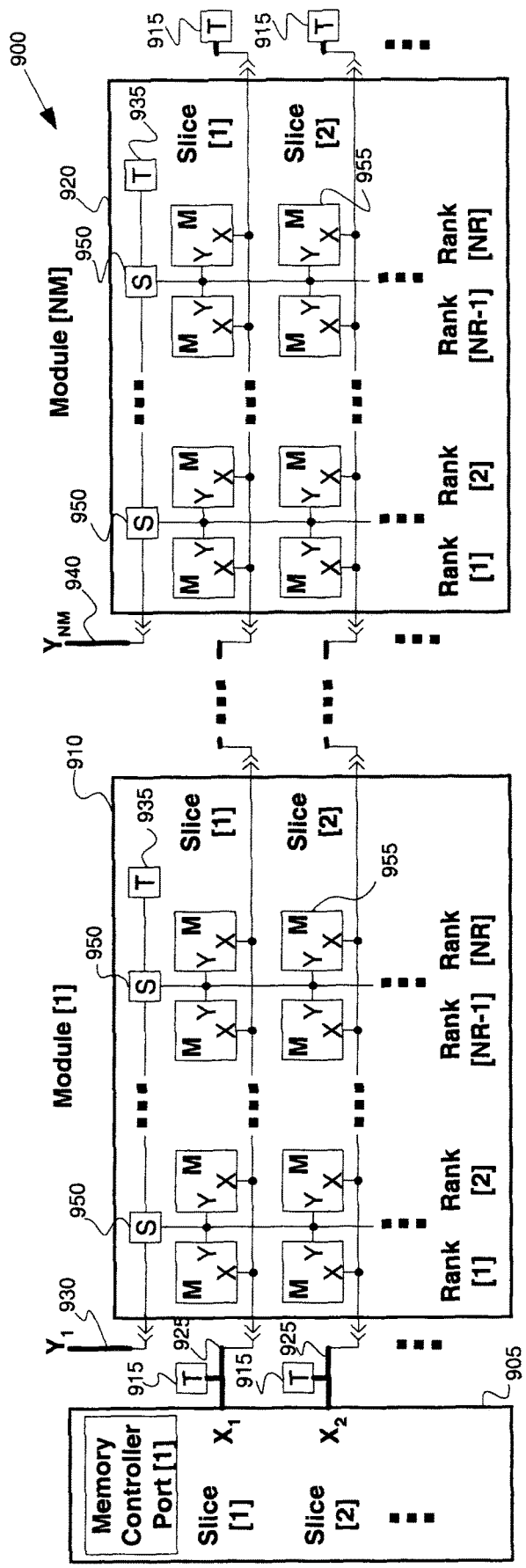
FIG. 9 is block diagram of a dynamic mesochronous memory system in accordance with an alternate preferred embodiment of the present invention.

System 900 in FIG. 9 shows a variation on the X bus topology of system 700 in which each X bus signal (e.g., on X bus 925) passes through one set of pins on each module and exits through a different set of pins. Controller 905 transmits X bus signals to memory modules 910, 920, and NM Y buses 930, 940 connect to each of the NM modules. No external splitting element is needed on the main printed circuit board, and fewer internal termination elements 935 are needed on the modules. While extra pins are needed on each module, there is a reduction in the number of splitting and termination elements.

Figure 10A:
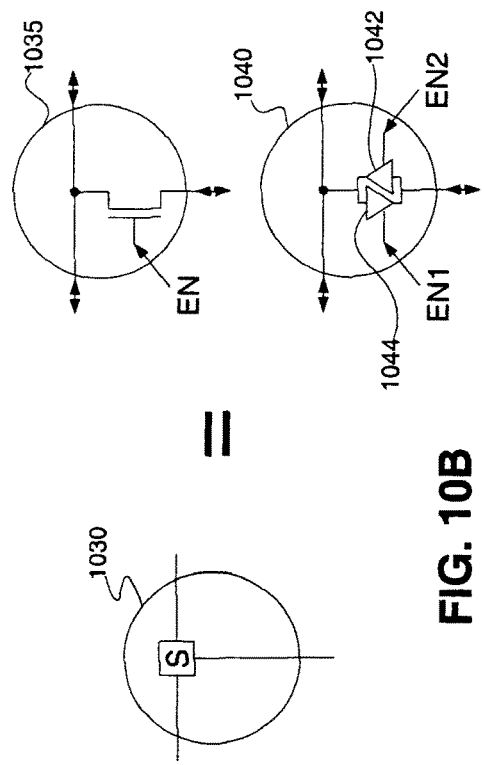
FIGS. 10A-10D depict sample splitting element configurations.
Figure 10C:
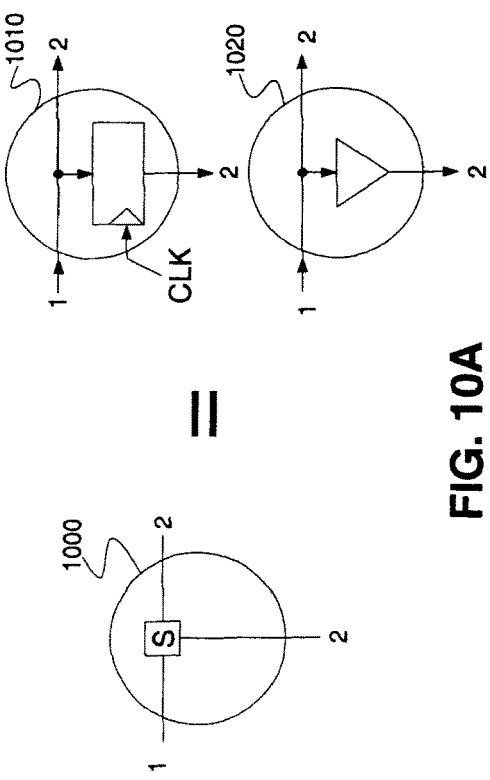
Figure 10B:
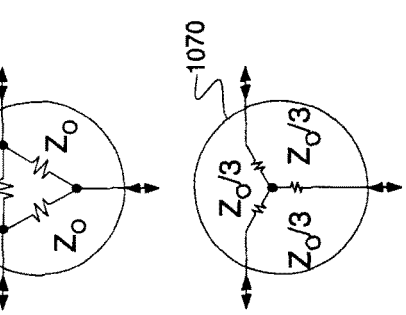

FIGS. 10A-10D show some of the possible splitting element variations. In each of these figures, splitter element variations are shown where a single signal is split into two signals. In FIG. 10A, a splitter 1000 converts a single signal labeled "1" into two signals labeled "2", by the use of a clocked 1010 or unclocked 1020 buffer. In FIG. 10B, the signals are bi-directional, and signals can be split or combined. Generally, a single signal can pass through an enabled switch or buffer of the splitter 1030 to form two signals and any port can receive a signal component from any other port. Splitter element 1030 is a bi-directional buffer consisting of either a pass-through, non-restoring active switch 1035 with an enable control, or a pair of restoring buffers 1042, 1044 with a pair of enable controls in element 1040. Note that element 1030 could also be used for unidirectional signals.

Figure 10D:
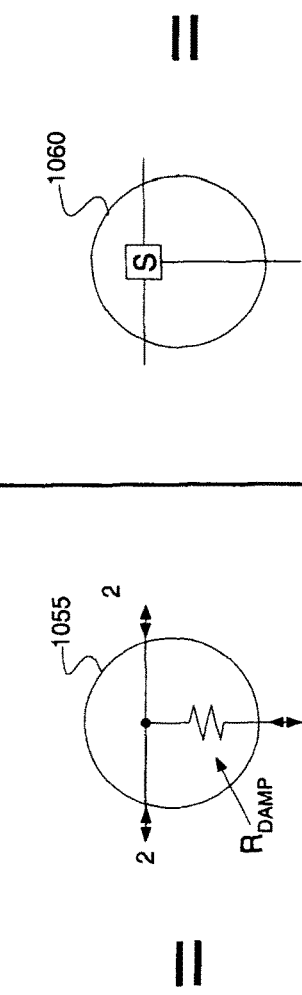

Splitter element 1050 (FIG. 10C) is a unidirectional resistive device, implemented from either active or passive components. Splitter 1055 permits an attenuated signal to be passed to one of the output ports (labeled "2"), with the resistive value, RDAMP, chosen to limit the impedance mismatching that occurs. An alternative method would allow the characteristic impedance of the traces to be varied so that (in combination with a series resistance on one output port) there would be a smaller mismatch for unidirectional signals. Element 1060 (FIG. 10D) is a bi-directional power-splitting device, allowing the impedance to be closely matched for a signal originating on any of the three ports. The resistive devices, $Z_0$ in element 1065 or $Z_0/3$ in element 1070, could be implemented from passive or active devices. FIGS. 10C and 10D are similar to FIG. 10B in that a signal input at any port can yield signals at the remaining two ports. Splitter element 1050 (FIG. 10C) utilizes a wire stub with series damping, and splitter element 1060 (FIG. 10D) utilizes an impedance-matching splitter. Like splitter element 1030 (FIG. 10B), the splitter elements 1050 and 1060 have bi-directional ports so that any port can be an input port and any port can receive a signal component from any other port.

FIGS. 11A to 11D show some of the possible termination element variations. Element 1100 (FIG. 11A) is a passive, external termination element. The element may be implemented, for example, as a single device connected to a single termination voltage, VTERM, or as two (or more) devices $R_1$ and $R_2$ in element 1108 connected to two (or more) termination voltages, such as VDD and circuit ground. The termination element 1100 resides on a memory module or on a main printed circuit board.

Termination element 1120, shown in FIG. 11B, is an active, external termination element. It may be implemented, for example, as a single device 1110 in a termination element 1125 connected to a single termination voltage VTERM, or as two (or more) devices 1120 and 11320 in a termination element 1115 connected to two (or more) termination voltages, such as VDD and circuit ground. The termination element 1120 resides on a memory module or on a main printed circuit board. The voltage-current relationship needed for proper termination is generated by control voltage(s), which are maintained by an external circuit. Typically, the external circuit (not shown) measures a value that indicates whether the voltage-current relationship is optimal. If it is not, the external circuit makes an adjustment so the voltage-current relationship becomes more optimal.

Termination element 1160, shown in FIG. 11C, is a passive, internal termination element. This variation is similar to termination element 1100 except that termination element 1160 resides inside a memory component or inside the memory controller, both shown as component 1165. Termination element 1170, shown in FIG. 11D, is an active, internal termination element. The FIG. 11D variation is similar to termination element 1120 except that element 1170 resides inside a memory component or inside the memory controller, both shown as component 1175.

Figure 12:
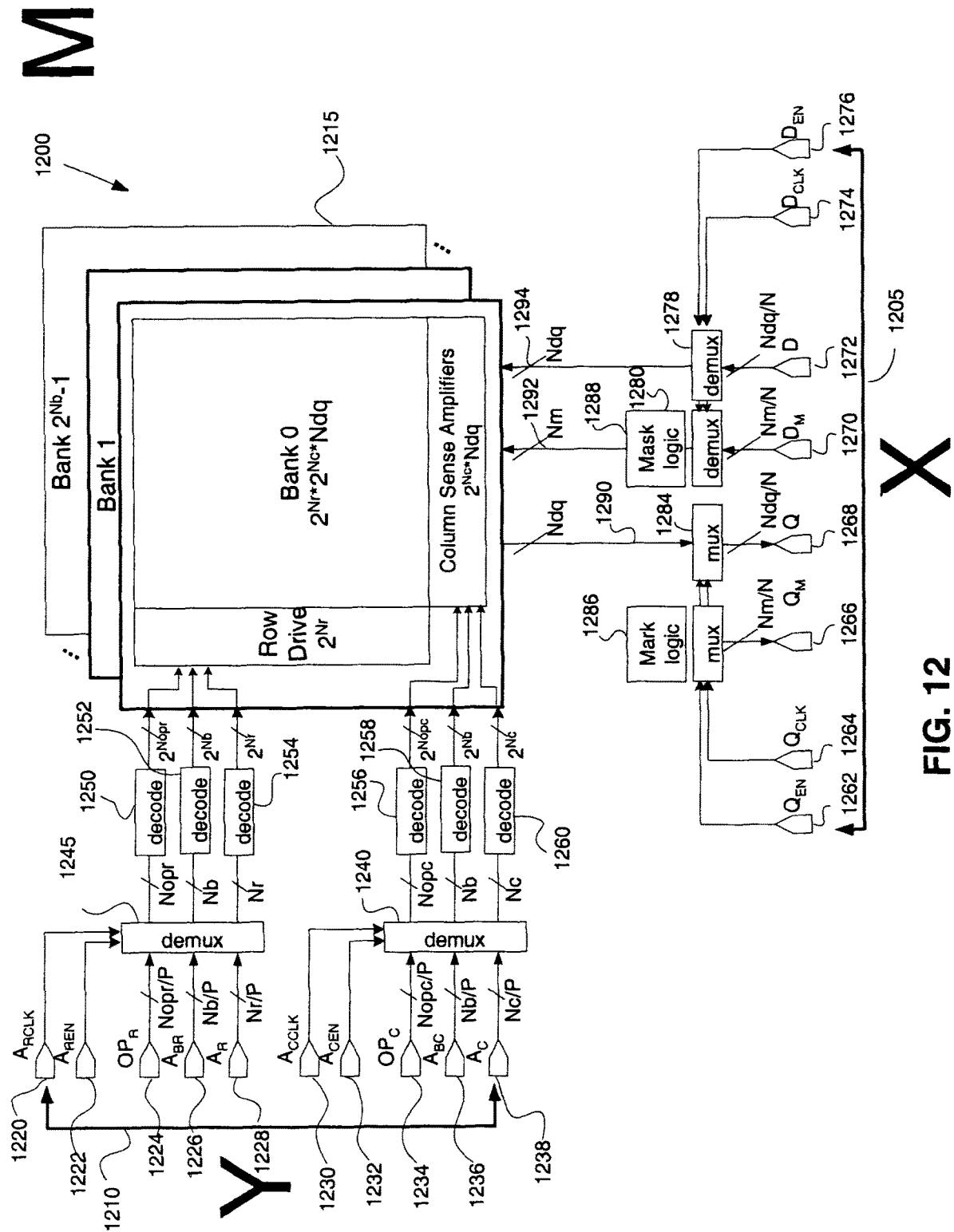
FIG. 12 is logic diagram for a baseline system configuration 1200 for a component shown in the system topology diagrams.

FIG. 12 shows a baseline system configuration 1200 for the memory component "M" that is shown in the system topology diagrams, such as element 730 in system 700. An X bus 1205 and a Y bus 1210 connect to memory component M. The X and Y buses correspond to the X and Y buses shown in topology FIGS. 7, 8A, 8B and 9. The memory component M contains interface logic for receiving and transmitting the signals carried by the X and Y buses. The memory component M also contains a memory core 1215 that consists of $2^{Nb}$ independent banks. Here Nb is the number of bank address bits and is an integer greater than or equal to zero. The banks are capable of performing operations independent of one another, as long as the operations do not have resource conflicts, such as the simultaneous use of shared interface signals.

The Y Bus 1210 carries two signal sets: the row signal set 1220-1228 and the column signal set 1230-1238. Each group contains a timing signal ($A_{RCLK}$ 1220 and $A_{CCLK}$ 1230), an enable signal ($A_{REN}$ 1222 and $A_{CEN}$ 1232), an operation code signal set ($OP_R$ 1224 and $OP_C$ 1234), a bank address signal set ($A_{BR}$ 1226 and $A_{CR}$ 1236), and a row or column address signal set ($A_R$ 1228 and $A_C$ 1238). The number of signals carried by the signal sets are represented with a "/P", such as Nopr/P, Nopc/P, Nb/P, Nb/P, Nr/P, and Nc/P, respectively. The factor "P" is a serialization or multiplexing factor, indicating how many bits of a field are received serially on each signal. The demultiplexers 1240 and 1245 convert serial bits into parallel form. The P factors for Nopr, Nopc, Nr, Nc, and P may be integer values greater than zero. For example, there might be eight column address bits transmitted as two signals for the column address signal set, meaning that four column address bits are received sequentially on each signal. The P factor for this example would be four. Memory component 1200 (i.e., the baseline memory component) uses the same P factor for all the sub-buses of the Y bus, but different factor values could also be used for different sub-buses in the same memory component. Here, P is an integer greater than zero.

It is also possible that the signal sets could be multiplexed onto the same wires. The operation codes could be used to indicate which signal set is being received. For example, the bank address signal sets could share one set of wires, and the row and column address signal sets could share a second set of wires, and the operation code signal sets could share a third set of wires.

The six signal sets (i.e., signals 1224-28, 1234-38) are received by circuitry in the memory component 1200 that uses the timing signals ($A_{RCLK}$ and $A_{CCLK}$) as a timing reference for when a bit is present on a signal. These timing signals, for example, could be a periodic clock or they could be a non-periodic strobe. An event (i.e., a rising or falling edge) could correspond to each bit, or each event could signify the presence of two or more sequential bits (with clock recovery circuitry creating two or more timing events from one). In some implementations the six signal sets share a single timing signal.

The enable signals 1222 and 1232 indicate when the memory system 1200 needs to receive information on the associated signal sets. For example, an enable signal may be used to pass or block the timing signals entering the memory component, depending on the value of the enable signal, or an enable signal might cause the operation code signal set to be interpreted as no-operation, or the enable signal may be used by logic circuitry to prevent information from being received when the value of the enable signal indicates that such information is not for receipt of the memory component 1200.

The enable signals can be used to select a first group of memory components and to deselect a second group, so that an operation will be performed by only the first group. For example, the enable signals can be used for rank selection or deselection. The enable signals can also be used to manage the power dissipation of a memory component in system 1200 by managing power state transitions. In some embodiments, the enable signals for the row and column signal groups could be shared. Further, each enable signal shown could be decoded or formed from two or more signals to facilitate the task of component selection and power management.

The de-multiplexed row operation code, row bank address, and row address are decoded by decoders 1250, 1252 and 1254, and one of the $2^{Nb}$ independent banks is selected for a row operation. A row operation may include sense or precharge operations. In a sense operation, one of the $2^{Nr}$ rows contained in a bank selected by outputs of the decoders is coupled to a column sense amplifier for the bank. For a precharge operation, a selected bank and its column sense amplifier are returned to a precharged state, ready for another sense operation.

The de-multiplexed column operation code, column bank address, and column address are decoded via decoders 1256, 1258 and 1260, and one of the $2^{Nb}$ independent banks is selected for a column operation such as read or write. A column operation may only be performed upon a bank that has been sensed (not precharged). For a read operation, one of the $2^{Nc}$ columns (with Ndq bits) contained in a column sense amplifier portion of the selected bank is read and transmitted on the Q signal set 1290/1268. For a write operation, Ndq bits received on the D signal set (i.e., signals 1270-76) is written into one of the $2^{Nc}$ columns contained in the column sense amplifier portion of the selected bank, using the Nm mask bits on sub-bus 1292 to control which bits are written and which are left unchanged.

The X bus 1205 carries two sets of signals: the read signal set and the write signal set. The read signals include signals 1262-1268, and the write signals include signals 1270-1276. Each group contains a timing signal ($Q_{CLK}$ 1264 and $D_{CLK}$ 1274), an enable signal ($Q_{EN}$ 1262 and $D_{EN}$ 1276), a mark or mask signal set ($Q_M$ 1266 and $D_M$ 1270, respectively), and a data signal set (Q 1268 and D 1272). The number of signals in the signal sets are represented with a "/N", such as Ndq/N, Nm/N, and Ndq/N, respectively. The factor "N" is a serialization or multiplexing factor, indicating how many bits of a field are received or transmitted serially on each signal. The "mux" and "demux" blocks converts the bits from parallel-to-serial and serial-to-parallel form, respectively. The parameters Ndqr, Nm, and N may contain integer values greater than zero. This baseline memory system 1200 assumes that the read and write data signal sets have the same number of signals and use the same multiplexing factors. This might not be true in other memory components, and therefore the number of signals in each signal set may vary. In some embodiment, the read and write data signal sets are multiplexed onto the same wires.

The mark signal set provides a timing mark through mark logic 1286 to indicate the presence of read data. The mark signal set might have the same timing as the read data signal set, or it might be different. The mask signal set 1292 indicates whether a group of write data signals should be written or not written as determined by mask logic 1288. This baseline memory system assumes that the mark and mask signal sets have the same number of signals and use the same multiplexing factors. This assumption might not hold true in other embodiments. It is also possible that, in other embodiments, the mark and mask data signal sets could be multiplexed onto the same wires. In other embodiments, one or both of the mark and mask signal sets might not be implemented.

The data signal sets 1290, 1294 are received by circuitry 1284, 1278 that uses the timing signals ($Q_{CLK}$ and $D_{CLK}$) as a timing reference for when a bit is present on a signal. These timing signals could be, for example, a periodic clock, or they could be a non-periodic strobe or any other timing reference. An event (e.g., a rising or falling edge of a timing signal) could correspond to each bit, or each event could signify the presence of two or more sequential bits (with clock recovery circuitry creating two or more timing events from each received event). It is possible that the data signal sets could share a single timing signal. It is also possible that the X and Y buses could share a single timing signal.

The enable signals $Q_{EN}$ and $D_{EN}$ 1262 and 1276 indicate when the memory component needs to receive information on the associated signal sets. For example, an enable signal might pass or block the timing signals entering the memory component, or it may be used to prevent information from being transmitted or received. The enable signals can be used for slice selection or for managing power state transitions.

Figure 13:
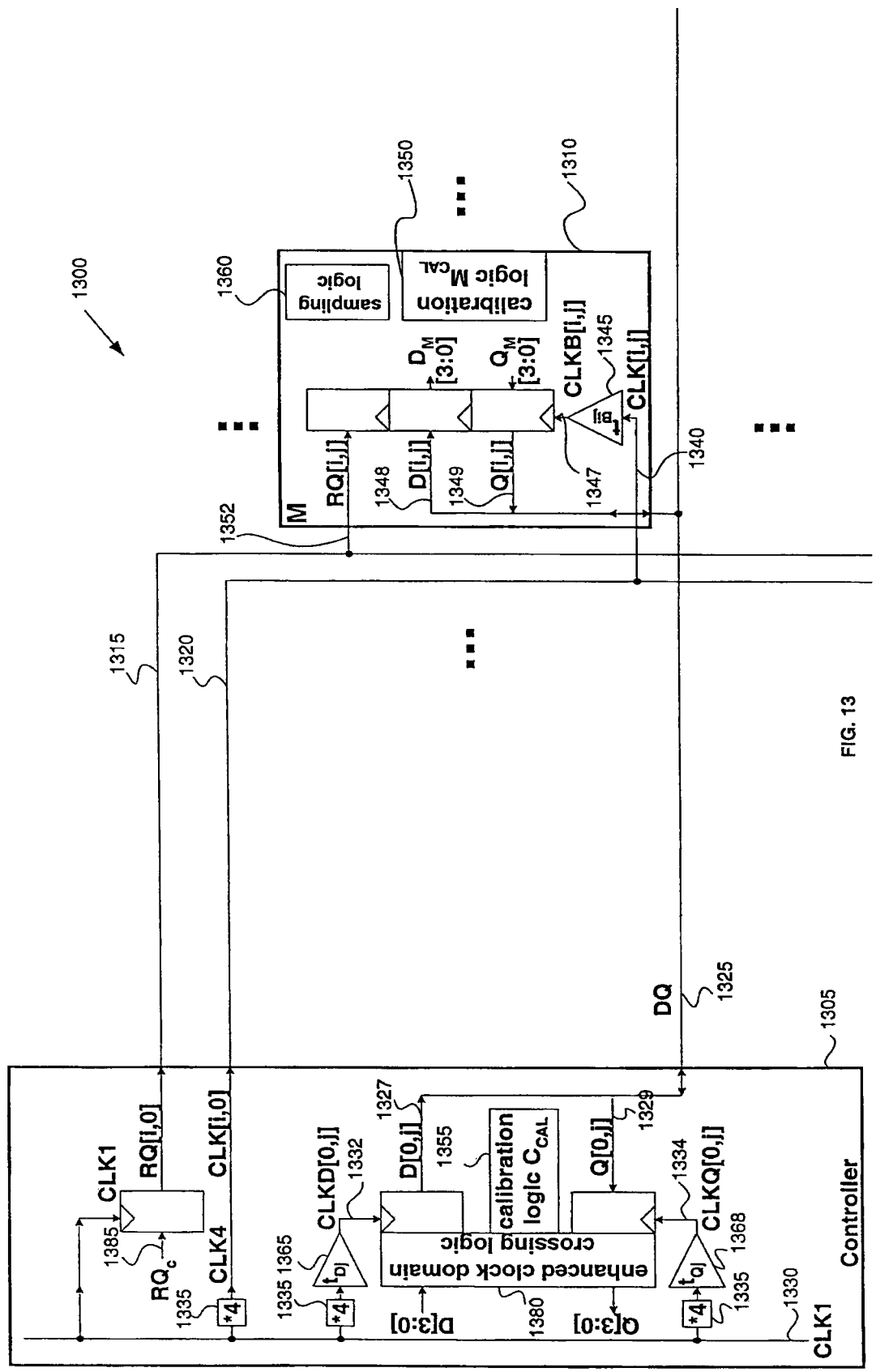
FIG. 13 depicts a dynamic mesochronous memory system in accordance with an alternate preferred embodiment of the present invention.

FIG. 13 shows the overview topology of an alternate preferred dynamic mesochronous memory system 1300. System 1300 is topologically similar to system 400 with respect to the interconnection of components by buses. For example, memory components would still form a two dimensional array, with ranks (rows) indexed by the variable "i" and slices (columns) indexed by the variable "j", following the same notation as before. In system 1300, like system 400, there can be more than a single memory component in each rank. Each rank of memory components is attached to an RQ bus 1315 and a CLK bus 1320. RQ bus 1315 is unidirectional and carries address and control information from the controller to the memory components. CLK bus 1320 is unidirectional and carries timing information from the controller 1305 to the memory components 1310 so that information transfers on the other two signals sets can be coordinated.

Each slice of memory is attached to a DQ bus 1325. DQ bus 1325 is bi-directional, and carries data information from the controller 1305 to a memory component 1310 during write operations, and carries data information from a memory component to the controller during read operation. This description will also refer to the D and Q signal sets separately to include signal sets 1327 and 1329, respectively, even though the same physical wires are shared.

The controller uses an internal clock signal CLK1 1330 for its internal operations. The CLK1 signal is also used as a reference to drive the CLK[i,0] signal on bus 1320, CLKD[0,j] signal on bus 1332 and CLKQ[0,j] signal on bus 1334. The frequency of the clock signals such as CLK4 and CLK[i,0] is an integer multiple of the frequency of CLK1 by way of frequency multiplier 1335 (which is a 4× frequency multiplier in a preferred embodiment). This multiplication is done so that the frequency of CLK[i,0] matches the frequency of the clock used to transmit and receive write data D and read data Q.

The clock signal CLK1 is used to transmit signals on the RQ[i,0] bus 1315. When frequency multiplier 1335 is a 4× multiplier, the rate at which bits are transferred on the RQ bus is one fourth the rate at which bits are transferred on the D and Q signal sets. This transfer rate differential is consistent with the fact that a relatively small amount of address and control information is needed for transferring a relatively large block of read or write data. Other transfer rate differentials between RQ and DQ are possible.

The CLK[i,j] signal 1340 that is received by memory component [i,j] 1310 will have a phase that is offset from CLK[i,0]. The CLK[i,j] signal is received by a simple clock buffer 1345. This buffer 1345 produces a buffered internal clock signal CLKB[i,j] on bus 1347 that is at a different phase than the CLK[i,j] signal. This CLKB[i,j] signal is used to transmit on signal set 1349 to the DQ bus 1325, to receive from the RQ and DQ buses, and to perform all other internal operations in the memory component. Because there is a single clock domain (i.e., CLKB[i,j]) inside the memory component 1310, there is no need for clock domain crossing logic in the memory component as there was in system PA1 (of FIG. 2). In addition, calibration logic 1350 ("$M_{CAL}$") has been added to the memory component 1310. In system 1300, this logic 1350 is used in conjunction with the calibration logic 1355 ("$C_{CAL}$") that has been added to the controller 1305.

Because the internal clock CLKB[i,j] of the memory component runs at four times the rate of the RQ[i,j] bus 1352, it is possible to use sampling logic 1360 within the memory to adjust for unknown skew between the internal clock signal CLKB[i,j] on bus 1347 and the bit signals on RQ interface line 1352 that is caused by the buffer delay $t_{Bij}$.

As in the controller of system 400, write data D[0,j] transmit logic and the read data Q[0,j] receive logic must be operated in two different clock domains (CLKD[0,j] and CLKQ[0,j]) that have different phases than the CLK1 domain that the rest of the controller uses. As a result, there is phase adjustment logic 1365 and 1368 that delays CLK1 by $t_{Dij}$ and $t_{Qij}$, respectively, to form the CLKD[0,j] and CLKQ[0,j] signals, respectively. Because of the multipliers 1335, CLKD[0,j] and CLKQ[0,j] are also four times the frequency of CLK1.

As in system 400, the values $t_{Dij}$ and $t_{Qij}$ are functions of the propagation delay parameters $t_{PROPCLKij}$, $t_{PROPDij}$, and $t_{PROPQij}$. These propagation delay parameters are relatively insensitive to temperature and supply voltage changes. Values $t_{Dij}$ and $t_{Qij}$ are also a function of the delay $t_{Bij}$ of the memory component's clock buffer 1345 as well as other delays such as those associated with transmit and receive circuits. The clock buffer delay will change during system operation because it is relatively sensitive to temperature and supply voltage changes. The programmable values $t_{Dij}$ and $t_{Qij}$ that are generated during system initialization are dynamically updated during system operation, and a calibration process (using the calibration logic $M_{CAL}$ and $C_{CAL}$) is needed to keep the values updated.

In system 1300, enhancements have been made to the clock domain crossing logic 1380 so that the calibration process is handled completely by hardware. Such enhancements are useful to insure that the performance of the system is not significantly impacted by the overhead of the calibration process.

Some of the important differences between system 300 (FIG. 4) and system 1300 are listed below:

(1) System 1300 has a clock buffer 1345 (which can have variable delay during system operation), rather than a PLL/DLL clock recovery circuit on the memory component; (2) System 1300 has calibration logic 1350 and 1355 to the memory component and controller, respectively, to support a calibration process;

(3) System 1300 has enhanced clock domain crossing logic 1380 to improve the efficiency of the calibration process;

(4) Signal transmission on the RQ bus 1315 may be at a lower frequency than the CLK and DQ buses (one fourth the rate of the CLK1 signal in this example); and (5) System 1300 includes sampling logic 1360 in the memory component for the RQ bus.

Figure 14A:
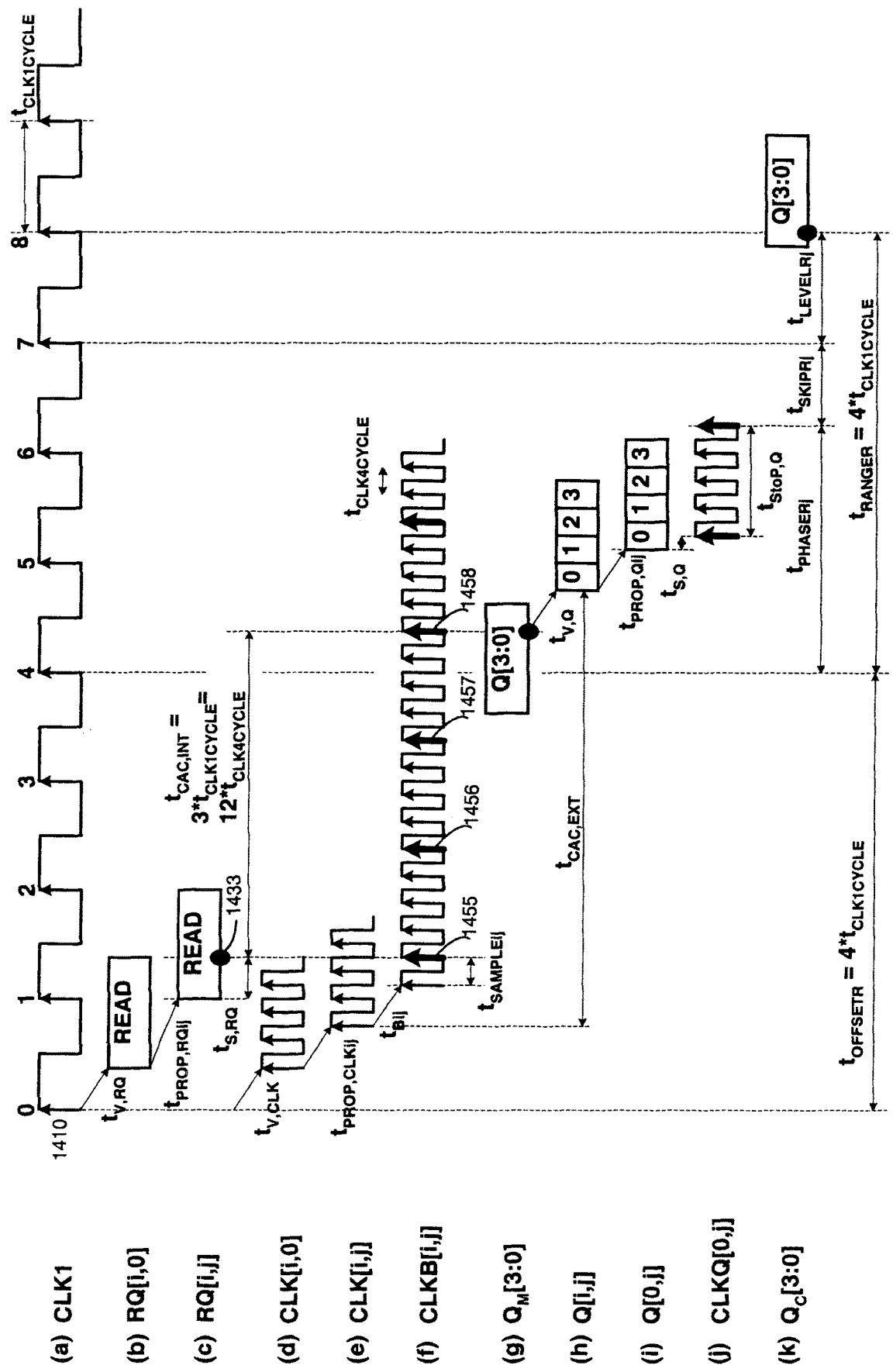

FIG. 14A shows the timing of a read transfer for system 1300. As noted, the controller 1305 uses an internal clock signal CLK1, 1330, for its internal operations. Rising edge 0, 1410, of the CLK1 signal 14(*a*) samples the signal on the internal RQc bus 1385 with a register and causes the register to drive the sampled signal value onto the RQ[i,0] bus 1315 after the delay $t_{V,RQ}$. This delay is the output valid delay (the clock-to-output delay) of the register and driver that samples RQ and drives it out of the controller. The address and control information associated with the read command is denoted by the label "READ" in the figure. The RQ[i,0] signals on the RQ bus 1315 propagate to memory component [i,j] after a propagation delay $t_{PROP,RQij}$ to become the RQ[i,j] signals, where they are received by the memory component. The setup time of the signal on bus RQ[i,j] is $t_{S,RQ}$, measured to the rising edge 1455 of CLKB[i,j] that causes sampling to be performed by the sampling logic 1360.

The CLK1 signal is frequency multiplied, here by four, to give the CLK[i,0] signal 14(d), which is delayed by $t_{V,CLK}$ with respect to CLK1. This delay is the output valid delay of the driver that drives CLK[i,0]. The CLK[i,0] signal propagates to memory component [i,j] after a propagation delay $t_{PROP,CLKij}$ to become signal CLK[i,j] 14(e), where it is received by the memory component 1310 and buffered by buffer 1345 to become the internal clock signal CLKB[i,j] after a delay $t_{Bij}$.

Here, because there are four CLKB[i,j] cycles for each bit received on each signal of set RQ[i,j], there is freedom to choose one of the four rising edges to do the sampling. This freedom is necessary because the delay $t_{Bij}$ will be different between the memory components in rank [i], and the optimal sampling point will need to be separately adjusted. This adjustment is accomplished by selecting one of the four CLKB[i,j] rising edges to receive the RQ[i,j] bus. The sampling edge is denoted by the heavy arrow at 1455-1458 on one of every four of the rising edges of CLKB[i,j] 14(f). Here, this sampling edge is also used for internal operations in the memory component. Note that all four CLKB[i,j] rising edges are used to receive data from the D[i,j] signal set and to transmit data onto the Q[i,j] signal set. The bit time in this example is equal to the CLKB cycle time (which is also the CLK4 cycle time since these two clock signals are frequency locked). The parameter $t_{SAMPLEij}$ accounts for the delay due to the need to choose one of the four CLKB[i,j] rising edges for sampling. $t_{SAMPLEij}$ is measured or denoted in integral units of $t_{CLK4CYCLE}$, the cycle time of CLKB[i,j]. Because CLKB[i,j] is periodic, $t_{SAMPLEij}$ may be positive or negative, and this clock accounts for the time needed to make equation (1) correct:

$$t_{V,RQ}+t_{PROP,RQij}+t_{S,RQ}=t_{V,CLK}+t_{PROP,CLKij}+t_{Bij}+t_{SAMPLEij} \quad (1)$$

The details of the calibration process used to select the sampling edge will be described later.

Once the RQ[i,0] bus has been sampled (denoted by the large black circle 1433 in the figure), the internal read access $t_{CAC,INT}$ is started. In this example, this internal read access requires a total of $3*t_{CLK1CYCLE}$ (which is equivalent $12*t_{CLK4CYCLE}$).

An external read access delay $t_{CAC,EXT}$ may also be defined. This delay is the time from the CLK[i,j] clock signal rising edge which effectively samples the RQ[i,j] bus to the time that the first bit becomes valid on the Q[i,j] signal set:

$$t_{CAC,EXT}=t_{Bij}+t_{SAMPLEij}+t_{CAC,INT}+t_{V,Q} \quad (2)$$

A second external read access delay $t_{CAC,EXT2}$ (not shown) may also be defined. The delay is from the time a signal on the RQ[i,j] bus is set up to the time the first bit becomes valid on the Q[i,j] signal set:

$$t_{CACEXT2}=t_{S,RQ}+t_{CAC,INT}+t_{V,Q}$$

The external read access delay ($t_{CAC,EXT}$) is a useful delay parameter because it includes all delay terms contributed by the memory component 1310, but none contributed by the external interconnections or by the controller. Equation (2) includes two terms ($t_{Bij}$ and $t_{V,Q}$) that will change continuously due to, for example, temperature and supply voltage variations during system operation. In contrast, the internal read access delay term $t_{CAC,INT}$, shown graphically in 14(c), will remain constant during system operation. The term $t_{SAMPLEij}$ will change in increments of $t_{CLK4CYCLE}$ because of sampling logic changes that compensate coarsely for some temperature and supply voltage variations during system operation. Likewise, the second external access delay ($t_{CAC,EXT2}$) includes the terms $t_{S,RQ}$ and $t_{V,Q}$ that change during system operation.

As a result, the external read access delay $t_{CAC,EXT}$ (or $t_{CAC,EXT2}$) of the memory component will change during system operation. This change (plus any changes contributed by the external interconnections or by the controller) can be compensated for using, for example, an adjustable timing value $t_{PHASERj}$ in the controller. Due to the ability of the present invention to "calibrate out" large variations in the external access time of a memory component over time, the difference in external access time between two similar memory read operations (one at a first time and another at a later time when the temperature and/or voltage of the memory component has changed), or two similar memory write operations, may exceed a half-symbol time interval. Two memory operations are "similar" for purposes of this discussion if they have the same internal access time, or if they have very similar internal access times (e.g., which differ by less than a multiplicative factor of 1.1). For instance, two read access operations that are both "page hits" will typically be similar memory read operations having the same internal access time, while a read access that is a page hit and another read access that is a page miss will typically have very different internal access times and thus would not be similar memory operations. Two memory requests (whether read requests or write requests) are "similar" for purposes of this discussion if the resulting memory operations have the same or similar internal access times. Also, as noted earlier in this document, the "symbol time interval" is the duration of an average symbol on the DQ bus as measured at the memory interface, and is sometimes called a "bit time interval."

In a preferred embodiment, the timing compensation capabilities of the calibration circuitry are sufficiently large that the difference in external read access time between two similar memory read operations, or two similar memory write operations, can exceed a full symbol time interval.

At the end of the $t_{CAC,INT}$ interval, the four bits of read data $Q_C[3:0]$ in 14(g) from the memory core are sampled, using the sampling edge of CLKB[i,j]. The four bits are driven from the memory component serially, after the delay $t_{V,Q}$. This delay is the output valid delay (the clock-to-output delay) of the register and driver that samples $Q_C[3:0]$ and drives it out of the memory component onto the Q[i,j] signal set 1349.

The Q[i,j] signal of 14(h) propagates to the controller after a propagation delay $t_{PROP,Qij}$ to become signal Q[0,j], where it is received by the controller. The setup time of signal Q[0,j] is $t_{S,Q}$, measured to the rising edge of internal clock signal CLKQ[0,j] as shown in 14(i). The four serial bits are converted to parallel form after the delay $t_{StoP,Q}$ (this delay is equivalent to $1*t_{CLK1CYCLE}$ or $4*t_{CLK4CYCLE}$). The internal clock CLKQ[0,j] is delayed from CLK1 by ($t_{OFFSETR}+t_{PHASERj}$). $t_{OFFSETR}$ is a fixed offset of $4*t_{CLK1CYCLE}$ in this example. $t_{PHASERj}$ is an adjustable delay for each slice [j]. The delay is updated and adjusted through a calibration process so that it remains centered on the data window of the bits being received on the Q[0,j] bus. The details of this calibration process will be described in a later section. The value of $t_{PHASERj}$ shown at 14(*k*) is preferably chosen to satisfy equation (3):

$$t_{V,CLK} + t_{PROP,CLKij} + t_{Bij} + t_{SAMPLEij} + t_{CAC,INT} + t_{V,Q} + t_{PROP,Qij} + t_{S,Q} + t_{StoP,Q} = t_{OFFSETR} + t_{PHASERj} \quad (3)$$

Many of the terms in Eqn. (3) will be affected by temperature and supply voltage variations during system operation. Here, $t_{PHASERj}$ will be adjusted to compensate for these variations. $t_{PHASERj}$ can be adjusted through a range of $t_{RANGER}$. The value of $t_{RANGER}$ has a value of $4*t_{CLK1CYCLE}$ in this embodiment. The range of $t_{RANGER}$ is chosen to accommodate $t_{PHASERj}$ regardless of whether the terms in Eqn. (3) assume their minimum or maximum values.

Because each slice of memory components can have a different $t_{OFFSETR} + t_{PHASERj}$ value within a rank of memory components, it becomes necessary for the controller to add some variable delay to ensure that the read data $Q_C[3:0]$ becomes available at a fixed time. The fixed time that is chosen in this example is $t_{OFFSETR} + t_{RANGER}$, and has a value of $8*t_{CLK1CYCLE}$. Stated differently, read data from the read command sampled on CLK1 edge 0 is available for all slices on CLK1 edge 8.

The compensating delays are inserted by the controller's domain crossing logic 1380. The delays are $t_{SKIPRj} + t_{LEVELRj}$. $t_{SKIPRj}$ is the term that inserts a delay that is a fraction of $t_{CLK1CYCLE}$. $t_{LEVELRj}$ is the term that inserts a delay that is an integer multiple of $t_{CLK1CYCLE}$ of signal 14(*a*), where the integer multiple is equal to or greater than zero.

The propagation delay $t_{PROP,Qij}$ for data signals and the propagation delay $t_{PROP,CLKij}$ for clock signals remain substantially constant, even with changes in temperature and voltage levels. As a result, differences in the external access time of memory components in the same rank are almost completely the result of differences in the internal operating characteristics of the memory components, which in turn are due to manufacturing differences as well as differences in temperature and voltage. In prior art systems, the external access time of all the memory components in a single rank would have to be substantially the same, within a tolerance of much less than half a symbol time interval, in order to avoid data transmission errors. In contrast, the calibration circuitry of the present invention enables the use of memory components in the same rank of a system that have external access times, for similar memory requests for similar memory operations, that differ by more than half of a symbol time interval. The calibration circuitry of the present invention can handle such large differences in external access time because a respective access compensation time is separately determined for each memory component of the system. Further, because the compensation time value that is determined for each memory component has such a large range of possible values, external access time differences (for memory components in the same rank of the system) greater than a full symbol time interval can be easily compensated, and thus "calibrated out" of the system.

Referring to FIG. 14B, another way to distinguish synchronous and static mesochronous systems from dynamic mesochronous systems is to look at the alignment of the data bit window with respect to the clock signal at the pins of the component. For example, in FIG. 14A, the clock signal 14(*e*) CLK[i,j] received at the memory component may be compared to the read data 14(*h*) Q[i,j] output by the memory component. In a synchronous or static mesochronous system, the range of the relative phase of these signals (the drive offset time) will be essentially fixed. In this example, the bit time for Q[i,j] starts at a point −90 degrees in the CLK[i,j] cycle and is equal to a CLK[i,j] cycle time. The convention used here is to measure the phase offset (delay offset) from the beginning of a bit time to the rising CLK[i,j] edge that is associated with that bit time. In a dynamic mesochronous system, the range of the relative phase of these signals can be expected to vary over a full bit time (plus or minus a one-half of a symbol time interval or plus or minus 180 degrees).

For example, as shown in FIG. 14B, the phase difference could be measured at different times during system operation. For a static mesochronous system, the relative phase values stay within a narrow range (plus or minus 20 degrees, in this case) around the nominal phase offset of −90 degrees. For a dynamic mesochronous system, the relative phase values can vary over the maximum possible range (plus 90 or minus 270 degrees in this example) around the nominal phase offset of −90 degrees.

This provides another way, then, to distinguish the types of systems. If the relative phase of the clock signal and the data signal remain within a range of plus or minus 90 degrees (plus or minus one-quarter of a symbol time interval) from the nominal operating point during system operation, then the system is a synchronous or static mesochronous system. If relative phase of the clock signal and the data signal varies over a range that exceeds plus or minus 90 degrees (plus or minus one-quarter of a symbol time interval), then the system is a dynamic mesochronous system.

This means of discriminating static mesochronous and dynamic mesochronous systems can be extended to systems in which there are two or more bit times per clock cycle. In this case, the relative phase is measured between a clock event (the rising edge in this example) and the beginning of bit time that straddles or is otherwise associated with the clock event. 360 degrees of phase are equal to the bit time interval (the shorter of the bit time and clock cycle intervals). In a static mesochronous system, the relative phase of the rising edge and the start of the associated bit time remain within a range of plus or minus 90 degrees from the nominal phase offset. In a dynamic mesochronous system, the relative phase of the clock event and the start of the associated bit time can drift outside this range of plus or minus 90 degrees from the nominal phase offset. Note that since there are a set of two or more bit times associated with each clock event, it is necessary to consistently use the same bit time from each set when evaluating the phase shift during system operation.

This means can also be extended to systems in which there are two or more clock cycles per bit time. In this case, the relative phase is measured between a clock event (e.g., the rising edge of the clock signal) and the beginning of the bit time that straddles or is otherwise associated with the clock event. 360 degrees of phase are equal to the clock cycle interval (the shorter of the bit time and clock cycle intervals). In a static mesochronous system, the relative phase of the clock event and the start of the associated bit time remain within a range of plus or minus 90 degrees from the nominal phase offset. In a dynamic mesochronous system, the relative phase of the clock event and the start of the associated bit time can drift outside this range of plus or minus 90 degrees from the nominal phase offset. Note that there are a set of two or more clock cycles associated with each bit time, and therefore it is necessary to consistently use the same clock event from each set when evaluating the phase shift during system operation.

Figure 15:
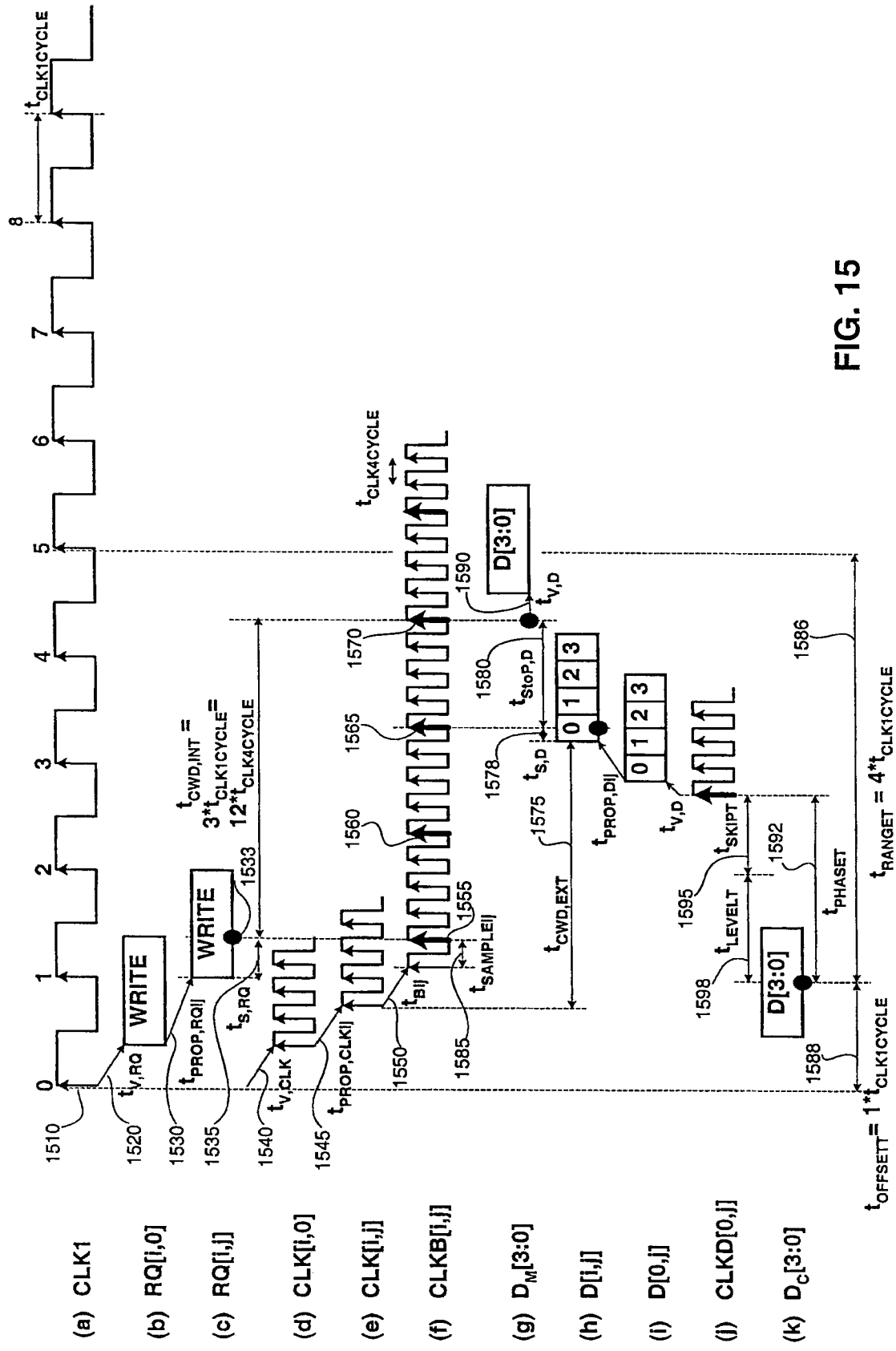
FIG. 15 depicts a sequence of timing signals for a write transfer of the system topology of FIG. 13.

FIG. 15 shows the timing of a write transfer for system 1300. As noted, the controller 1305 uses an internal clock signal CLK1 for its internal operations. Rising edge 0, 1510 of the CLK1 signal in 15(*a*) samples the signal on internal RQc bus with a register and causes the register to drive the sampled signal value onto the RQ[i,0] bus after the delay $t_{V,RQ}$. This delay is the output valid delay (the clock-to-output delay) of the register and driver that samples RQc and drives it out of the controller. The address and control information associated with the write command is denoted by the label "WRITE" in the figure. The RQ[i,0] bus propagates to memory component [i j] after a propagation delay $t_{PROP,RQij}$ 1530 to become the RQ[i,j] signal of 15(*c*), which is received by the memory component [i,j]. The setup time of bus RQ[i,j] is $t_{S,RQ}$ 1535, measured to the rising edge 1555 of CLKB[i,j], shown in 15(*f*), that performs the sampling.

The CLK1 signal is multiplied in frequency, here by four, to give the CLK[i,0] signal of 15(*d*), which is delayed by $t_{V,CLK}$ 1540 relative to the CLK1 signal. This delay is the output valid delay of the driver that drives CLK[i,0] out of the controller. The CLK[i,0] signal propagates to memory component [i,j] after a propagation delay $t_{PROP,CLKij}$ 1545 to become signal CLK[i,j] of 15(*e*), where it is received by the memory component and buffered to become the internal clock signal CLKB[i,j] after a delay $t_{Bij}$, 1550.

Here, because there are four CLKB[i,j] cycles for each bit received from each signal of set RQ[i,j], there is freedom to choose one of the four rising edges to do the sampling. This freedom is necessary because the delay $t_{Bij}$ will be different between the memory components in rank [i], and the optimal sampling point will need to be separately adjusted. This adjustment is accomplished by selecting one of the four CLKB[i,j] rising edges to receive the RQ[i,j] bus. The sampling edge is denoted by the heavy arrow at 1555-1570 on one of every four of the rising edges of CLKB[i,j] in 15(*f*). This sampling edge is also used for all internal operations in the memory component. Note that all four CLKB[i,j] rising edges are used to receive signals on the D[i,j] signal set and to transmit signals on the Q[i,j] signal set. The parameter $t_{SAMPLEij}$ 1585 in 15(*f*) accounts for the delay due to the need to choose one of the four CLKB[i,j] rising edges for sampling. The duration of $t_{SAMPLEij}$ is measured in integral units of $t_{CLK4CYCLE}$, the cycle time of CLKB[i,j]. Because CLKB[i,j] is periodic, $t_{SAMPLEij}$ may be positive or negative; it accounts for the time needed to make the following equation correct:

$$t_{V,RQ}+t_{PROP,RQij}+t_{S,RQ}=t_{V,CLK}+t_{PROP,CLKij}+t_{Bij}+t_{SAMPLEij} \quad (4)$$

The details of the process to select the sampling edge will be described later.

The steps of the write transfer described above are virtually identical to the corresponding steps of the read transfer. However, particular differences between the read and write transfer exist.

Once the RQ[i,0] bus has been sampled (denoted by the large black circle 1533 in the figure), the internal write access time interval $t_{CWD,INT}$ is started. This requires a total of $3*t_{CLK1CYCLE}$ (which is equivalent $12*t_{CLK4CYCLE}$) in this example.

An external write access delay $t_{CWD,EXT}$ 1575 may also be defined. This delay 1575 is the time from the CLK[i,j] clock signal rising edge which effectively samples the signal on the RQ[i,j] bus to the time that the first bit is set up on the D[i,j] signal set:

$$t_{CWD,EXT}=t_{Bij}+t_{SAMPLEij}+t_{CWD,INT}-t_{S,D}-t_{StoP,D} \quad (5)$$

A second external write access delay $t_{CWD,EXT2}$ (not shown) may be defined. This delay is from the time a signal on the RQ[i,j] bus is set up to the time the first bit is set up on the D[i,j] signal set:

$$t_{CWD,EXT2}=t_{S,RQ}+t_{CWD,INT}-t_{S,D}-t_{StoP,D}$$

Eqn. (5) is useful because it includes all delay terms contributed by the memory component, but none contributed by the external interconnections or by the controller. Eqn. (5) includes two terms ($t_{Bij}$ 1550 and $t_{S,D}$ 1578) that will change continuously due to temperature and supply voltage variations during system operation. In contrast, the terms $t_{CWD,INT}$ and $t_{StoP,D}$ 1580 will remain constant during system operation. The term $t_{SAMPLEij}$ 1585 will change in increments of $t_{CLK4CYCLE}$ because of sampling logic changes that compensate coarsely for some temperature and supply voltage variations during system operation. Likewise, the second external access delay ($t_{CWD,EXT2}$) includes the terms $t_{S,RQ}$ and $t_{S,D}$ that change during system operation.

As a result, the external write access delay $t_{CWD,EXT}$ 1575 of the memory component will change during system operation. This change (plus any changes contributed by the external interconnections or by the controller) will be compensated with an adjustable timing value $t_{PHASETj}$ in the controller.

At the end of this $t_{CWD,INT}$ interval, shown graphically in 15(*c*), the four bits of write data $D_M[3:0]$ in 15(*g*) are held in a register and are available for writing to the memory core after the delay $t_{V,D}$. This delay 1590 is the output valid delay (the clock-to-output delay) of the holding register.

The D[0,j] signals propagate to the memory component after a propagation delay $t_{PROP,Dij}$ to become the D[i,j] signals of 15(*h*), which are received by the memory component. The setup time of signal set D[i,j] is $t_{S,D}$ 1578, measured to the rising edge of internal clock signal CLKB [i,j], here measured to rising edge 1565. The four bits are received by the memory component serially, after the delay $t_{StoP,D}$. This delay 1580 is the serial-to-parallel conversion delay (this is equivalent to $1*t_{CLK1CYCLE}$ or $4*t_{CLK4CYCLE}$). The four bits of write data become valid (e.g., at the output of latch 1960 in FIG. 19B) a time $t_{V,D}$ after the last of these four bits is sampled by the rising edge of internal clock CLKB[i,j]. This delay 1590 is the output valid delay (the clock-to-output delay) of the register 1960 (FIG. 19B) and on the controller.

The internal clock CLKD[0,j] of 15(*j*) is delayed from CLK1 by ($t_{OFFSETT}+t_{PHASETj}$). Here, $t_{OFFSETT}$ 1588 is a fixed offset of $1*t_{CLK1CYCLE}$. $t_{PHASETj}$ is an adjustable delay for each slice [j]. This adjustable delay is updated through a calibration process involving calibration logic 1350 and 1355 (FIG. 13) that keeps the write data bits on the bus carrying the D[i,j] signal set centered with respect to the CLKB[i,j] clock signal that is sampling them in the memory component [i,j]. The details of this calibration process will be described later. The value of $t_{PHASETj}$, shown in 15(*k*), is preferably chosen to make the following equation correct:

$$t_{V,CLK}+t_{PROP,CLKij}+t_{Bij}+t_{SAMPLEij}+t_{CWD,INT}=t_{OFFSETT}+t_{PHASETj}+t_{VD}+t_{PROP,Dij}+t_{S,D}+t_{StoP,D} \quad (6)$$

Many of the terms in Eqn. (6) will be affected by temperature and supply voltage variations during system operation. $t_{PHASETj}$ is adjusted by the calibration process to compensate for these variations. $t_{PHASETj}$ can be adjusted through a range of $t_{RANGET}$ 1586. Here, $t_{RANGET}$ has a value of $4*t_{CLK1CYCLE}$. This range is chosen to accommodate $t_{PHASETj}$, regardless of whether the terms in the above equation assume their minimum or maximum values.

Each slice of memory component can have a different $t_{OFFSETj}+t_{PHASETj}$ value within a rank of memory components. However, each memory component will be presented with write data at its core at the appropriate time ($t_{CWD,INT}$ after the CLKB[i,j] clock edge that samples the RQ[i,j] bus).

The $t_{PHASETj}$ delay 1592 is inserted by the controller's domain crossing logic 1380. Other delays inserted include $t_{SKIPTj}+t_{LEVELTj}$. $t_{SKIPTj}$ 1595 is a delay that is a fraction of $t_{CLK1CYCLE}$. $t_{LEVELTj}$ 1598 is a delay that is an integer multiple of $t_{CLK1CYCLE}$ of the signal in 15(a).

Figure 16:
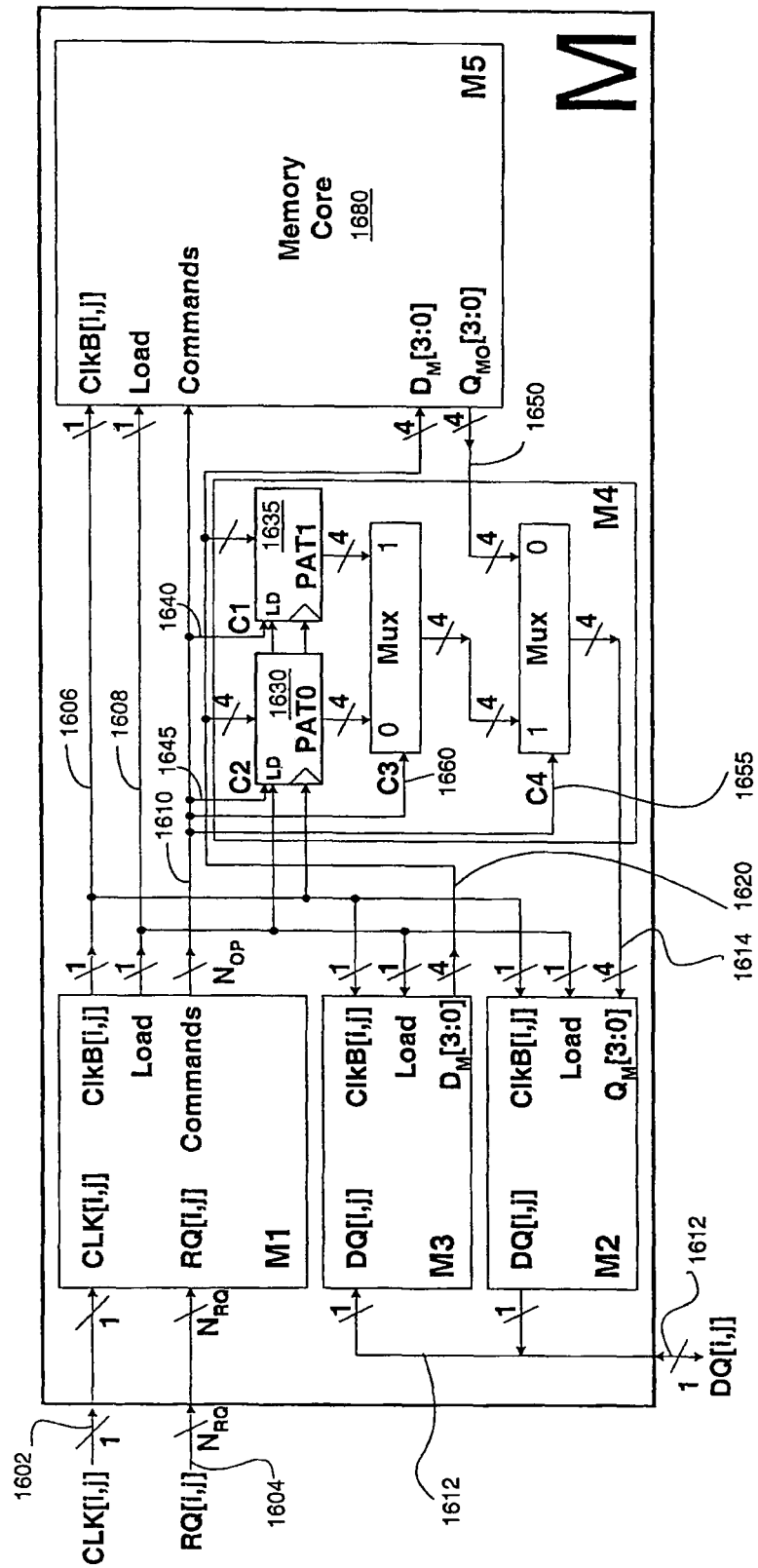
FIG. 16 is block diagram of a memory system in accordance with a preferred embodiment.

FIG. 16 shows the logic for the memory component 1600 at position [i,j] in system 1300. There are three buses that connect the memory component to the external system: CLK[i,j], RQ[i,j] and DQ[i,j]. In this example, the RQ[i,j] bus 1604 has $NR_Q$ signals, where N is an integer greater than zero, and the other two buses have one signal each.

As depicted in FIG. 16, memory component 1600 is configured to connect to the controller with one DQ wire per slice. Other embodiments could connect the memory component to the controller with more than one DQ[i,j] signal by a simple extension of the methods described for system 1300.

Memory component 1600 has three internal logic blocks forming the memory interface: M1, M2, and M3. There is a memory core (block M5) that contains storage cells (i.e., the main memory array subcomponent of the memory component). There is also a set of registers and multiplexing logic (block M4) that form the calibration logic (also called $M_{CAL}$ earlier) for the memory component 1600.

Block M1 receives the CLK[i,j] and RQ[i,j] buses 1602 and 1604, respectively. Block M1 produces a buffered clock CLKB[i,j] that is used throughout memory component 1600. Block M1 also produces a Load signal on bus 1608 that indicates which CLKB[i,j] signal edges are used for internal operations. A Commands bus 1610 carries command signals that indicate which memory command (READ, WRITE, WRPAT0, WRPAT1, RDPAT0, RDPAT1, etc.), if any, is being executed.

Block M2 transmits read data on the DQ[i,j] bus 1612. Block M2 performs a parallel to serial conversion on data bits received via the bus $Q_M[3:0]$ 1614 from Block M4. Block M2 also uses the buffered clock CLKB[i,j] and Load signals.

Block M3 receives write data on the DQ[i,j] 1612 bus. Block M2 performs a serial to parallel conversion and outputs the resulting bits on bus $D_M[3:0]$ 1620. Block M2 also uses the buffered clock CLKB[i,j] on bus 1606 and Load signals on bus 1608.

The calibration logic M4 consists of two registers PAT0 and PAT1 1630 and 1635, respectively, which can be loaded with write data on bus $D_M[3:0]$ 1620. The loading of the write data occurs when the WRPAT0 or WRPAT1 commands are asserted on the Commands bus 1610, causing the C2 or C1 load signals on buses 1640 and 1645, respectively, to be asserted.

The calibration logic M4 is also able output the contents of the two registers PAT0 and PAT1 onto the bus $Q_M[3:0]$ 1614 instead of the read data $Q_{MO}[3:0]$ 1650 from the memory core, block M5. The contents of the registers PAT0 and PAT1 are output onto the bus $Q_M[3:0]$ 1614 when read commands RDPAT0 and RDPAT1, respectively, are received by the memory component via the RQ bus. These read commands cause the C4 select signal 1655 to be asserted and the C3 signal 1660 to be deasserted or asserted, respectively, so as to route the data from the PAT0 and PAT1 registers to the $Q_M[3:0]$ bus 1614.

The two "pattern" registers 1630 and 1635 assume specific values (i.e., are automatically initialized) when the memory component 1600 is first powered up. In one embodiment, the pattern registers are initialized to a predefined value (e.g., "0 1 0 0") by circuitry that detects the ramping-up of the supply voltage. In another embodiment, the register initialization circuits is responsive to a RESET command on the command bus 1610 or to a sideband signal that causes the memory component 1600 to reset to a known state (this signal is not shown). Initialing the pattern registers 1630, 1635 to a known value is important for correct initial execution of the calibration process. These initial values could be replaced by other values later.

Figure 17:
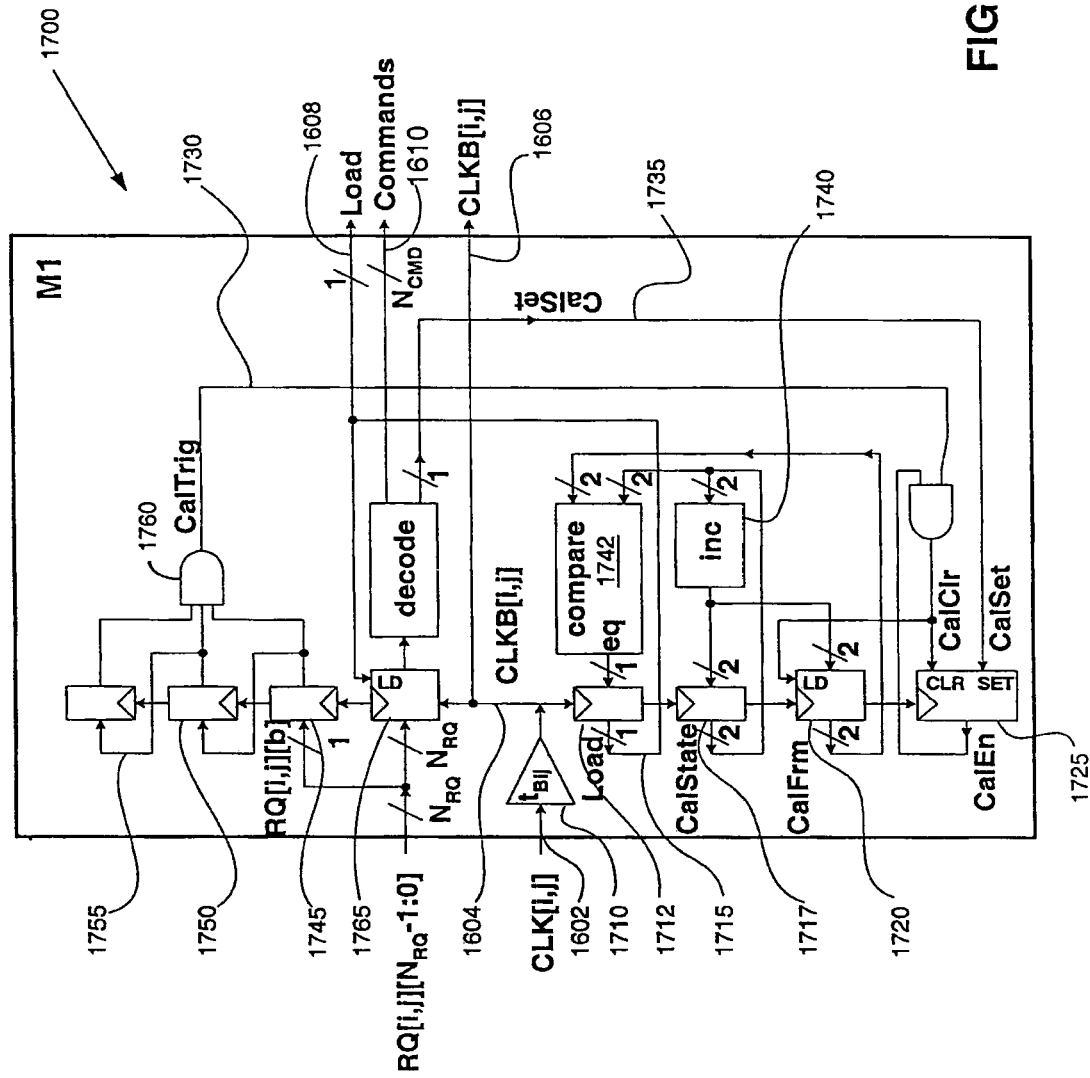
FIG. 17 is logic diagram for a memory system of the preferred embodiment.
Figure 18:
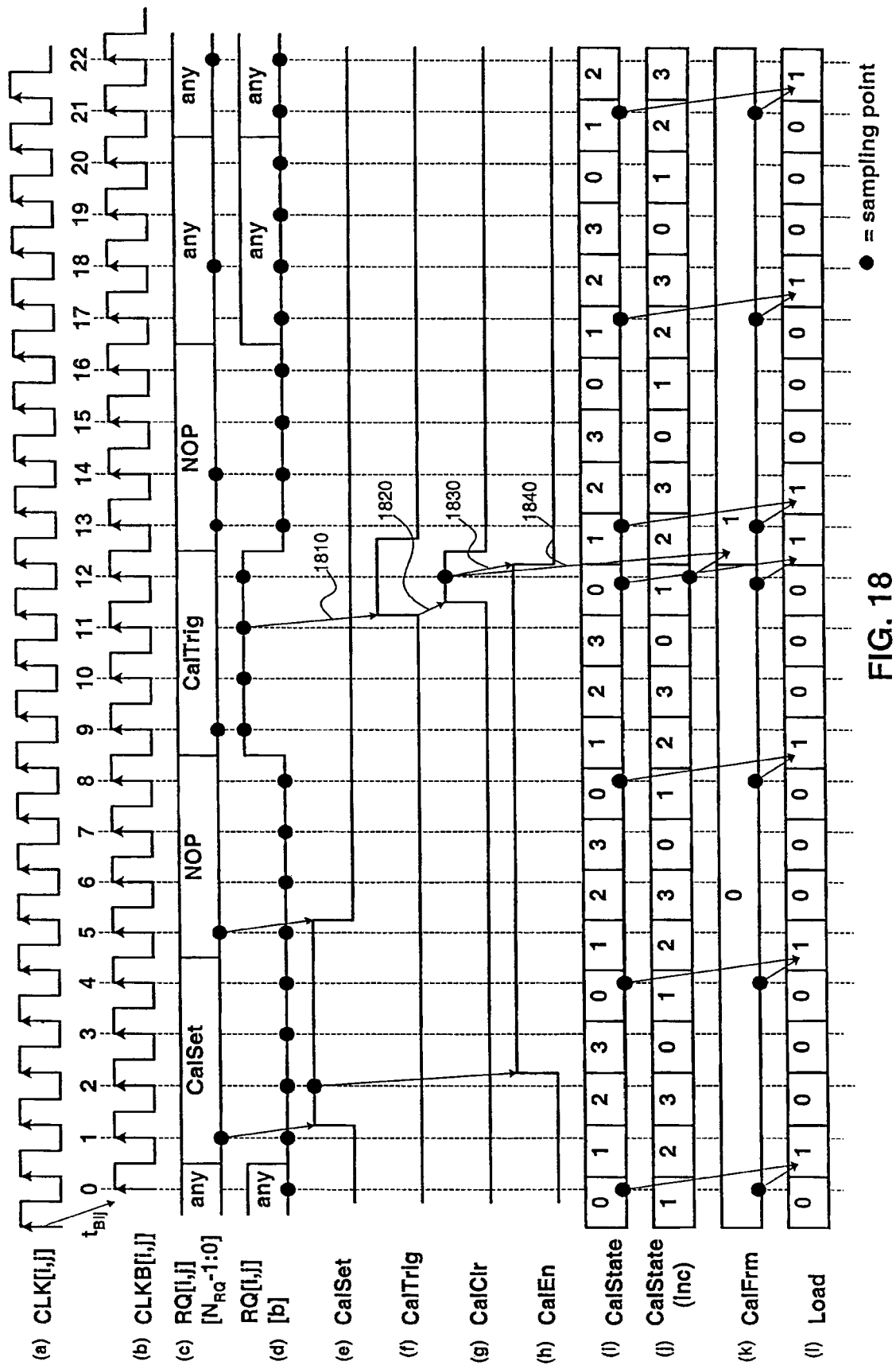
FIG. 18 shows a sequence of timing signals for block M1 of the memory system of FIG. 16.

FIG. 17 shows the logic for block M1 of the memory component 1600 at position M[i,j] in system 1300 for producing buffered clock signal CLKB[i,j] on bus 1606, Load signal on bus 1608/1715 and Commands signals on bus 1610. More generally, the logic diagram in FIG. 17 and the timing diagram in FIG. 18 show how the calibration apparatus of block M1 is configured to determine the suitability of a plurality of timing events (i.e., each of the "1"s on the RQ[i,j][b] signal after a CALSET command is received on the RQ[i,j] signal) and to select, based on the suitability determination, one of the plurality of timing events for use as a sampling point for sampling the symbols on the RQ[i,j] signal. In an alternate embodiment, similar calibration circuitry to that used in M1 could be provided to determine the suitability of a plurality of timing events for use as a driving point for driving symbols onto a signal, and to select, based on the suitability determination, one of the plurality of timing signals for use as the driving point.

It should be noted that the calibration apparatus in block M1 of each memory component operates independently of the calibration apparatus in block M1 of each other memory component in the memory system. Thus, even if the same CALSET and CALTRIG commands are sent simultaneously to multiple memory components, each memory component will independently select the best (i.e., most suitable) timing event for sampling the RQ[i,j] signal. As a result, two memory components in the same rank of a memory array may select different timing events at which to sample the RQ[i,j] signal. The same independence of the timing event selection would also apply to systems in which calibration logic is used to select the most suitable timing event (e.g., clock edge) for use as a driving point for driving symbols onto a signal.

System 1700 receives the CLK[i,j] and RQ[i,j] buses 1602 and 1604, respectively. The buffered clock CLKB[i,j] signals produced by buffer 1710 are used by the rest of the memory component. The register 1712 produces a Load signal on bus 1715/1608 which indicates which edges of CLKB[i,j] are to be used for internal operations. A Commands bus 1610 carries command signals that indicate which memory command (READ, WRITE, etc.) is being executed.

The clock signal CLK[i,j] is buffered to produce a buffered CLKB[i,j] signal that clocks a set of register bits, here six bits, which produce the signal Load on buses 1608 and 1715. The six register bits are called Load, CalState[1:0], CalFrm[1:0] and CalEn. The CalState[1:0] register 1717 counts through four states {00,01,10,11}. The CalFrm[1:0] register 1720 contains a two bit value that is compared to CalState[1:0] bits in each cycle. When the bits from the CalState[1:0] register 1717 match the bits of the CalFrm[1:0] register 1720, a Load signal is asserted by the Load register 1712 in the next CLKB[i,j] cycle on the Load bus 1608.

The CalEn register 1725 is used to update the value held in register 1720. Register 1725 is responsive to two signals, CALTRIG 1730 and CALSET 1735, which are commands decoded from bus 1604 by decode logic 1722. The use of these two signals will be further described relative to the timing diagram for system 1700.

FIG. 18 shows the timing for block M1 of the memory component 1600. To facilitate unambiguous references to signals in various timing diagrams of this documents, signals denoted as (a), (b) and so on in FIG. 18 shall be denoted as signals 18(*a*), 18(*b*) and so on in the text of this document. FIG. 18 shows the sequence needed to generate load signals and update the CalFrm[1:0] value, signal 18(*k*), to accommodate any timing shifts due to temperature and supply voltage changes during system operation. It should be noted that all the RQ signals shown in FIG. 18 are signals generated by the controller and sent to the memory component whose operations are depicted in FIG. 18.

The clock signal CLK[i,j] (on bus 1602 in FIG. 16) is shown as waveform 18(*a*). Clock signal CLK[i,j] is buffered and delayed by $t_{Bij}$ to produce CLKB[i,j], waveform 18(*b*). The rising edges of the CLKB[i,j] signal are numbered to label the timing events. The large black circles indicate the sampling point of signals by registers clocked by CLKB[i,j].

The RQ[i,j] bus 1604 carries the $N_{RQ}$ signals labeled RQ[i,j][$N_{RQ}$-1:0]. These signals are shown as waveform 18(*c*), along with signal RQ[i,j][b] broken out individually below as waveform 18(*d*). Note that index "b" is within the range [$N_{RQ}$-1:0] for this example. Signals 18(*c*) and 18(*d*) are used to encode three commands in system 1700 when updating sequences: CALSET (calibration set), NOP (no operation), and CALTRIG (calibration trigger). The label "any" on these signals indicates any other command may be provided during the respective interval. Signal RQ[i,j][b] must be low for the NOP command and the CALSET command 18(*e*), and must be high for the CALTRIG command signal 18(*f*). Other restrictions on the command encoding are not necessary.

The update sequence begins with the Cal State[1:0] register 1717 incrementing via incrementer 1740 through its four possible states. The CalState signal is shown as signal 18(*i*), and the incremented signal is represented as waveform 18(*j*). In the example shown in FIG. 18, the CalFrm[1:0] register 1720 holds the value "00", and therefore the comparator 1742 finds a match during the cycles in which the value in the CalState[1:0] register is "00". The positive output of the comparator results in a "1" being stored in the Load register 1710 at the next positive going edge of the CLKB[i,j] signal, at which time the value in the CalState [1:0] register becomes "01". Signal 18(*k*) depicts the signal CalFrm stored in register 1720, and signal 18(*l*) depicts the Load signal waveform. In other words, the Load signal waveform 18(*l*) is equal to "1" in each clock cycle that follows a clock cycle in which the value in the CalState[1:0] register 1717 equals the value in the CalFrm[1:0] register 1720.

The RQ[i,j][$N_{RQ}$-1:0] bus 1604 is sampled on edge 1 (because the Load signal 18(*l*) is asserted during edge 1) and is decoded as the CALSET command, causing the CALSET signal 18(*e*) to be asserted. Signal 18(*e*) is sampled by the CalEn register 1725 on edge 2, causing the CalEn signal 18(*h*) to be asserted after edge 2.

The RQ[i,j][ $N_{RQ}$-1:0] bus is sampled again on edge 5, and is decoded as a NOP and ignored.

The RQ[i,j][ $N_{RQ}$-1:0] bus is sampled again on edge 9, and is decoded as a CALTRIG command, which is ignored and treated the same as a NOP. However, the RQ[i,j][b] signal is asserted and sampled high on edges 9, 10, 11, and 12. A set of three registers 1745, 1750, 1755 and an "AND" gate 1760 detect three high assertions in a row (of the RQ[i,j][b] signal) and assert the CALTRIG signal 18(*f*) as indicated by arrow 1810. Signal 18(*f*) causes the CalClr signal, 18(*g*), to be asserted. The CalClr signal 18(*g*), in turn, is sampled by the CalEn register 1725 (indicated by arrow 1830), causing it to go low (i.e., be reset) after edge 12. The CalClr signal 18(*g*) also enables the CalFrm[1:0] register to load the incremented value of the CalState[10] register (as indicated by arrow 1840), and to output its new value after edge 12. This new value is "01", meaning that the Load signal on bus 1608 will now be asserted during the cycles in which the CalState[1:0] register 1717 is "10". In other words, the sampling point selected by the Load register 1765 has shifted right by one CLKB[i,j] cycle.

The RQ[i,j][ $N_{RQ}$-1:0] bus is sampled on edges 13 and 14, and is decoded as a NOP and ignored. The RQ[i,j][ $N_{RQ}$-1:0] bus is sampled again on edge 18, and is decoded as a valid command, and the command is executed.

The timing relationship in FIG. 18 depicts a simple hardware implemented algorithm that searches for a string of three sampled "1"s on the RQ[i,j][b] signal and updates the CalFrm[1:0] value to the value in the CalState[1:0] register plus 1. This CalFrm[1:0] value is the one that makes the Load signal assert during the second sampled "1". The previous value of CalFrm[1:0] caused the Load signal to assert during the first sampled "1", which is not optimal because there is less timing margin. The Load signal controls not only when the command signal RQ[ij][$N_{RQ}$-1:0] is sampled and decoded, but also controls the timing of data loads in the M2 and M3 blocks and in PAT0 and PAT1 registers.

Figure 19A:
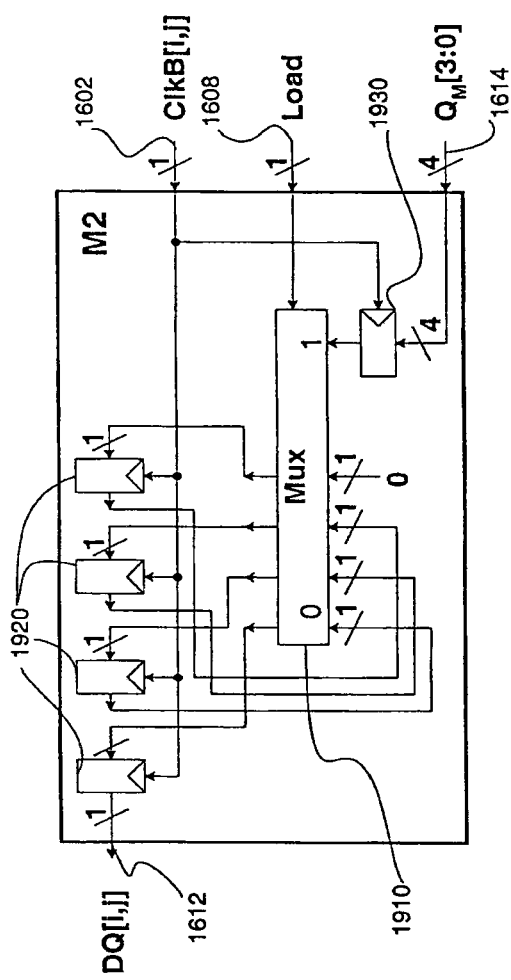
FIG. 19A is a logic diagram of the M2 module in the memory system of FIG. 16 for transmitting read data on a bus.

FIG. 19A shows the logic for block M2 of the memory component 1600 at position [i,j] in system 1300. Block M2 performs a parallel to serial conversion, taking four parallel bits of read data from the $Q_M$[3:0] bus 1614 and serially transmitting the read data onto the bi-directional DQ[i,j] bus 1612. Block M2 also uses the buffered clock CLKB[i,j] and Load signals.

The Load signal on bus 1608 is asserted during one of every four rising edges of CLKB[i,j]. In this example, the edge of CLKB[i,j] that is selected is the same as the one that is used by block M1 to receive the RQ[i,j] signal. As a result, the internal read access time $t_{CAC,INT}$ will be an integral multiple of $t_{CLK1CYCLE}$ (3*$t_{CLK1CYCLE}$ or 12*$t_{CLK4CYCLE}$). Other embodiments could deliberately misalign the Load signal for receiving the RQ[i,j] signal on bus 1604 and the Load signal for transmitting the DQ[i,j] signal 1612 to match a timing requirement of the memory core 1680.

Register 1930 is loaded with four bits of information from the $Q_M$[3:0] bus 1614 during each clock cycle, but only the information loaded in the clock cycle prior to each Load signal is used. When the Load signal 18(*l*), or 1608, is asserted, the four bits of information in register 1930 are steered through multiplexer 1910 to the four one-bit registers 1920 and are loaded into those registers 1920 upon the clock edge that occurs while Load is enabled. The outputs of a last one of the registers 1920 is asserted as the DQ[i,j] signal after the clock edge. On the next three clock edges the multiplexer shifts the remaining three bits onto the DQ[i,j] signal.

Figure 19B:
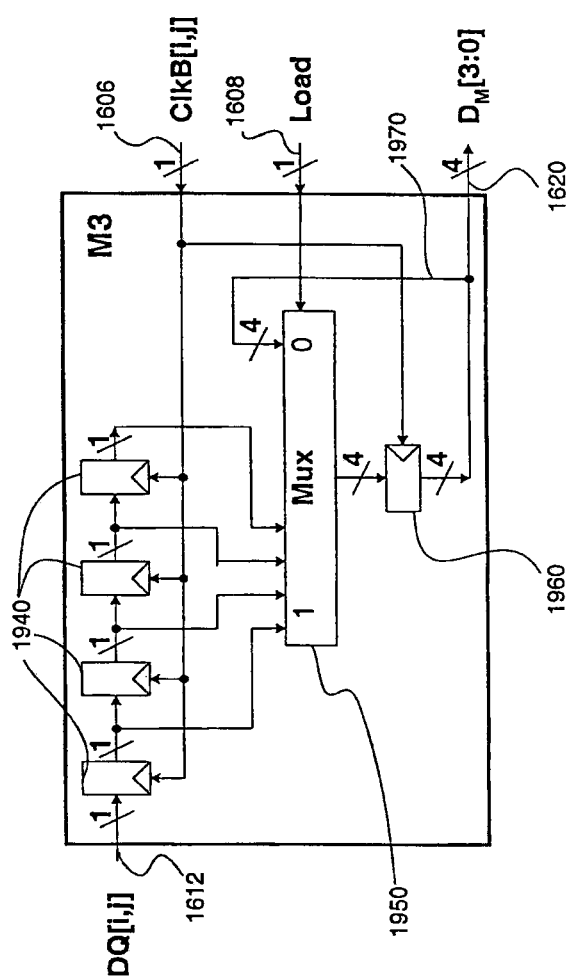
FIG. 19B is a logic diagram of the M3 module in the memory system of FIG. 16 for receiving write data.

FIG. 19B shows the logic for block M3 of the memory component 1600 at position [i,j] in system 1300. Block M3 receives write data on the DQ[i,j] bus 1612. A serial to parallel conversion is performed by registers 1940 and multiplexer 1950 to create the parallel data asserted on bus $D_m[3:0]$ 1620. The serially connected registers 1940 are clocked by the buffered clock signal 1606, and Load signal transfers the content of the registers 1940 through the multiplexer 1950 to register 1960.

The Load signal on bus 1608 is asserted on one of every four rising edges of the CLKB[i,j] signal on bus 1606. In this example, the selected edge is the same edge as the one that is used by block M1 for receiving the RQ[i,j] signal on bus 1604. As a result, the internal write access time $t_{CWD,INT}$ will be an integral multiple of $t_{CLK1CYCLE}$ ($1*t_{CLK1CYCLE}$ or $4*t_{CLK4CYCLE}$). Other embodiments could deliberately misalign the Load for receiving the RQ bus and the Load signal for receiving the DQ bus 1612 to match a timing requirement of the memory core 1680.

During a write transfer, the four one-bit registers 1940 connected serially to the DQ[i,j] signal 1612 continuously shift in the write data that is present on each rising edge of CLKB[i,j]. When the Load signal on bus 1608 is asserted, the most recent shifted-in write data is loaded in parallel to the register 1960 connected to the $D_M[3:0]$ bus 1620. When the Load signal is deasserted, the contents of register 1960 are recirculated through the multiplexer on line 1970.

FIG. 20 shows the logic 2000 for the controller component 1305 in the system 1300. There are three buses that connect the controller to the memory components of the memory system: CLK[i,0] 1320, RQ[i,0] 1315 and DQ[0,j] 1325. Logic 2000 is made up of three blocks: C1, C2 and C3. Block C1 contains clock generator circuitry. Block C2 contains circuitry for each memory rank [i] and connects to the $N_{RQ}$ signals of the bus 1315 and the one CLK[i,0] signal 1320. Block C3 contains circuitry for each memory slice [j] and connects to the one signal of the DQ[0,j] bus 1325. The controller of FIG. 20 will typically contain other blocks of circuitry, some or all of which are not part of the memory interface, but these blocks are not shown here.

Logic 2000 assumes that each memory component slice connects to the controller with one DQ signal. Other embodiments could connect the memory component to the controller with more than one DQ signal by a simple extension of the methods described for system 1300.

There are six sets of signals that connect the memory interface to the rest of the memory controller: (a) CLKC—the controller clock 2010; (b) $RQ_C[i]$—the request bus for rank [i] 2020 (typically the same for all ranks); (c) TX[j]—the calibration bus for the controller transmit logic slice [j] 2030; (d) RX[j]—the calibration bus for the controller receive logic slice [j] 2040; (e) $Q_C[j][3:0]$—the read data for slice [j] 2050; and (f) $D_C[j][3:0]$—the write data for slice [j] 2060.

Block C1 receives the CLKC signal 2010. Two sets of clock signals are created from this reference clock. Here, the clock signals for all ranks are the same, and the clock signals for all slices are the same. The first set of clock signals is for block C2: (a) CLK1 2015—a derived clock with same frequency as CLKC, and phase-aligned to CLKC; and (b) CLK4[8] 2018—a derived clock with four times the frequency of CLKC.

Figure 22:
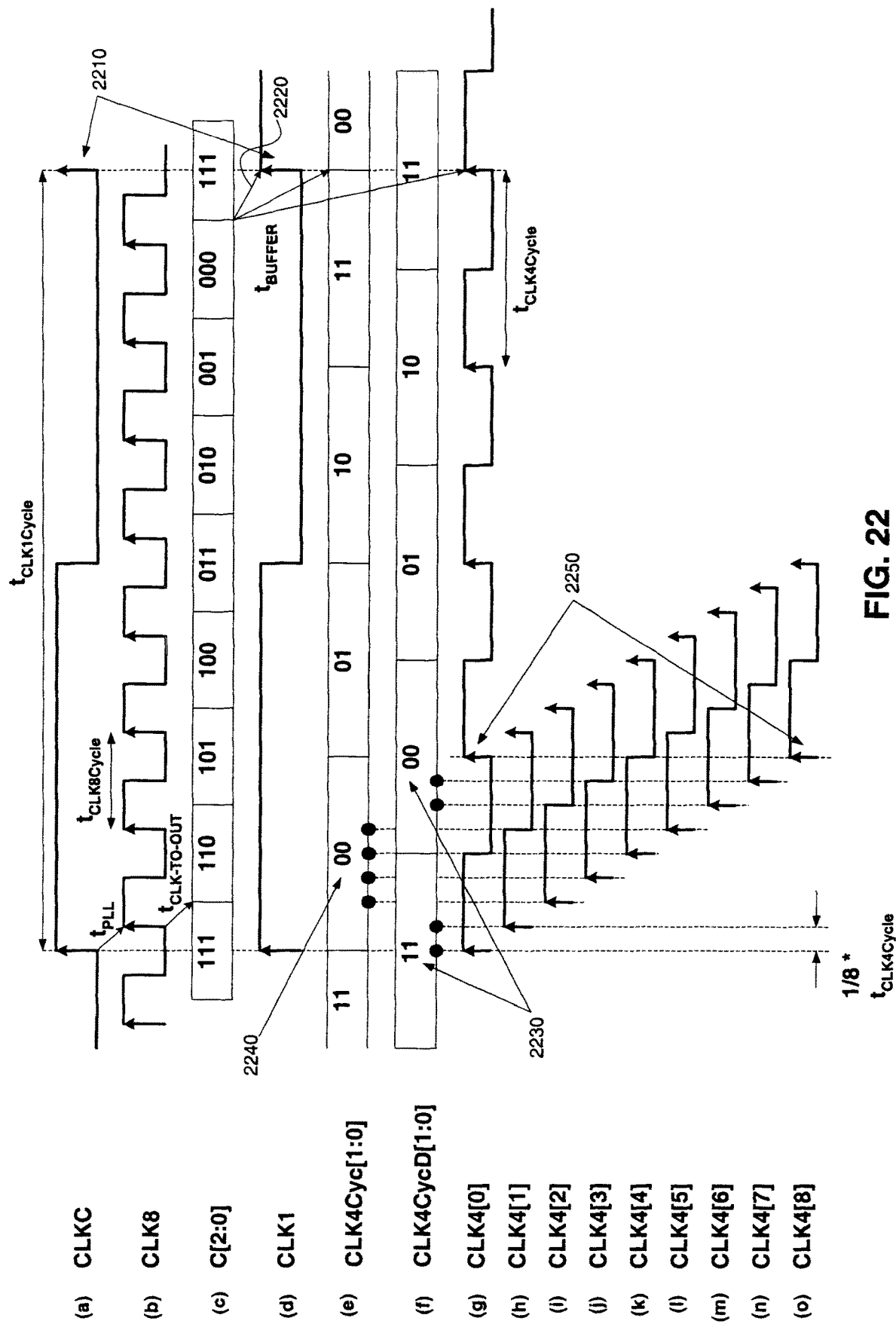
FIG. 22 shows the clock generation sequence for block C1 of the controller.

The second set of clock signals is for block C3: (a) CLK1 2015—a derived clock with same frequency as CLKC, and phase-aligned to CLKC; (b) CLK4Cyc[1:0] 2022, which is a cycle count of CLK4 clock cycles, and thus indicates a phase of CLK4 cycle relative to CLK1; (c) CLK4CycD[1:0] 2025, which is the same as CLK4Cyc[1:0] except that it is delayed by half a CLK4 clock cycle relative to CLK4Cyc[1:0]; and (d) CLK4[7:0] 2028, which is a set of 8 derived clocks having four times the frequency of CLKC, each having a different phase offset (as shown in FIG. 22), staggered in increments of $\frac{1}{8}^{th}$ of a CLK4 cycle. The CLK4[7:0] signals are also herein called phase vectors and the CLK4Cyc[1:0] is also herein called a clock count signal. These phase vectors and the clock count signal are used by both the transmit and receive circuits for each DQ bus.

Block C2 receives the $RQ_C[i,0]$ bus 1315 from other circuitry in the controller and receives the CLK1 2015 and the CLK4[8] 2018 clock signal from block C1.

Block C3 connects to the TX[j], RX[j], $Q_C[j][3:0]$, and $D_C[j][3:0]$ buses from the rest of the controller. Block C3 receives the CLK1, CLK4Cyc[1:0], CLK4CycD[1:0], and CLK4[7:0] buses from block C1.

Figure 21:
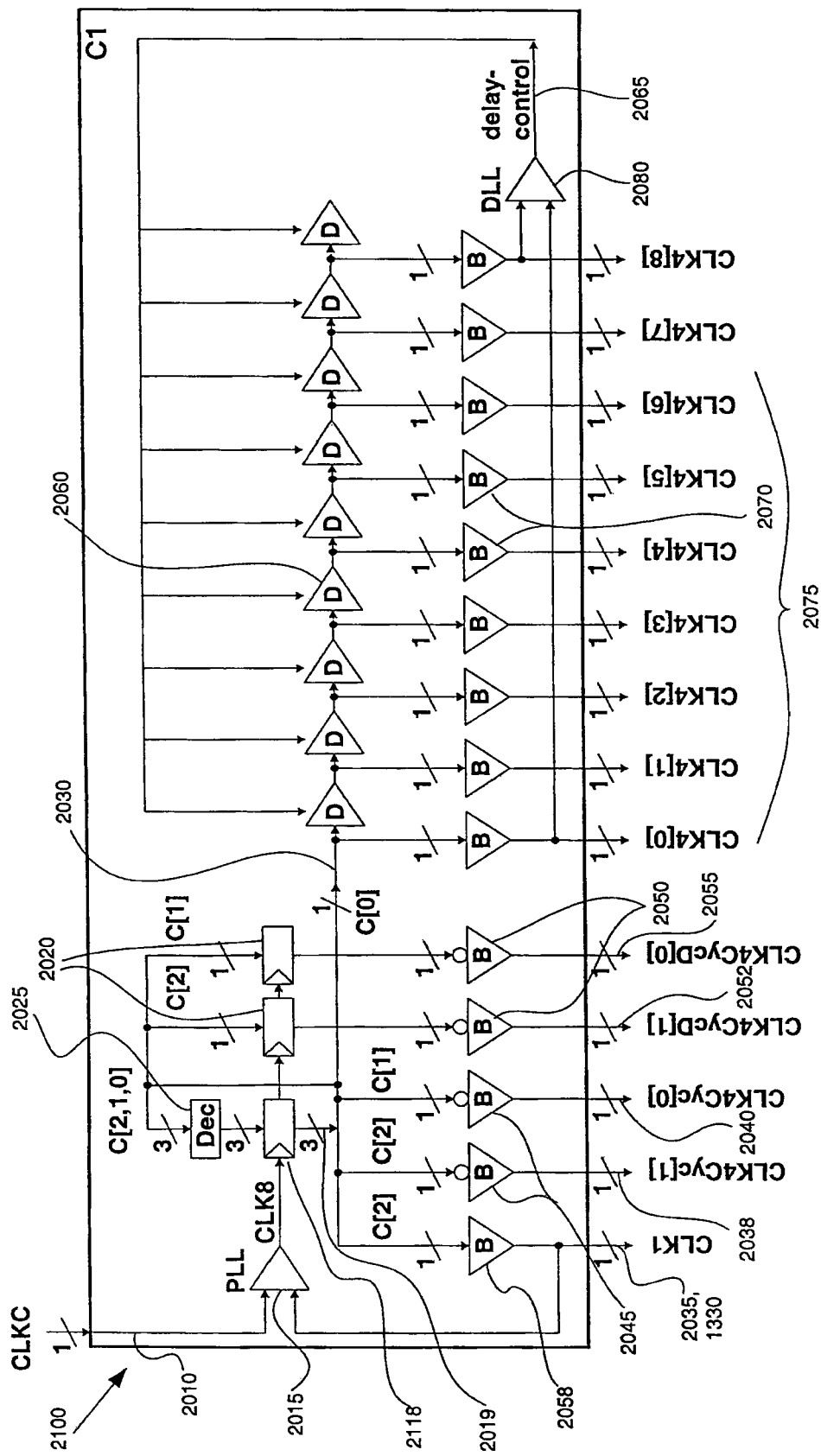
FIG. 21 is a logic diagram for block C1 of FIG. 20.

FIG. 21 shows the logic 2100 for block C1 of the controller component of FIG. 20. Block C1 is responsible for creating the derived clock signals for blocks C2 and C3 from the reference clock signal CLKC 2010.

The reference clock signal CLKC is received by a PLL circuit 2015, which produces a clock signal CLK8 that has eight times the frequency of CLKC. This increase in frequency is set by the circuitry in the feedback loop described below.

The CLK8 signal clocks a three bit register 2118, which produces a three-bit signal asserted on a bus C[2:0] 2019. The three-bit signal on the C[2:0] bus is decremented by the logic circuit "DEC" 2025 and loaded back into the register 2118 on the next CLK8 edge. Signal C[2] is the most-significant-bit (or "msb"), and signal C[0] 2030 is the least-significant-bit of the value stored in register 2118. C[2:0] cycles through its values (111, 110, 101, 100, 011, 010, 001, 000, and then back to 111), with its value being decremented with each cycle of the CLK8 signal.

Signal C[2] is buffered by buffer 2058 to produce CLK1 2035. Signal 2035 is a derived clock signal that has the same frequency as the reference clock CLKC. The PLL circuit 2015 compares the CLKC and CLK1 signals on buses 2010 and 2035, and the phase of the output signal CLK8 is adjusted until these two clock signals are essentially phase-aligned (as shown in timing diagram FIG. 22).

Signals C[2] and C[1] are complemented (i.e., inverted) and buffered by buffers 2045 to produce the CLK4Cyc[1] and CLK4Cyc[0] signals on buses 2038 and 2040, respectively. The CLK4Cyc[1] and CLK4Cyc[0] signals are used to label four CLK4 cycles within each CLK1 cycle.

Signals C[2] and C[1] are also loaded into two delay registers 2020 clocked by the CLK8 clock signal. The output of these two registers are complemented and buffered by buffers 2050 to produce the CLK4CycD[1] and CLK4CycD[0] signals on buses 2052 and 2055 respectively. The CLK4CycD[1] and CLK4CycD[0] signals 2052 and 2055 are the same as the CLK4Cyc[1] and CLK4Cyc[0] signals, delayed by one CLK8 cycle.

Note that all the buffer circuits 2045, 2050, 2058 and capacitive loads are preferably designed to give the same delay values, so that all the clock signals and clock count signals generated by CLKC (e.g., CLK1, CLK4[8:0], CLK4Cyc[1:0], and CLK4CycD[1:0]) are essentially phase-aligned as shown in FIG. 22.

The C[0] signal on bus 2030 has a frequency that is four times that of the reference clock signal CLKC 2010. The C[0] signal is the input signal to a DLL circuit. There are eight matched delay elements 2060 (labeled "D"), each of whose delay is controlled by a "delay-control" signal on line 2065. The delay-control signal could be either a set of digital signals, or it could be an analog signal, such as a voltage signal. The delay of each delay element 2060 is identical.

The output of each delay element 2060 is passed through a buffer 2070 (labeled "B") to produce the nine CLK4[8:0]

signals 2075. Here, each of these clock signals will have a frequency that is four times that of the reference clock CLKC. The two signals CLK4[0] and CLK4[8] are compared by the DLL 2080, and the value of delay-control 2065 is adjusted until the signals CLK4[0] and CLK4[8] are essentially phase aligned. The remaining CLK4[7:1] clock signals will have phase offsets that are distributed in 45° ($t_{CLK4Cycle}/8$) increments across a CLK4 cycle.

As before, all buffer circuits 2070 and capacitive loads are preferably designed to give the same delay values, so that all the CLK4[8:0] clock signals have evenly distributed phases, and the rising edge of CLK1 will be essentially aligned to every fourth edge of CLK4[0] and CLK4[8].

FIG. 22 shows the timing diagram with signals 22(a)-(o) for block C1 of the memory controller 2000. Block C1 is responsible for creating the derived clock signals for blocks C2 and C3 of system 2000 from the reference clock signal CLKC 2010.

The reference clock signal CLKC is shown in the first waveform 22(a). The cycle time of the CLKC signal is $t_{CLK1Cycle}$. The PLL circuit 2015 produces a clock signal CLK8 of 22(b) that here has eight times the frequency and whose cycle time is $t_{CLK8Cycle}$. The rising edge of the CLK8 signal is delayed from the rising edge of CLKC by $t_{PLL}$, a delay introduced by the PLL circuit to ensure that the rising edges of CLKC and CLK1 are aligned. The CLK8 signal clocks a three bit register 2118, which produces a bus C[2:0]. This bus decrements through the values {111, 110, 101, 100, 011, 010, 001, 000}, and is delayed from CLK8 by $t_{CLK-TO-OUT}$ (the clock to output delay time of the register 2118).

Signal C[2], is buffered by a buffer 2058 having an associated delay of $t_{BUFFER}$ (arrow 2220) to produce CLK1 2035. Signal 2035, depicted as 22(d), is a derived clock signal that has the same frequency as the reference clock CLKC. The PLL circuit 2015 compares the rising edges of the two CLKC and CLK1 signals (on buses 2010 and 2035), and the phase of the output signal CLK8 is adjusted until these two inputs are essentially phase-aligned. The edges aligned by PLL 2015 are shown by arrows 2210. Note that the following equation will be satisfied when the PLL is phase locked:

$$t_{PLL}+t_{CLK-TO-OUT}+t_{BUFFER}=t_{CLK8Cycle}=t_{CLK1Cycle}/8 \qquad (7)$$

Signals C[2] and C[1] are complemented and buffered to give the CLK4Cyc[1] and CLK4Cyc[0] signals on buses 2038 and 2040, respectively. Signals C[2] and C[1], depicted together as signal 22(e), are also loaded into two delay registers 2020 clocked by the CLK8 clock signal. The output of these two registers are complemented and buffered to give the CLK4CycD[1:0] signals on buses 2052 and 2055, and depicted together as signal 22(f). The CLK4CycD[1:0] signals are the same as the CLK4Cyc[1:0] signals delayed by one CLK8 cycle.

The CLK4Cyc[1:0] and CLK4CycD[1:0] signals label the four CLK4 cycles within one CLK1 cycle. The two sets of signals are needed because any of the eight CLK4[7:0] signals might be used. For example, if a clock domain is aligned with the CLK4[5:2] clock signals (depicted by the black dots identified by arrow 2240), then the CLK4Cyc[1] and CLK4Cyc[0] signals are used. If a clock domain is aligned with the CLK4[7,6,0,1] clock signals (represented by arrows 2230), then the CLK4CycD[1] and CLK4CycD[0] signals are used. This alignment with multiple clock domains gives as much margin as possible for the set and hold times for sampling the CLK4Cyc[1:0] and CLK4CycD[1:0] signal sets, and permits CLK4 cycles to be labeled consistently regardless of which CLK4[7:0] signal is used.

The C[0] signal on bus 2030 has a frequency that is four times that of the reference clock signal CLKC. The C[0] signal is the input signal to the DLL circuit containing matched delay elements 2060 and buffers 2070. The output of the eight delay elements 2060 is passed through buffers 2070 to produce the CLK4[8:0] signals on bus 2075. Each of these clock signals has a frequency that is four times that of the reference clock CLKC, as shown by signals 22(g)-(o) in FIG. 22. The two signals CLK4[0] and CLK4[8] are compared by the DLL 2080, and the delay-control value is adjusted until the two signals are essentially phase aligned. The DLL circuit aligns the edges depicted by arrows 2250. As a result, the CLK4[7:1] clock signals have phase offsets that are distributed in 45° increments ($t_{CLK4Cycle}/8$) across a CLK4 cycle.

The clock signals CLK4[7:0], signals 22(g)-(n), are used to create the clocks needed for transmitting and receiving in the C3 block of system 2000 for each slice of the memory components. Any slice may need any of these phase-shifted clock signals. Further, the controller's calibration circuitry for a particular slice may select a different clock signal during system operation, if the timing parameters of the delay paths change because of temperature and supply voltage variations.

Figure 23:
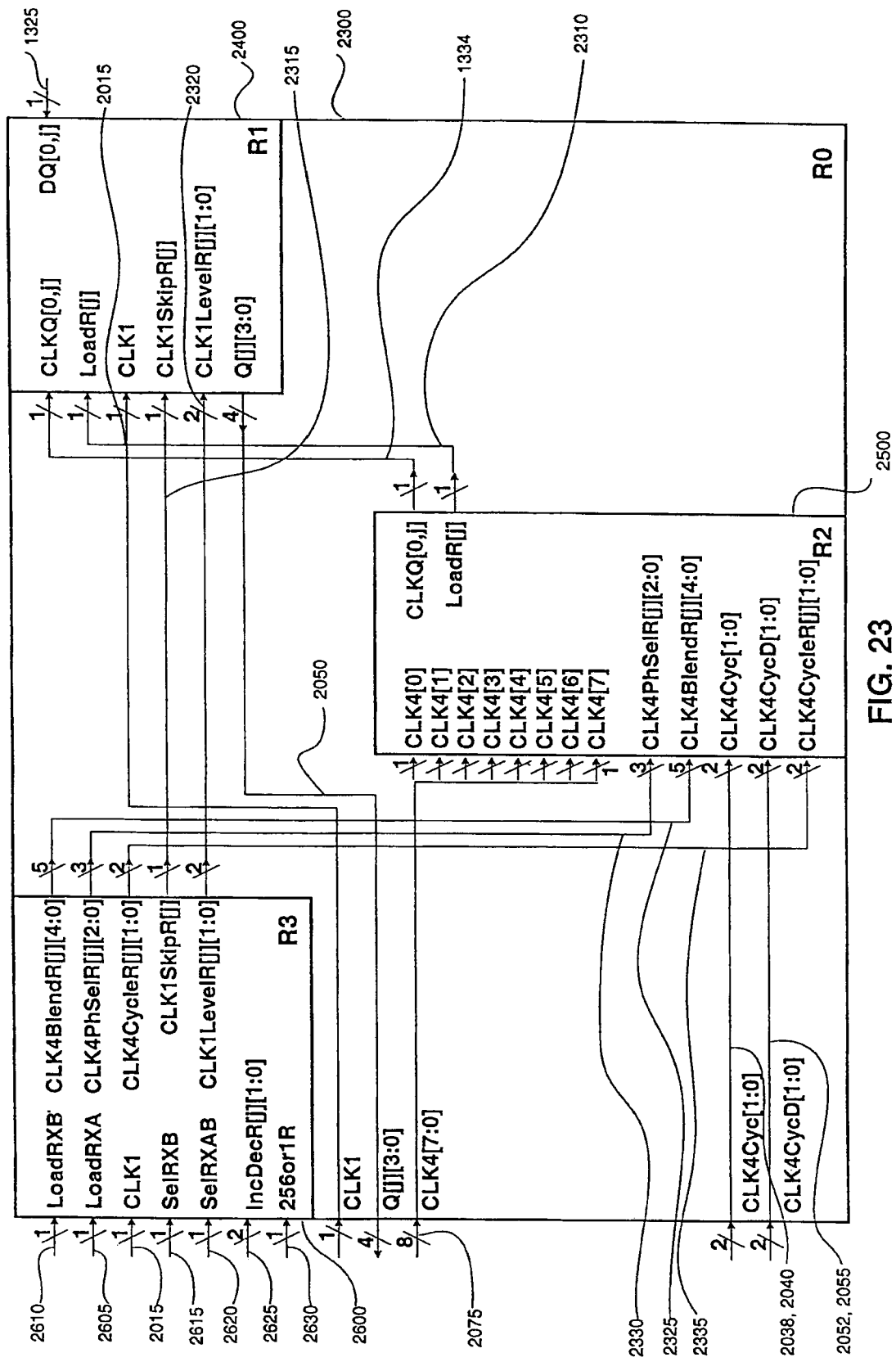
FIG. 23 is a block diagram for the controller module responsible for receiving read data and comprising three blocks R1-R3, and interconnecting buses between the blocks.

FIG. 23 shows the logic for the controller block 2300 of system 2000. Block 2300, or R0, is part of block C3 (along with block 3000, or T0). Block 2300 is responsible for receiving read data from the memory components and includes three blocks: R1 2400, R2 2500, and R3 2600.

Block R1 connects to the DQ[0,j] bus 1325, which connects to the memory components of the memory system. Block R1 receives the CLKQ[0,j] signal (line 1334) and LoadR[j] signal (line 2310) from block R2. Block R1 receives CLK1SkipR[j] (line 2315) and CLK1LevelR[j][1:0] (line 2320) from block R3 and receives CLK1 2015 from outside this controller block 2300 (from block C1 in FIG. 20). Block R1 returns read data signals $Q_C$[j][3:0] to other blocks in the controller.

Block R2 supplies the CLKQ[0,j] and LoadR[j] signals to block R1. Block R2 receives CLK4BlendR[j][4:0] (line 2325), CLK4PhSelR[j][2:0] (line 2330) and CLK4CycleR[j][1:0] (line 2335) from block R3. Block R2 also receives CLK4[7:0], CLK4Cyc[1:0] and CLK4CycD[1:0] from outside of block R0 (from block C1 in FIG. 20).

Block R3 supplies the CLK4BlendR[j][4:0], CLK4PhSelR[j][2:0] and CLK4CycleR[j][1:0] signals to block R2. Block R3 supplies CLK1SkipR[j] and CLK1LevelR[j][1:0] to block R1. It receives LoadRXA, LoadRXB, CLK1, SelRXB, SelRXAB, IncDecR[j], and 256or1R signals from outside of block R0 (either block C1 in FIG. 20 or other blocks in the controller).

Figure 24:
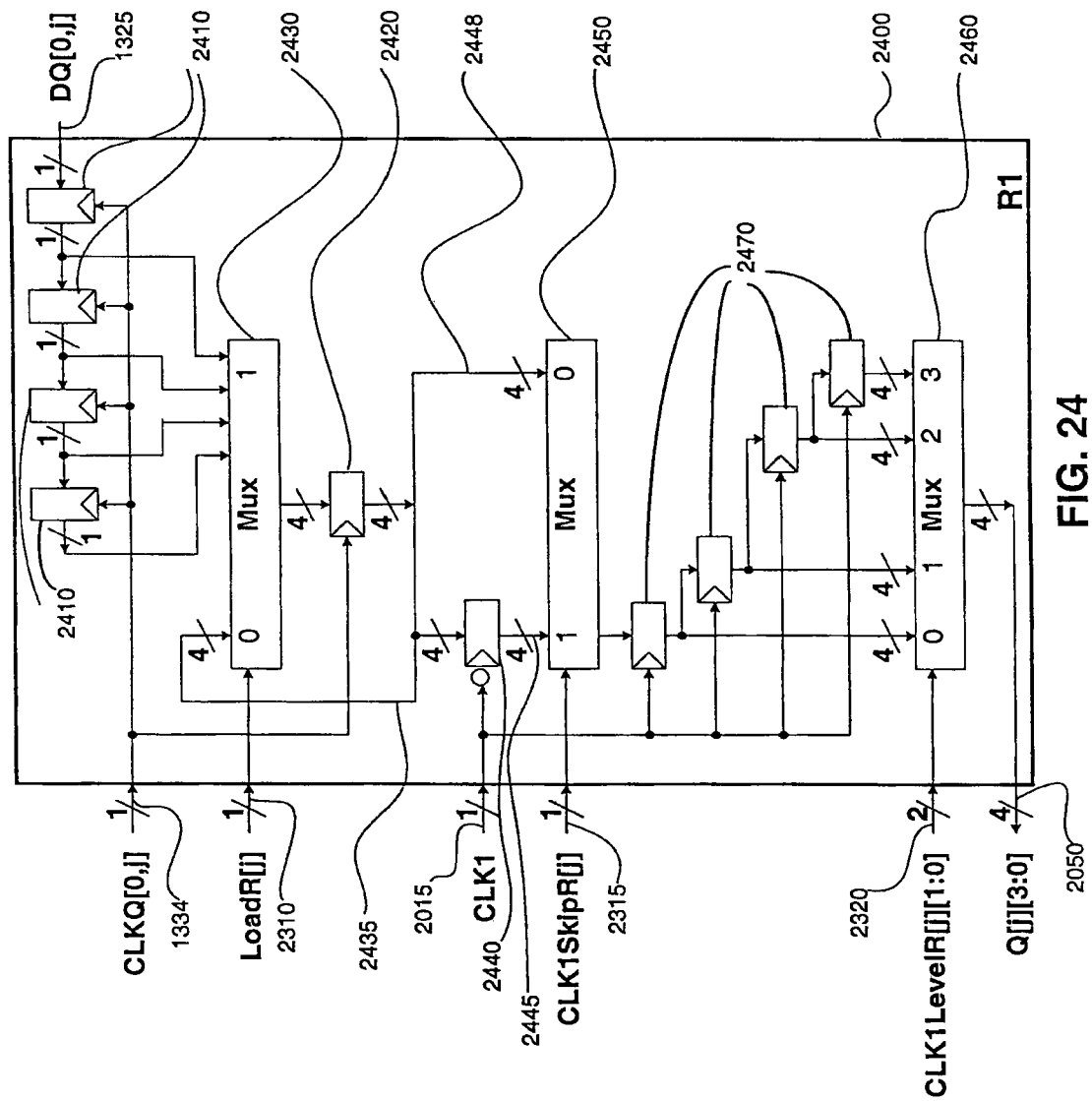
FIG. 24 is a logic diagram for a block R1 of a controller module for receiving read data from a memory and inserting a programmable delay.

FIG. 24 shows the logic for the controller block R1 2400 of system 2300. This block is responsible for receiving read data from the memory components and inserting a programmable delay.

The LoadR[j] signal 2310 is asserted on one of every four rising edges of CLKQ[0,j]. The correct edge is selected in the R1 block. During a read transfer, four one-bit registers 2410 connected serially to the DQ[0,j] bus 1325 continuously shift in the read data that is present on the DQ[0,j] bus 1325 with each rising edge of CLKQ[0,j].

When the LoadR[j] signal is asserted, the most recent shifted-in read data is loaded in parallel to the 4-bit register 2420. When the Load signal is deasserted, the contents of this register are recirculated through the multiplexer 2430 along bus 2435 and held for four CLKQ[0,j] cycles (or one CLK1 cycle).

The Q_C[j][3:0] signal on line 2050 and the CLK1 signal on 2015 represent two clock domains that may have an arbitrary phase alignment with respect to each other, but they will be frequency-locked, here in a 4:1 ratio. The serial-to-parallel conversion controlled by LoadR[j] 2310 makes the frequencies of the two clock domains identical. Therefore, either the rising edge of CLK1 or the falling edge of CLK1 will be correctly positioned to sample the parallel data in the four-bit register 2440. The CLK1SkipR[j] signal (generated in block R3, shown in more detail in FIG. 26) selects between the two cases. When it is one, the path 2445 with a negative-CLK1-edge-triggered register is enabled, otherwise the parallel register is used directly via path 2448. In either case, a positive-CLK1-edge-triggered register samples the output of the skip multiplexer 2450 and stores the four-bit value in a first register 2470.

The final stage involves inserting a delay of zero through three CLK1 cycles. This is easily accomplished with a four-to-one multiplexer 2460, and three additional four-bit registers 2470. The CLK1LevelR[j][1:0] bus 2320 is generated in block R3, and selects which of the four registers 2470 is to be enabled (i.e., it selects which register's output is to be passed by the multiplexer 2460 onto the Q_C[j][3:0] bus 2050).

Figure 25:
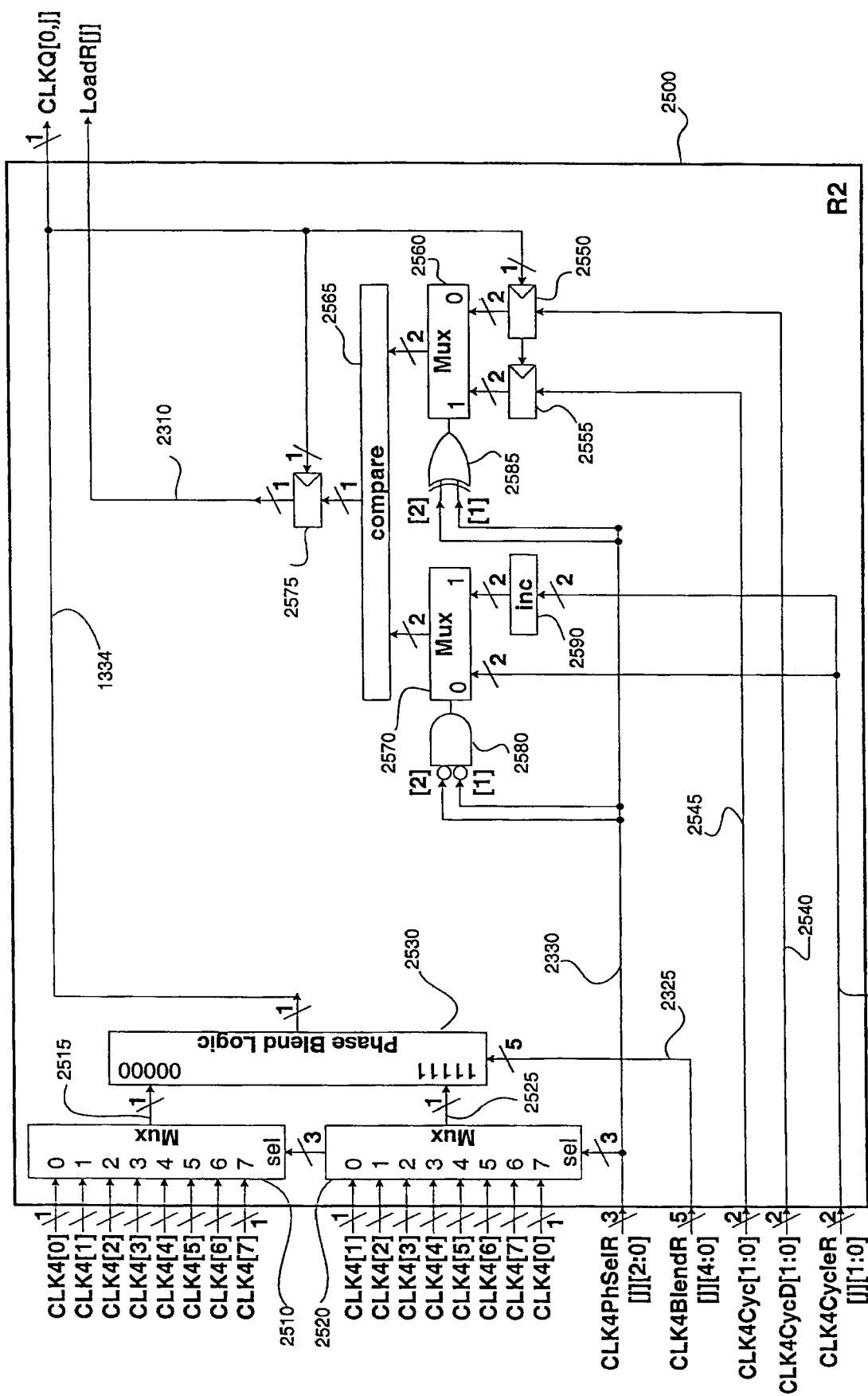
FIG. 25 is logic diagram for a block R2 of a controller module for creating a clock for receiving read data.

FIG. 25 shows the logic for the controller block R2 2500. This block is responsible for creating the CLKQ[0,j] clock signal needed for receiving the read data from the memory components, and for creating the LoadR[j] signal for performing serial-to-parallel conversion in 2400.

Block R2 supplies the CLKQ[0,j] and LoadR[j] signals to block R1. Block R2 receives CLK4BlendR[j][4:0] (line 2325), CLK4PhSelR[j][2:0] (line 2330) and CLK4CycleR[j][1:0] (line 2335) from block R3. Block R2 also receives CLK4[7:0], CLK4Cyc[1:0] and CLK4CycD[1:0] from outside of block R0 (from block C1 in FIG. 20).

CLK4PhSelR[j][2:0] on bus 2330 selects which of the eight CLK4[7:0] clock signals will be used as the lower limit for a phase blending circuit. The next higher clock signal is automatically selected by multiplexer 2520 for blending with the lower limit clock signal, which is selected by multiplexer 2510. For example, if signal 2330 is "010", then the clock signal used for the lower limit is CLK4[2] and the clock signal used for the upper limit is CLK4[3]. These are passed by the two eight-to-one multiplexers 2510 and 2520 to the Phase Blend Logic block 2530 via buses 2515 and 2525.

The CLK4BlendR[j][4:0] signal on bus 2325 selects how to interpolate between the lower and upper clock signals on buses 2515 and 2525. If CLK4Blend[j][4:0] is equal to B, then the interpolated phase is at a point B/32 of the way between the lower and upper phases. If B is zero, then it is at the lower limit (in which case the output of the Phase Blend Logic 2530 is derived solely from the clock signal on bus 2515), and if B is 31, then it is almost at the upper limit. The output of the Phase Blend Logic 2530 is CLKQ[0,j], the clock signal on bus 1334 used to sample the read data from the memory.

The Phase Blend Logic 2530 uses well known circuitry, which is therefore not described in this document. However, the ability to smoothly interpolate between two clock signals that have relatively long slew rates (i.e., the rise/fall time of the two signals is greater than the phase difference between the two signals) is important in that it makes the blending of signals to form a combined signal 1334 and implementation of dynamic mesochronous systems easier.

The remaining signals and logic in block R2 generate the LoadR[j] signal 2310, which indicates when the four read data bits have been serially shifted into bit registers 2410 (FIG. 24) and are ready to be clocked into the parallel register 2420 (FIG. 24). The CLK4CycleR[j][1:0] signal, generated by block R3, picks one of the four possible load points. The LoadR[j] signal on line 2310 is generated by comparing CLK4CycleR[j][1:0] to CLK4Cyc[1:0] using compare logic 2565. CLK4Cyc[1:0] labels the four CLK4 cycles in each CLK1 cycle. However, this comparison must be done carefully, since the LoadR[j] signal 2310 is used in the CLKQ[0,j] clock domain, and the CLK4Cyc[1:0] signals are generated in the CLK1 domain.

The CLK4CycD[1:0] signals 2540 are delayed from the CLK4Cyc[1:0] signals by one CLK8 cycle, so there is always a valid bus to use, no matter what value of the CLK4PhSelR[j][2:0] signal is used. The following table summarizes the four cases of CLK4PhSelR[j][2:0] that were originally shown in the timing diagram of FIG. 22:

| CLK4PhSelR[j][2:0] | CLK4CycleR[j][1:0] | CLK4Cyc[1:0] or CLK4CycD[1:0] |
|---|---|---|
| 00x | Incremented | CLK4CycD[1:0] |
| 01x | not incremented | CLK4Cyc[1:0] |
| 10x | not incremented | CLK4Cyc[1:0] |
| 11x | not incremented | CLK4CycD[1:0] |

The compare logic 2565 generates a positive output (e.g., a "1") when its two inputs are equal. The output of the compare logic 2565 is sampled by a CLKQ[0,j] register 2575, the output of which is the LoadR[j] signal, and is asserted in one of every four CLKQ[0,j] cycles.

More specifically, AND gate 2580 and multiplexer 2570 determine whether a first input to the compare logic 2565 is CLK4CycleR[j][1:0] or is that value incremented by one by increment circuit 2590. XOR gate 2585 and multiplexer 2560 determine whether the second input to the compare logic 2565 is CLK4Cyc[1:0] or CLK4CycD[1:0], each of which is delayed by one CLKQ clock cycle by registers 2550 and 2555.

Figure 26:
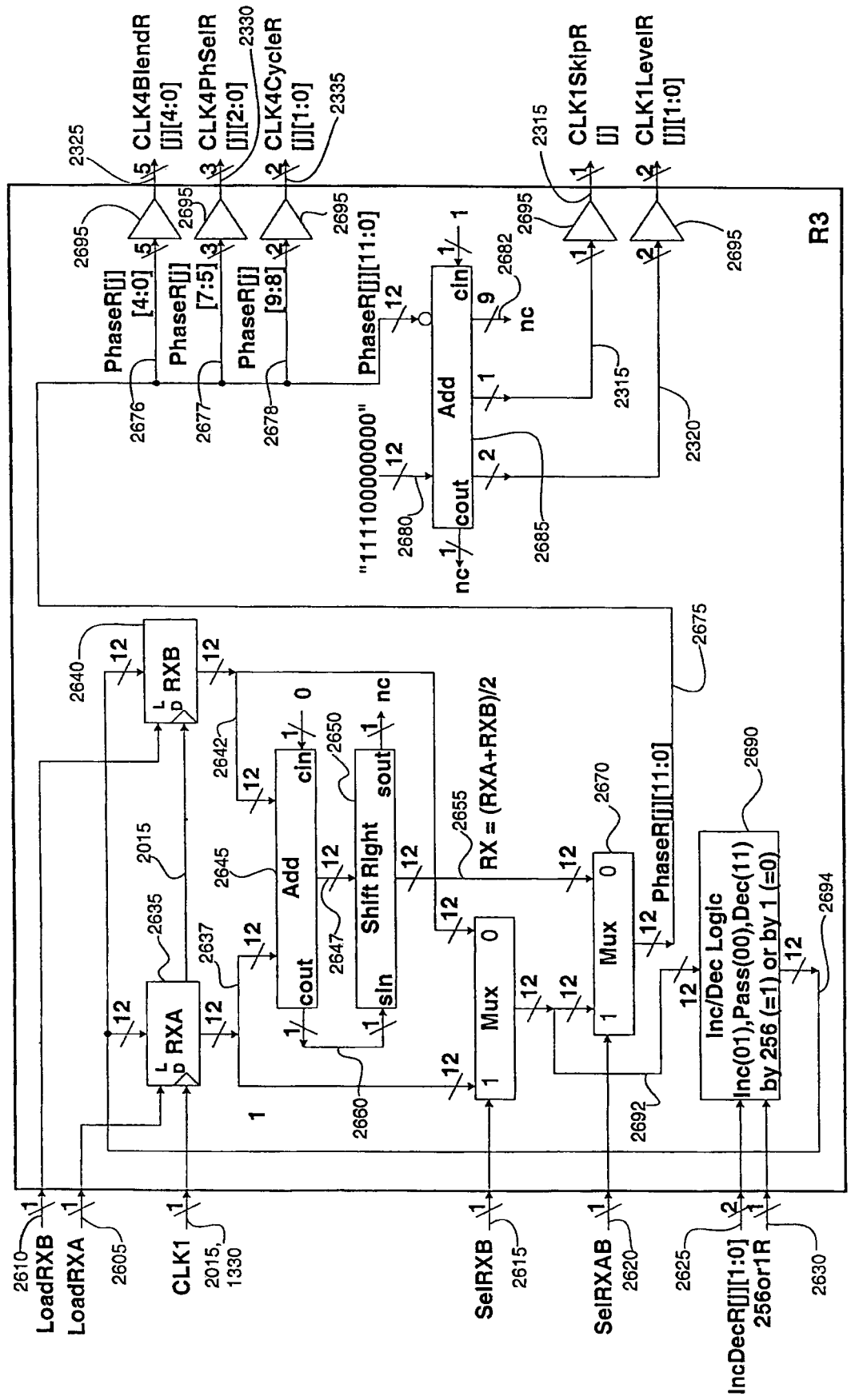
FIG. 26 is logic diagram for a block R3 of a controller module for generating the value of a clock phase for receiving read data.

FIG. 26 shows the logic 2600 for the controller block R3 in FIG. 23. Block R3 2600 is responsible for generating the value of clock phase PhaseR[j][11:0] for receiving the read data.

Logic R3 2600 supplies the CLK4BlendR[j][4:0] (line 2325), CLK4PhSelR[j][2:0] (line 2330) and CLK4CycleR[j][1:0] (line 2335) to block R2. Logic R3 2600 also supplies CLK1SkipR[j] on line 2315 and CLK1LevelR[j][1:0] on line 2320 to block R1 2400. Logic 2600 further receives the LoadRXA 2605, LoadRXB 2610, CLK1, SelRXB 2615, SelRXAB 2620, IncDecR[j] 2625, and 256or1R signals 2630 from outside of block 2300 (either block C1 or other blocks in the controller).

There are two 12-bit registers (RXA 2635 and RXB 2640) in block 2600. These 12-bit registers digitally store the phase value of CLKQ[0,j] that will sample read data at the earliest and latest part of the data window for each bit. During normal operation, these two values on register output lines 2637 and 2642 are added by the Add block 2645, and the sum on line 2647 shifted right by one place (to divide by two) by shifter 2650, producing a 12 bit value that is the average of the two values (RXA+RXB)/2. Note that the carry-out 2660 of the Add block 2645 is used as the shift-in of the Shift Right block 2650. In effect, the two registers RXA 2635 and RXB 2640 together digitally store a receive phase value for a respective slice.

The value (RXA+RXB)/2 is the appropriate value for sampling the read data with the maximum possible timing margin in both directions. Other methods of generating an intermediate value are possible. This average value is passed through multiplexer 2670 to become PhaseR[j][11:0] on line 2675. The PhaseR[j][4:0], PhaseR[j][7:5] and PhaseR[j][9:8] signals on lines 2676, 2677 and 2678 are extracted from the PhaseR[j][11:0] signal on 2675, and after buffering by buffers 2695 these extracted signals become the CLK4BlendR[j][4:0], CLK4BlendR[j][7:5], and CLK4BlendR[j][9:8] signals on lines 2325, 2330 and 2335.

The upper two bits of PhaseR[j][11:0] represents the number of CLK1 cycles from the $t_{OFFSETR}$ point. The fields CLK1SkipR[j] 2315 and CLK1LevelR[j][1:0] 2320 represent the delay that must be added to the total delay of the read data, which is $t_{RANGER}$ no matter what value PhaseR[j][11:0] contains. Thus, PhaseR[j][11:0] is subtracted from $2^{12}$-$2^8$. The factor of "$2^{12}$" represents the maximum value of $t_{RANGER}$. The factor of "$2^8$" is needed to give the proper skip value—this will be discussed further with FIG. 27.

The circuitry adds "111100000000" on line 2680 to the complement of PhaseR[j][11:0] and asserts carry-in to the adder 2685. The low nine bits of the result are discarded on line 2682, the next bit is buffered to generate CLK1SkipR[j] and the upper two bits are buffered to generate CLK1LevelR[j][1:0] 2320.

During a calibration operation, the multiplexer 2670 that passes the (RXA+RXB)/2 value instead selects either the RXA register 2635 or the RXB register 2640 directly, as determined by the SelRXAB signal on 2620 and the SelRXB signal on 2615. Placing the value in the selected register (RXA or RXB) on the PhaseR[j][11:0] bus 2675 causes the receive logic to set the sampling clock to one side or the other of the data window for read data. Once the resulting sampling clock CLKQ[0,j] on 1334 (FIG. 25) is stable, the read data is evaluated, and the RXA or RXB value is either incremented, decremented, or not changed by logic 2690 and output on line 2694. An increment/decrement value of "1" is used for calibrating the CLKQ[0,j] clock. An increment/decrement value of "256" is used by logic 2690 when the sampling point of the RQ[i,j] bus 1352 in the memory system component 1310 is changed (because the memory system component 1310 will change the sampling point of the bus 1352 in increments of the CLK4 clock cycle). The RQ[i,j] bus sampling point and its calibration process was described above with reference to FIG. 18.

Figure 27:
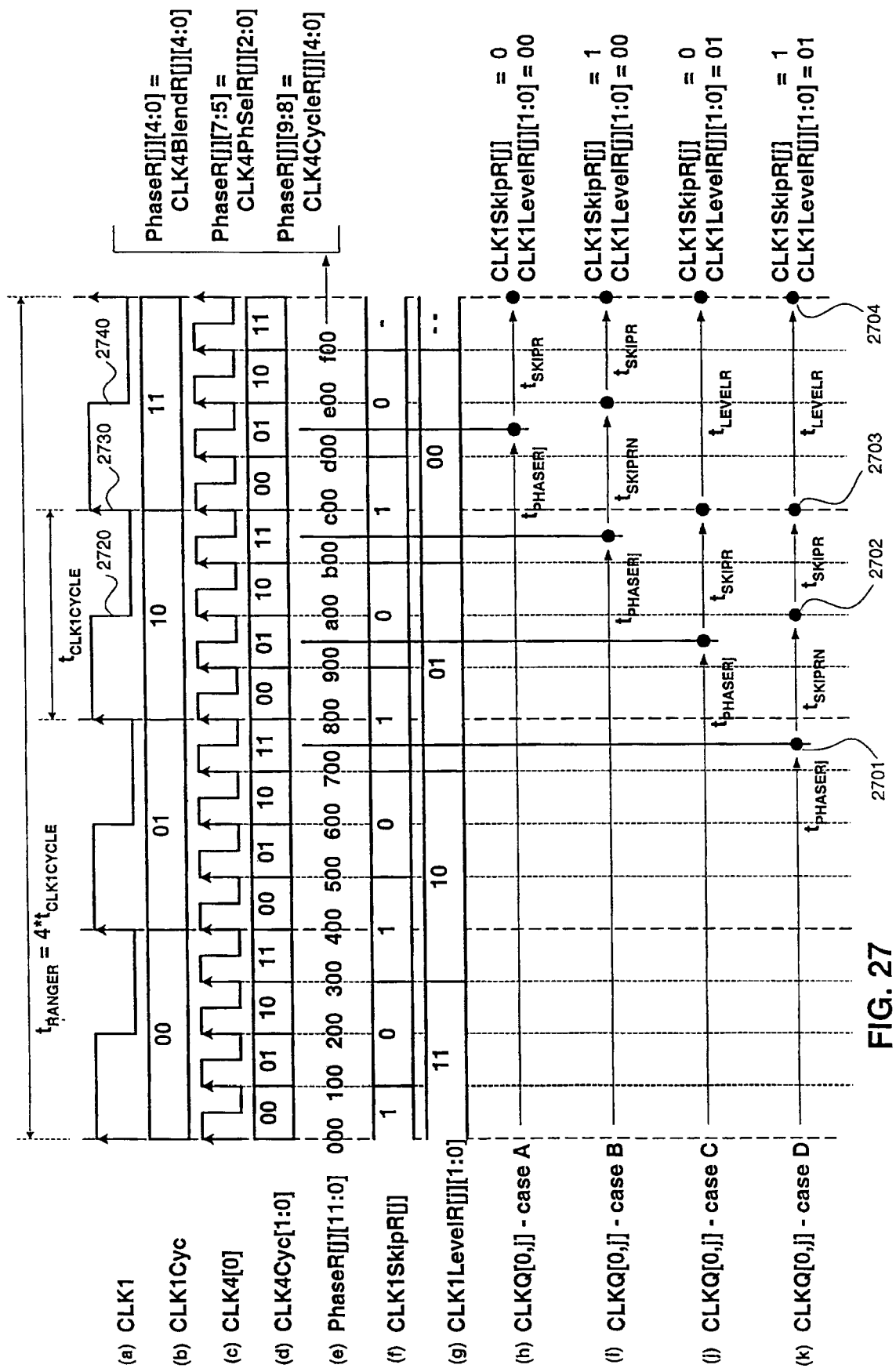
FIG. 27 shows a sequence of receive timing signals illustrating four cases of alignment of a clock signal within a time interval and the generation of bus signals.

FIG. 27 shows receive timing signals 27(*a*)-(*k*) that illustrates four cases of alignment of the CLKQ[0,j] clock signal 1334 within the $t_{RANGER}$ interval. This diagram illustrates how the following five buses are generated: CLK4BlendR[j][4:0] 2325, CLK4PhSelR[j][2:0] 2330, CLK4CycleR[j][1:0] 2335, CLK1SkipR[j] 2315, and CLK1LevelR[j][1:0] 2320. The value of PhaseR[j][11:0] adjusts the values of the signals on these buses, and the value of $t_{PHASER}$, which controls the position of CLKQ[0,j] within the $t_{RANGER}$ interval, and also adjusts the compensating delays so the overall delay of the read data is ($t_{OFFSETR}$+$t_{RANGER}$) regardless of the position of CLKQ[0,j].

The first waveform shows the CLK1 clock signal, 27(*a*), over $t_{RANGER}$, and the second waveform 27(*b*) shows the labeling for the four CLK1 cycles (i.e., 00, 01, 10, 11) that comprise the $t_{RANGER}$ interval (note there is no bus labeled "CLK1Cyc"; this is shown to make the diagram clearer).

The third waveform, 27(*c*), shows the CLK4[0] clock signal, and waveform 27(*d*) shows the labeling for the four CLK4 cycles that comprise each CLK1 cycle. The fifth waveform, 27(*e*), shows the numerical values of the PhaseR[j][11:0] bus 2675 as a three digit hexadecimal number. The most-significant digit includes two bits for the CLK1Cyc value, and two bits for the CLK4Cyc value.

The right side of the diagram 27 shows how three buses are extracted from the PhaseR[j][9:0] bus: the CLK4BlendR[j][4:0] 2325, CLK4PhSelR[j][2:0] 2330 and CLK4CycleR[j][1:0] signals 2335 are buffered versions of the PhaseR[j][4:0] 2676, PhaseR[j][7:5] 2677, and PhaseR[j][9:8] fields 2678, respectively.

The sixth and seventh waveforms, 27(*f*) and (*g*), show graphically how the CLK1SkipR[j] and CLK1LevelR[j][1:0] signals on buses 2315 and 2320, respectively, vary as a function of the PhaseR[j][11:0] value. It is noted that the CLK1SkipR[j] and CLK1LevelR[j][1:0] signals generate a compensating delay for the read data, so they increase from right to left in FIG. 27.

In FIG. 27(*k*), or case D, the PhaseR[j][11:0] value is $780_{16}$ (2701). At point 2701 of case D, the read data has been sampled and is available in a parallel register (e.g., 2430, FIG. 24) in the CLKQ[0,j] clock domain, and is ready to be transferred to the CLK1 domain. The read data is sampled by the next falling edge 2720 of CLK1 1330 at time $a00_{16}$, then is sampled by the next rising edge 2730 of CLK1 at time $c00_{16}$, and finally is sampled by the next rising edge 2740 of CLK1 at time $100016$. The three intervals labeled "$t_{SKIPRN}$", "$t_{SKIPR}$", and "$t_{LEVELR}$" connect the four sampling points 2701-2704. The CLK1SkipR[j] value in waveform 27(*k*) is "1" because a "$t_{SKIPRN}$" interval is used. The CLK1LevelR[j][1:0] value in waveform 27(*k*) is "01" because one "$t_{LEVELR}$" interval is used.

The other cases are analyzed in a similar fashion. In this example, the size of the $t_{RANGER}$ interval has been chosen to be four CLK1 cycles. It could be easily extended (or shrunk) using the utilizing the methods that have been described in this example.

Note that the upper limit of the $t_{RANGER}$ interval is actually 3¾ CLK1 cycles because of the method chosen to align the CLK1SkipR[j] and CLK1LevelR[j][1:0] values to the $t_{PHASER}$ values. The loss of the ¼ CLK1 cycle of range is not critical, and the method shown gives the best possible margin for transferring the read data from the CLKQ[0,j] clock domain to the CLK1 domain. Other alignment alternatives are possible. The $t_{RANGER}$ could be easily extended by adding more bits to PhaseR[j][11:0] and by adding more Level registers 2470 in FIG. 24.

Figure 28:
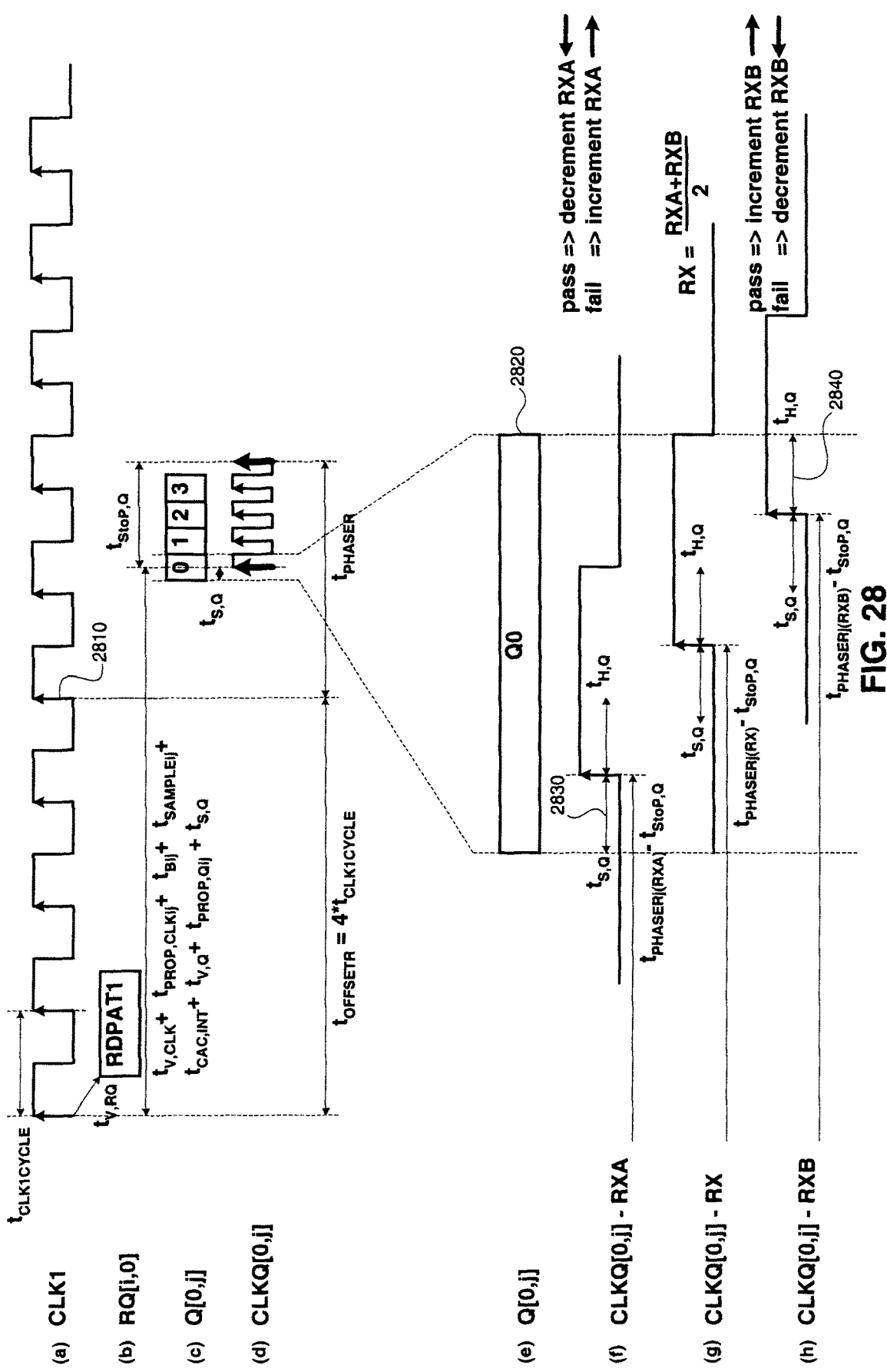
FIG. 28 shows a sequence of timing signals that illustrate how timing values are related and maintained in RXA and RXB registers.

FIG. 28 shows timing signals 28(*a*)-(*h*) that illustrates how the timing values are maintained in the RXA and RXB registers 2635 and 2640, respectively. Waveform 28(*a*) shows the CLK1 signal 1330 in the controller 1305. The second waveform, 28(*b*), shows the RQ[i,0] bus 1315 issuing a RDPAT1 command. Signal 28(*c*) shows the pattern data Q[0,j] returned to the controller. The fourth signal, 28(*d*), shows the internal clock signal CLKQ[0,j] that samples the data in the controller. The position of the CLKQ[0,j] rising edge 2810 is centered on the first bit of pattern data at $t_{OFFSETR}$+$t_{PHASERj}$-$t_{StoP,Q}$, where:

$$t_{V,CLK}+t_{PROP,CLKij}+t_{Bij}+t_{SAMPLEij}+t_{CAC,INT}+t_{V,Q}+ \\ t_{PROP,Qij}+t_{S,Q}=t_{OFFSETR}+t_{PHASERj}-t_{StoP,Q} \qquad (8)$$

See FIG. 14A for a graphical representation of this equation. Most of the terms on the left side of Eqn. (8) can change as temperature and supply voltage vary during system operation. The rate of change will be relatively slow, however, so that periodic calibration operations (separated by periods of normal memory operations) can keep the $t_{PHASERj}$ value centered on the read data bits.

As previously discussed, the calibration logic 1355 (see FIGS. 13 and 26) maintains two separate register values (RXA and RXB) which track the left and right side of the read data window 2820. In the lower part of FIG. 28, the pattern data Q[0,j] and the CLKQ[0,j] rising edge are shown with an expanded scale. The CLKQ[0,j] rising edge is also shown at three different positions: $t_{PHASERj(RXA)}$, 28(f), $t_{PHASERj(RX)}$, 28(g), and $t_{PHASERj(RXB)}$, 28(h). The three positions result from setting the PhaseR[j][11:0] signal to the RXA[11:0], RX[11:0] or RXB[11:0] value in logic 2600, respectively. Here, RX represents the average value of RXA and RXB.

The RXA value shown in 28(f) will hover about the point at which $(t_{PHASERj(RXA)} - t_{StoP,Q})$ trails the start of the Q[0,j] [0] bit by $t_{S,Q}$ 2830. If the sampled pattern data is correct (pass), the RXA value is decremented, and if the data is incorrect (fail), the RXA value is incremented.

In a similar fashion, the RXB value shown in 28(h) will hover about the point at which $(t_{PHASERj(RXB)} - t_{StoP,Q})$ precedes the end of the Q[0,j] [0] bit by $t_{H,Q}$ 2840. If the sampled pattern data is correct (pass), the RXB value is incremented, and if the data is incorrect (fail), the RXA value is decremented.

In both cases, a pass will cause the timing to change in the direction that makes it harder to pass (reducing the effective set or hold time). A fail will cause the timing to change in the direction that makes it easier to pass (increasing the effective set or hold time). In the steady state, the RXA and RXB values will alternate between the two points that separate the pass and fail regions. This behavior is also called "dithering". In a preferred embodiment, calibration of RXA stops when the adjustments to RXA change sign (decrement and then increment, or vice versa), and similarly calibration of RXB stops when that value begins to dither. Alternatively, the RXA and RXB values can be allowed to dither, since the average RX value will still remain well inside the pass region.

Figure 29:
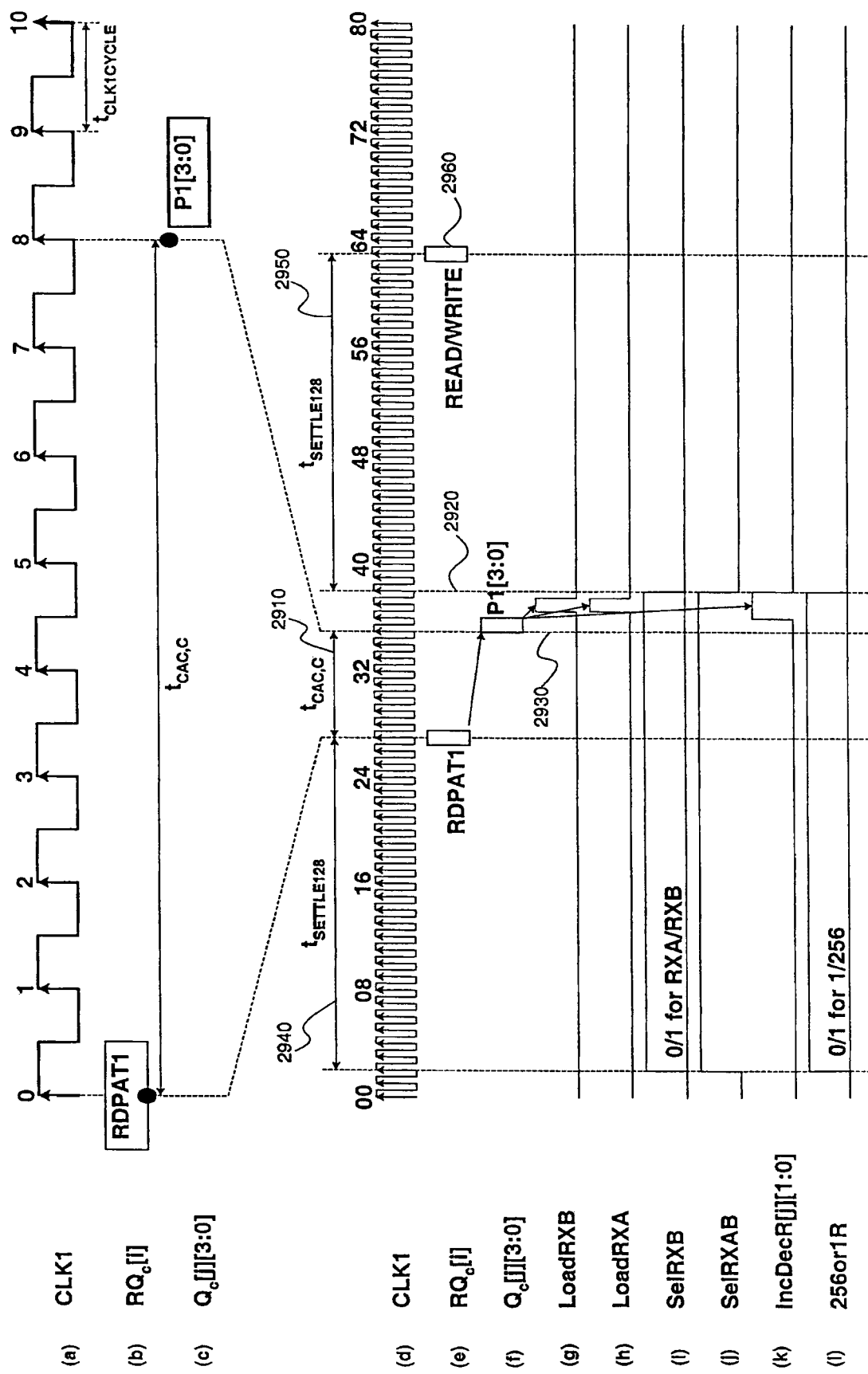
FIG. 29 shows a sequence of receive timing signals that illustrate a calibration sequence for transferring bus signals.

FIG. 29 shows receive timing signals 29(a)-(l) that illustrate a complete sequence that may be followed for a calibration operation. Waveforms 28(a)-(c) are shown in an expanded view of the pattern read transaction. The first waveform shows the CLK1 signal in the controller. The second waveform, 29(b), shows the $RQ_C[i]$ bus in the controller (see FIG. 20). The third waveform shows the pattern data $Q_C[j][3:0]$ in the controller (see FIG. 20). The time interval between the CLK1 edges associated with the RDPAT1 command and the returned data P1[3:0] is labeled $t_{CAC,C}$. This value is the same for all slices and all ranks in the memory system of the present invention, and is equivalent to $(t_{OFFSETR} + t_{RANGER})$ or eight CLK1 cycles for this system example.

The eight cycle pattern access is one step in the calibration operation shown in waveform 29(d). The calibration sequence for this example takes 61 CLK1 cycles (from 02 to 63). Before the sequence begins, all ongoing transfers to or from memory must be allowed to complete. At the beginning of the sequence, the SelRXB, SelRXAB, and 256or1R signals 29(i), 29(j) and 29(l), respectively, are set to static values that are held through edge 2920. The following table summarizes the values to which these signals are set:

| Case | SelRXB | SelRXAB | 256or1R |
|---|---|---|---|
| RXA calibrate | 0 | 1 | 0 |
| RXB calibrate | 1 | 1 | 0 |

Changing the value of the SelRXAB from 0 to 1 means that a time interval $t_{SETTLE128}$ (25 CLK1 cycles in this example) 2940 must elapse before any pattern commands are issued. This allows the new value of PhaseR[j][11:0] to settle in the phase selection and phase blending logic of the R2 block 2500 (FIG. 25). The pattern data read from the memory component is available in the controller after rising edge 35, shown as edge 2930 in FIG. 29. This pattern data is compared to the expected value, and a pass or fail determination is made if it matches or does not match, respectively. The IncDecR[j] signal 2625 is asserted or deasserted, as a result, and the LoadRXA 2605 or LoadRXB 2610 signal is pulsed for one CLK1 cycle to save the incremented or decremented value, as shown in waveforms 29(g), 29(h) and 29(k). The following table summarizes the values to which these signals are set:

| Case | IncDecR[j][1:0] | LoadRXA | LoadRXB |
|---|---|---|---|
| RXA calibrate (pass) | 11 | 1 (pulse) | 0 |
| RXA calibrate (fail) | 01 | 1 (pulse) | 0 |
| RXB calibrate (pass) | 01 | 0 | 1 (pulse) |
| RXB calibrate (fail) | 11 | 0 | 1 (pulse) |

At rising edge 38 (2920), all signals 29(g)-(l) can be returned to zero. Changing the value of the SelRXAB from 1 to 0 means that another time interval $t_{SETTLE128}$ 2950 must elapse before any read or write commands 2960 are issued.

Note that the calibration sequence may be performed on all slices of the memory system in parallel. All of the control signals can be shared between the slices except for IncDecR [j], which depends upon the pass/fail results for the pattern data for that slice.

In preferred embodiments, the calibration sequence is performed for RXA and RXB at periodic intervals that are spaced closely enough to ensure that timing adjustments can keep up with timing changes due to, for example, temperature and supply voltage variations.

When the sampling point of the RQ[i,j] bus 1352 by the CLKB[i,j] clock signal 1347 is changed (as in FIG. 18), the sampling point of the CLKQ[0,j] receive clock 1334 in the controller must be adjusted. This is accomplished by an update sequence for the RXA and RXB register values. This update sequence is similar to the calibration sequence of FIG. 29, but with some simplifications. Preferably, this update sequence is performed immediately after the RQ sampling point was updated.

When updating the RXA and RXB registers to compensate for a change in the sampling point of the RQ[i,j] bus, the SelRXB, SelRXAB, and 256or1R signals are set to static values that are held through rising edge 38 (edge 2920). The PhaseR[j][11:0] is not changed (SelRXAB remains low), so that the pattern transfer does not need to wait for circuitry to settle as in the calibration sequence. The following table summarizes the values to which these signals are set:

| Case | SelRXB | SelRXAB | 256or1R |
|---|---|---|---|
| RXA update | 0 | 0 | 1 |
| RXB update | 1 | 0 | 1 |

The reason that an increment/decrement value of 256 is used instead of 1 is because when the sample point of the RQ[i,j] bus is changed, it will be by {+1,0,−1} CLK4 cycles. A CLK4 cycle corresponds to the value of 256 in the range of PhaseR[j][11:0]. When the sample point changes by a CLK4 cycle, the data that is received in the Q[j][3:0] bus 2050 will shift by one bit to the right or left. By comparing the retrieved pattern data to the expected data, it can be determined whether the RXA and RXB values need to be increased or decreased by 256, or left the same. The following table summarizes the values to which these signals are set:

| Case | IncDecR[j][1:0] | LoadRXA | LoadRXB |
|---|---|---|---|
| RXA update (shifted right) | 11 | 1 (pulse) | 0 |
| RXA update (pass) | 00 | 1 (pulse) | 0 |
| RXA update (shifted left) | 01 | 1 (pulse) | 0 |
| RXB update (shifted right) | 11 | 0 | 1 (pulse) |
| RXB update (pass) | 00 | 0 | 1 (pulse) |
| RXB update (shifted left) | 01 | 0 | 1 (pulse) |

Both RXA and RXB can be updated successively using the same pattern read transfer. Note that the update sequence may be performed on all slices in parallel. All of the control signals can be shared between the slices except for IncDecR [j], which depends upon the pass/fail results for the pattern data for that slice.

Once the update sequence has completed, a time interval $t_{SETTLE256}$ (e.g., 50 CLK1 cycles) must elapse before any read commands are issued. This allows the new value of PhaseR[j][11:0] to settle in the phase selection and phase blending logic of the R2 block (FIG. 25).

Before the RXA and RXB register values can go through the calibration and update sequences just described, they must be initialized to appropriate starting values. This can be done relatively easily with the circuitry that is already in place.

The initialization sequence begins by setting the RXA register to the minimum value of $000_{16}$ and by setting the RXB register to the maximum value $fff_6$. These will both be failing values, but when the calibration sequence is applied to them, both values will move in the proper direction (RXA will increment and RXB will decrement).

Thus, the initialization procedure involves performing the RXA calibration repeatedly until it passes. Then the RXB calibration will be performed repeatedly until it passes. The settings of the various signals will be:

| Case | SelRXB | SelRXAB | 256or1R |
|---|---|---|---|
| RXA calibrate | 0 | 1 | 0 |
| RXB calibrate | 1 | 1 | 0 |

| Case | IncDecR[j][1:0] | LoadRXA | LoadRXB |
|---|---|---|---|
| RXA calibrate (pass) | 11 | 1 (pulse) | 0 |
| RXA calibrate (fail) | 01 | 1 (pulse) | 0 |
| RXB calibrate (pass) | 01 | 0 | 1 (pulse) |
| RXB calibrate (fail) | 11 | 0 | 1 (pulse) |

There will be approximately 3840 (=4096−256) iterations performed during the initial calibration, since the total range is 4096 and 256 is the maximum width of a bit.

Each iteration can be done with little settling time, $t_{SETTLE1}$, because the RXA or RXB value will change by only a least-significant-bit (and therefore the $t_{SETTLE1}$ time will be very small). It will still be necessary to observe a settling time at the beginning and end of each iteration sequence in which the PhaseR[j][11:0] value is changed by large amounts. PhaseR[j][11:0] changes by large amounts when SelRXAB is changed in the normal calibration process described earlier.

Note that the initialization sequence may be performed on all slices in parallel. All of the control signals can be shared between the slices except for IncDecR[j], which depends upon the pass/fail results for the pattern data for that slice.

Figure 30:
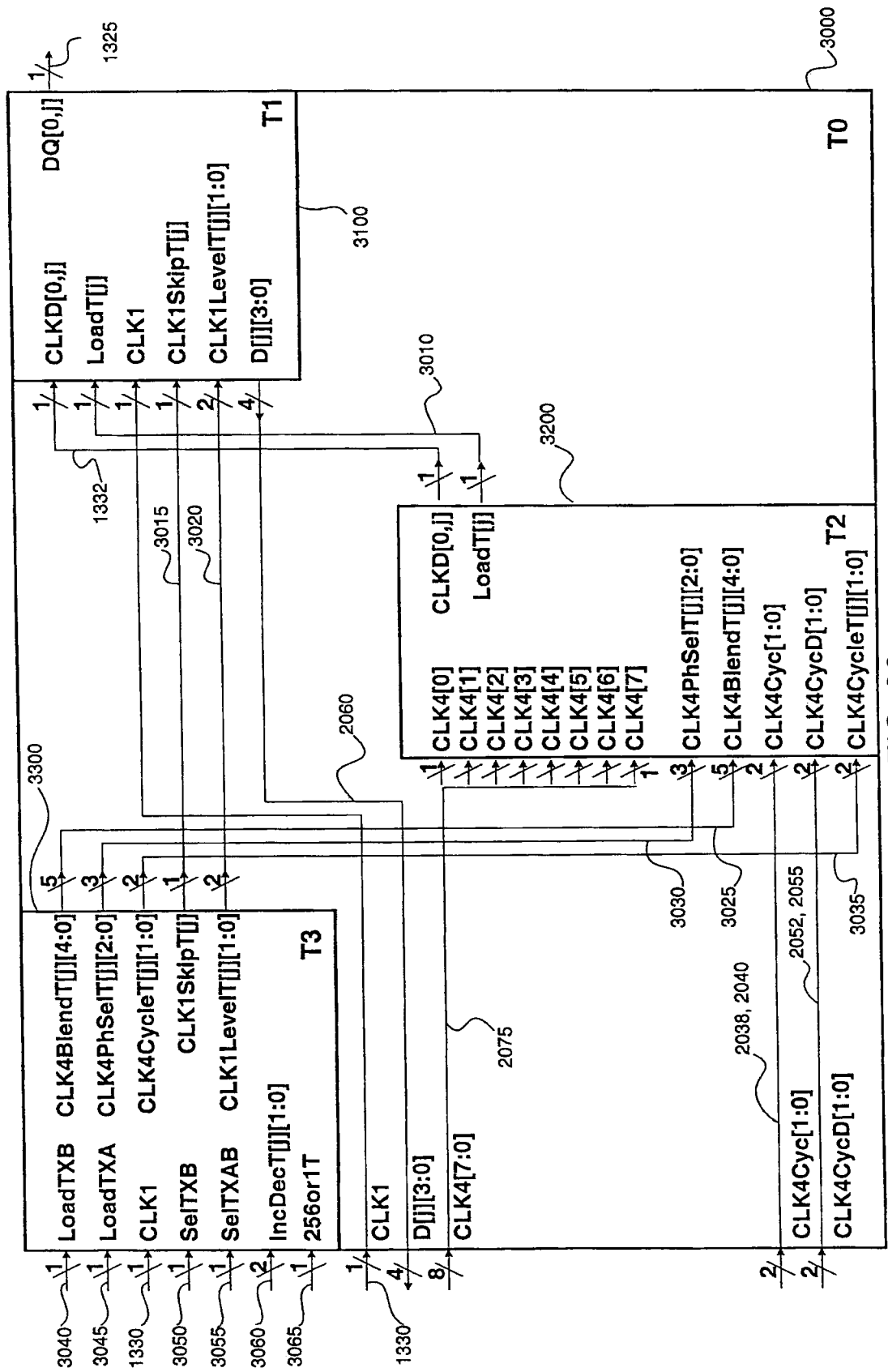
FIG. 30 is a block diagram for a controller block T0, part of block C3, and responsible for transmitting write data.

FIG. 30 shows the logic 2000 for the controller block T0. Block T0 is part of block C3 of FIG. 20 (along with block 2300). Block T0 is responsible for transmitting the write data to the memory component. It consists of three blocks: T1 3100, T2 3200, and T3 3300.

Block T1 connects to bus DQ[0,j] 1325, which connects to the external memory system (see FIG. 13). Block T1 receives the CLKD[0,j] 1332 and LoadT[j] 3010 signals from block T2 and receives CLK1SkipT[j] 3015 and CLK1LevelT[j][1:0] 3020 signals from block T3. Block T1 also receives CLK1 1330 from outside of block T0 (e.g., from block C1 in FIG. 20). Block T1 also returns $D_C$[j][3:0] to other blocks in the controller.

Block T2 supplies the CLKD[0,j] 1332 and LoadT[j] 3010 signals to block T1. Block T2 receives CLK4BlendT [j][4:0] 3025, CLK4PhSelT[j][2:0] 3030 and CLK4CycleT [j][1:0] 3035 from block T3. Block T2 receives CLK4[7:0] 2075, CLK4Cyc[1:0] 2038, 2040 and CLK4CycD[1:0] 2052, 2055 from block C1 of the controller (see FIG. 20).

Block T3 supplies the CLK4BlendT[j][4:0], CLK4PhSelT[j][2:0] and CLK4CycleT[j][1:0] signals to block T2. Block T3 also supplies CLK1SkipT[j] 3015 and CLK1LevelT[j][1:0] 3020 to block T1. Block T3 also receives LoadTXA, LoadTXB, CLK1, SelTXB, SelTXAB, IncDecT[j], and 256or1T signals (3040-3065) from outside of block T0 (either from block C1 or from other blocks in the controller, via the TX[j] control bus 2030).

Figure 31:
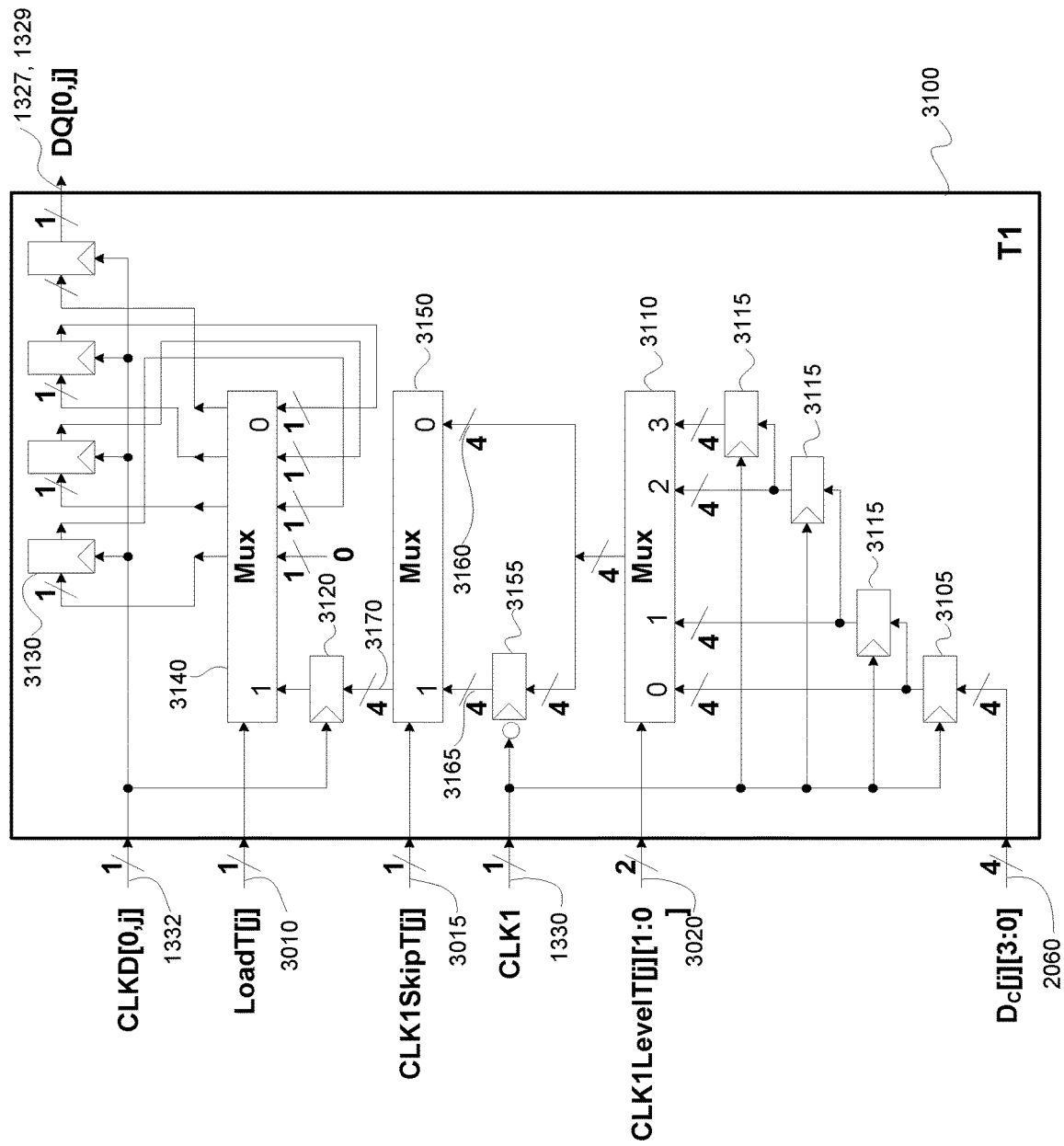
FIG. 31 is a logic diagram for block T1, part of block T0, for transmitting write data and inserting a programmable delay.

FIG. 31 is a logic diagram of controller block T1 3100, which is responsible for transmitting write data on bus 2060 from memory and inserting a programmable delay before transmitting onto the DQ[0,j] bus.

Block T1 connects to the DQ[0,j] bus 1325, which connects to an external memory system. Block T1 receives the CLKD[0,j] and LoadT[j] signals from block T2. It receives CLK1SkipT[j] 3015 and CLK1LevelT[j][1:0] signals from block T3. Block T1 receives CLK1 from outside of block T0 (e.g., from block C1) and receives $D_C$[j][3:0] from other blocks in the controller.

The first stage of the T1 Block inserts a delay of zero through three CLK1 cycles. The data received from the $D_C$[j][3:0] bus 2060 is initially stored in a four-bit register 3105. Delay insertion is accomplished using a four-to-one multiplexer 3110, and three additional four-bit registers 3115. The CLK1LevelT[j][1:0] bus 3020 can be generated in block T3 from bus 3020, and selects the data from one of the four registers 3105, 3115 for the multiplexer 3110 to pass.

The CLKD[0,j] and CLK1 clock signals may have an arbitrary phase alignment, but they will be frequency-locked in a 4:1 ratio. Either the rising edge of CLK1 or the falling edge of CLK1 can be positioned to drive the parallel data into the four-bit register 3120 clocked by CLKD[0,j]. The CLK1SkipT[j] signal on line 3015 (generated in block T3) selects between the two cases through a skip multiplexer 3150. When it is one, the path 3165 with a negative-CLK1-edge-triggered register is enabled, otherwise the direct path 3160 to multiplexer 3150 is used. In either case, a positive-CLKD[0,j]-edge-triggered register 3120 samples the output 3170 of the skip multiplexer 3150.

When the LoadT[j] signal 3010 is asserted, the most recently loaded 4-bit value in register 3120 is loaded into the four one-bit registers 3130 connected serially to the DQ[0,j] bus 1325. When the Load signal is deasserted, the contents of the four one-bit registers 3130 are shifted serially to the DQ[0,j] bus through multiplexer 3140.

Figure 32:
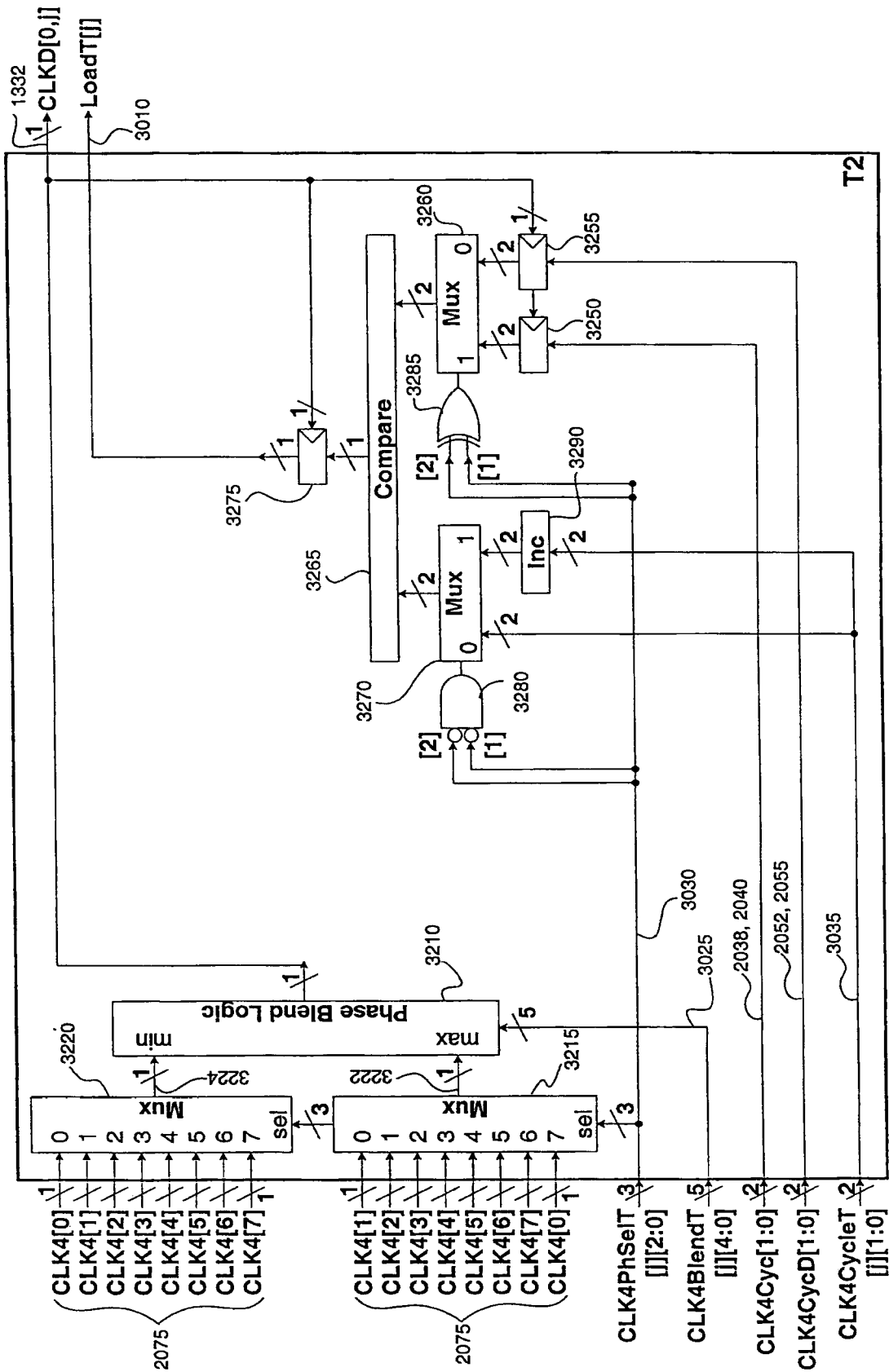
FIG. 32 is a logic diagram for block T2, part of block T0, for creating a clock signal for transmitting write data.

FIG. 32 shows the logic for the controller block T2 3200, which is responsible for creating the CLKD[0,j] clock on line 1332 needed for transmitting the write data to the memory component 1310 as shown in FIG. 15.

Block T2 supplies the CLKD[0,j] and LoadT[j] signals to block T1 of FIG. 31. Block T2 receives CLK4BlendT[j][4:0], CLK4PhSelT[j][2:0] and CLK4CycleT[j][1:0] from block T3. Block T2 receives CLK4[7:0], CLK4Cyc[1:0] and CLK4CycD[1:0] from outside of block T0 (from block C1).

The CLK4PhSelT[j][2:0] signal on line 3030 selects which of the eight CLK4[7:0] clock signals will be selected by multiplexer 3220 as the "lower limit clock signal" for the phase blending logic 3210. The CLK4PhSelT[j][2:0] signal is also used by multiplexer 3215 to select the next higher clock signal for blending. For example, if CLK4PhSelT[j][2:0] is "010", then the clock signal used for the lower limit is CLK4[2] and the clock signal used for the upper limit is CLK4[3]. These limit signals are passed by the two eight-to-one multiplexers 3215, 3220 to the Phase Blend Logic block 3210 on lines 3222 and 3224, respectively.

The CLK4BlendT[j][4:0] signal on bus 3025 selects how to interpolate between the lower and upper clock signals in phase blend logic 3210. For example, if CLK4BlendT[j][4:0] is equal to B, then the interpolated phase is at a point B/32 of the way between the lower and upper phases. If B is zero, then it is at the lower limit set by multiplexer 3220 (in which case the output of the Phase Blend Logic 3210 is derived solely from the clock signal on bus 3224), and if B is 31 set by multiplexer 3215, then it is almost at the upper limit. The output of the Phase Blend logic 3210 is the CLKD[0,j] clock signal on bus 1332, used to write data to a memory component.

The Phase Blend Logic 3210 uses well known circuit techniques to smoothly interpolate between two clock signals, and thus is not described in detail in this document.

The remaining signals and logic of the T2 block generate the LoadT[j] signal 3010, which indicates when the four write data bits are to be shifted into the serial registers 3130. The CLK4CycleT[j][1:0] signal, generated by the T3 block, picks one of the four possible load points for multiplexer 3140. The LoadT[j] signal is generated by using compare logic 3265 to compare CLK4CycleT[j][1:0] to CLK4Cyc[1:0], which labels the four CLK4 cycles in each CLK1 cycle. However, this comparison must be done carefully, since the LoadT[j] signal 3010 must be used in the CLKD[0,j] clock domain, and the CLK4Cyc[1:0] signals 2038, 2040 are generated in the CLK1 domain.

The CLK4CycD[1:0] signals on lines 2052, 2055 are delayed from the CLK4Cyc[1:0] signals by one CLK8 cycle, so there is always a valid bus to use, no matter what value of CLK4PhSelT[j][2:0] is used. See the timing diagram of FIG. 22. The following table summarizes the four cases of CLK4PhSelT[j][2:0]:

| CLK4PhSelT[j][2:0] | CLK4CycleT[j][1:0] | CLK4Cyc[1:0] or CLK4CycD[1:0] |
|---|---|---|
| 00x | incremented | CLK4CycD[1:0] |
| 01x | not incremented | CLK4Cyc[1:0] |
| 10x | not incremented | CLK4Cyc[1:0] |
| 11x | not incremented | CLK4CycD[1:0] |

The output of the compare logic 3265 is sampled by a CLKD[0,j] register 3275 to generate the LoadT[j] signal. The LoadT[j] signal is asserted in one of every four CLKD [0,j] cycles.

More specifically, AND gate 3280 and multiplexer 3270 determine whether a first input to the compare logic 3265 is CLK4CycleT[j][1:0] or is that value incremented by one by increment circuit 3290. XOR gate 3285 and multiplexer 3260 determine whether the second input to the compare logic 3265 is CLK4Cyc[1:0] or CLK4CycD[1:0], each of which is delayed by one CLKQ clock cycle by registers 3250 and 3255.

Figure 33:
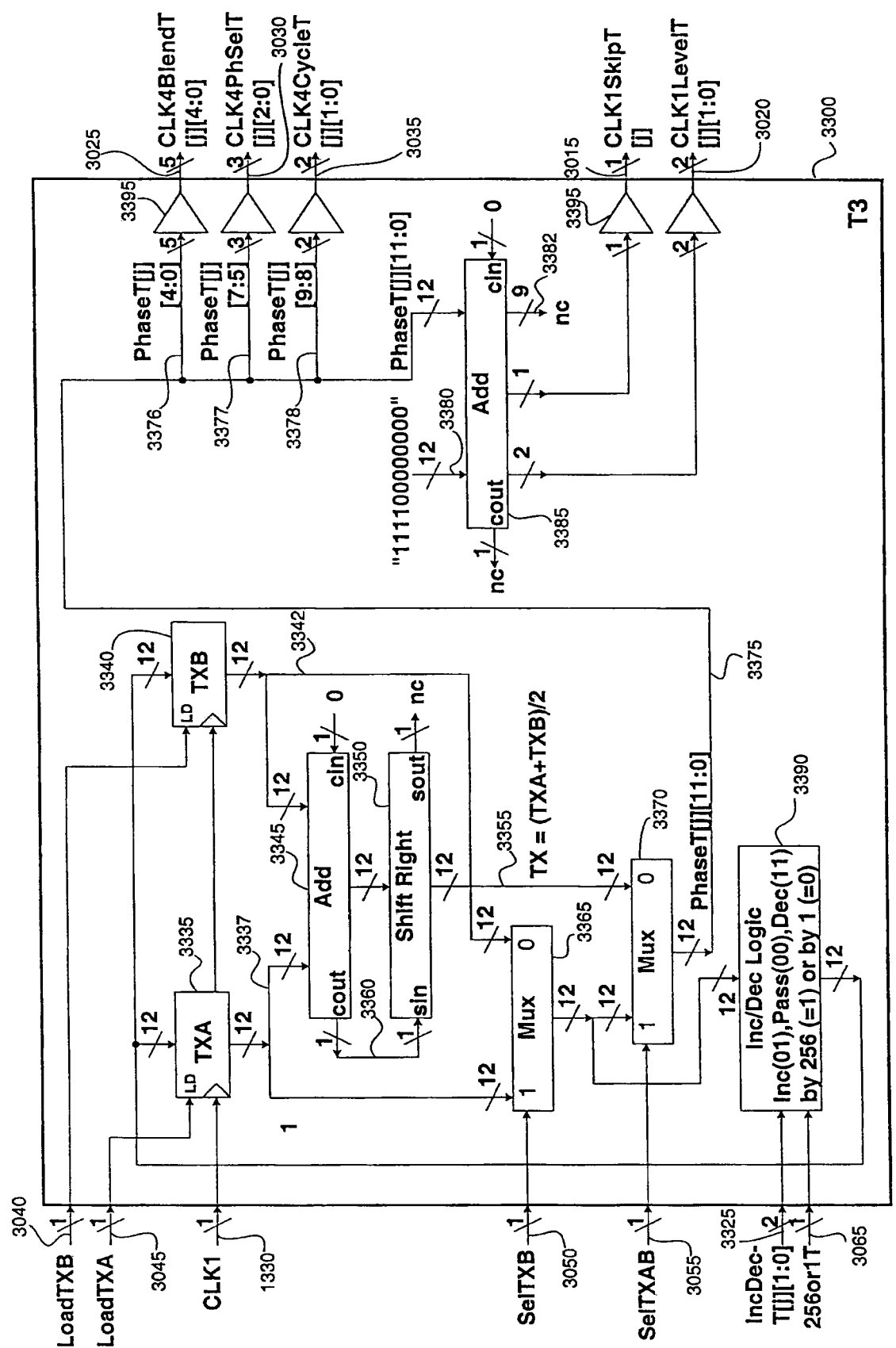
FIG. 33 is a logic diagram for block T3, part of block T0, for generating the value of a clock phase for transmitting write data.

FIG. 33 corresponds to FIG. 26 and shows the logic 3300 for the controller block T3, which is part of block T0. The T3 block is responsible for generating the value of clock phase CLKD[0,j] for transmitting write data.

Block T3 supplies the CLK4BlendT[j][4:0], CLK4PhSelT[j][2:0] and CLK4CycleT[j][1:0] signals to block T2. Block T3 supplies CLK1SkipT[j] and CLK1LevelT[j][1:0] to block T1. Block T3 receives Load-TXA, LoadTXB, CLK1, SelTXB, SelTXAB, IncDecT[j], and 256or1T signals from outside of block T0 (either block C1 of FIG. 20 or other blocks in the controller).

As with block R3, there are two 12-bit registers here (TXA 3335 and TXB 3340) in block T3. These registers digitally store the phase value of CLKD[0,j] that will transmit write data at the earliest and latest part of the data window for each bit. During normal operation, these two values on lines 3337 and 3342 are added by the Add block 3345, and shifted right by one place by shifter 3350 (to divide by two), producing a 12 bit value on line 3355 that is the average of the two values (TXA+TXB)/2. Note that the carry-out of the Add block 3345 is used as the shift-in of the shift right block 3350. In effect, the two registers TXA 3335 and TXB 3340 together digitally store a transmit phase value for a respective slice.

The average value (TXA+TXB)/2 is the appropriate value for transmitting the write data with the maximum possible timing margin in both directions. Other methods of generating an intermediate value are possible. This average value is passed through multiplexer 3370 to become PhaseT[j][11:0] on bus 3375. The CLK4BlendT[j][4:0], CLK4PhSelT[j][2:0] and CLK4CycleT[j][1:0] signals (on buses 3025, 3030, 3035) are generated by extracting PhaseT[j][4:0] 3376, PhaseT[j][7:5] 3377, and PhaseT[j][9:8] 3378 fields, respectively from the PhaseT[j][11:0] signal and buffering the extracted signals with buffers 3395.

The upper bits of PhaseT[j][11:0] 3375 represent the number of CLK1 cycles from the toFFSETT point. The fields CLK1SkipT[j] 3015 and CLK1LevelT[j][1:0] 3020 are extracted from these upper bits. Thus, PhaseT[j][11:0] is added to $-2^8$. The factor of "$2^8$" is needed to give the proper skip value (this will be discussed further with FIG. 34).

An adder 3385 adds "111100000000" on line 3380 to PhaseT[j][11:0]. The lowest nine bits of the result are discarded on line 3382, the next bit is buffered to produce CLK1SkipT[j] 3015 and the upper two bits are buffered to produce CLK1LevelT[j][1:0] 3020. Note that here the CLK1SkipT[j] and CLK1LevelT[j][1:0] fields come from adding PhaseT[j][11:0] to a constant, whereas for the R3 block (FIG. 26) of the controller's receive calibration circuitry, the CLK1SkipR[j] and CLK1LevelR[j][1:0] fields come from subtracting PhaseR[j][11:0] from a constant.

During a calibration operation, the multiplexer 3370 used to select the TX value ((TXA+TXB)/2) instead selects either the TXA register 3335 or the TXB register 3340. Placing this value on the PhaseT[j][11:0] bus 3375 causes the transmit logic to set the driving clock to one side or the other of the data window for write data. Once the driving clock CLKD[0,j] on line 1332 is stable, data is written to a memory component and read back and evaluated, and the TXA or TXB value is either incremented, decremented, or not changed by logic 3390. An increment/decrement value of "1" is used for calibrating the CLKD[0,j] clock. The increment/decrement value of "256" is used by logic 3390 when the sampling point of the RQ[i,j] bus in memory is changed (the memory component will change the sampling point of the RQ[i,j] bus 1352 in increments of the CLK4 clock cycle). The RQ[i,j] bus sampling point and its calibration process are described above with reference to FIG. 18.

Figure 34:
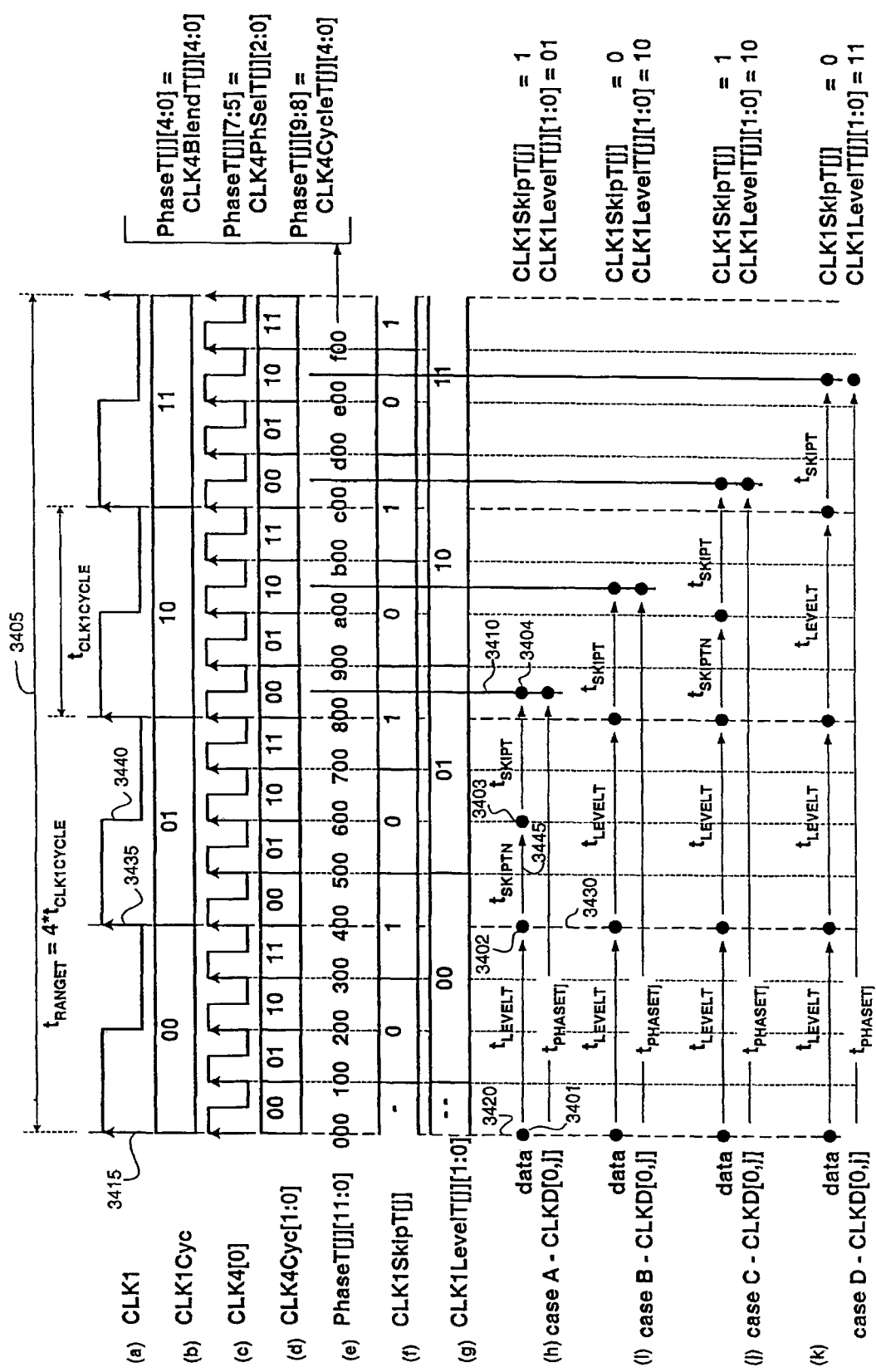
FIG. 34 shows a sequence of transmit timing signals illustrating four cases of alignment of a clock signal within a time interval and the generation of bus signals.

FIG. 34 shows transmit timing signals 34(*a*)-(*k*) that illustrate four cases of alignment of the CLKD[0,j] clock signal 1334 within the $t_{RANGET}$ interval 3405. This diagram illustrates how the signals on the following five buses are generated: CLK4BlendT[j][4:0] 3025, CLK4PhSelT[j][2:0] 3030, CLK4CycleT[j][1:0] 3035, CLK1SkipT[j] 3015, and CLK1LevelT[j][1:0] 3020. The value of PhaseT[j][11:0] adjusts the value of these buses and the value of $t_{PHASET}$ (the position of CLKD[0,j] within the $t_{RANGET}$ interval).

The first waveform 34(*a*) shows the CLK1 clock signal over an interval of duration equal to $t_{RANGET}$, and the second waveform 34(*b*) shows the labeling for the four CLK1 cycles that comprise the $t_{RANGET}$ interval (note there is no bus labeled "CLK1Cyc"; this is shown to make the diagram clearer).

The third waveform 34(*c*) shows the CLK4[0] clock signal, and waveform 34(*d*) shows the labeling for the four CLK4 cycles that comprise each CLK1 cycle (note—a CLK4Cyc[1:0] bus does exist).

The fifth waveform 34(*e*) shows the numerical values of the PhaseT[j][11:0] bus 3375 as a three digit hexadecimal number. The most-significant digit includes two bits for the CLK1Cyc value, and two bits for the CLK4Cyc value.

The right side of FIG. 34 shows how three buses are extracted from the PhaseT[j][9:0] bus: the CLK4BlendT[j][4:0] 3025, CLK4PhSelT[j][2:0] 3030 and CLK4CycleT[j][1:0] 3035 signals are generated from the PhaseT[j][4:0] 3376, PhaseT[j][7:5] 3377, and PhaseT[j][9:8] 3378 fields of the PhaseT[j][11:0] signal, respectively.

The sixth and seventh waveforms, 34(*f*) and 34(*g*), show graphically how the CLK1SkipT[j] and CLK1LevelT[j][1:0] buses 3015 and 3020, respectively, vary as a function of the PhaseT[j][11:0] value. These buses increase in value from left to right in the figure. Note that this is opposite from the direction for the receive case.

In case A, shown at 34(*h*), the PhaseT[j][11:0] value is $880_{16}$ (3410). The write data is sampled 3401 on the rising edge 3415 of CLK1 at time $000_{16}$ 3420. The data is sampled 3402 at $400_{16}$ (3430) by the next rising edge 3435 of CLK1. The associated CLK1LevelT[j][1:0] in FIG. 34(*g*) value is "01" because one "$t_{LEVELT}$" interval is used. The write data is sampled 3403 by the next falling edge 3440 of CLK1 at time $600_{16}$. The CLK1SkipT[j] value is "1" at "time" $880_{16}$ because a "$t_{SKIPTN}$" interval 3445 is used. The write data then crosses into the CLKD[0,j] clock domain, and is sampled 3404 by the rising edge of CLKD[0,j]. The three intervals labeled "$t_{LEVELT}$", "$t_{SKIPTN}$", and "$t_{SKIPT}$" connect the four sampling points 3401-3404.

The other cases B-D shown at 34(*i*)-(*k*) are analyzed in a similar fashion. In this example, the size of the $t_{RANGET}$ 3405 interval has been chosen to be four CLK1 cycles. The interval could be easily extended (or reduced) using the methods that have been described in this example.

Note that the upper limit of the $t_{RANGET}$ interval is actually 3¾ CLK1 cycles because of the method chosen to align the CLK1SkipT[j] and CLK1LevelT[j][1:0] values to the $t_{PHASET}$ values (the first ¼ CLK1 cycle cannot be used). The loss of the ¼ CLK1 cycle of range is not critical, and the method shown gives the best possible margin for transferring the write data to the CLKD[0,j] clock domain from the CLK1 domain. Other alignment methods are possible. The range of $t_{RANGET}$ values could be easily extended by adding more bits to the PhaseT[j][11:0] value and by adding more level registers 3115 in FIG. 31.

Figure 35:
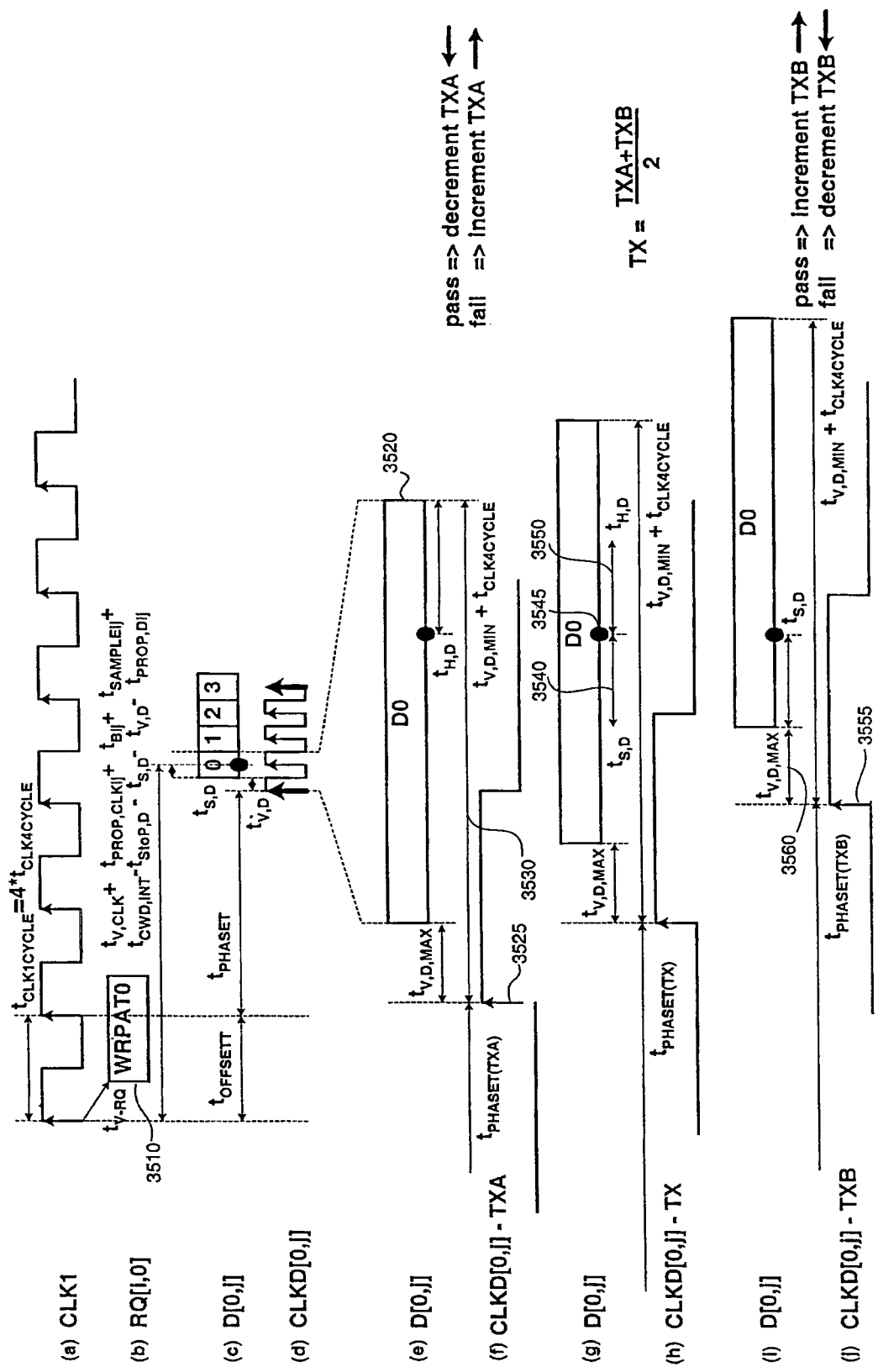
FIG. 35 shows a sequence of timing signals that illustrate how timing values are related and maintained in TXA and TXB registers.

FIG. 35 shows timing signals 35(*a*)-(*j*) that illustrate how timing values are maintained in the TXA and TXB registers 3335 and 3340, respectively. Waveform 35(*a*) shows the CLK1 signal in the controller 1305. The second waveform, 35(*b*), shows the RQ[i,0] bus 1315 issuing a WRPAT0 (write to PAT0 register) command 3510. Waveform 35(*c*) shows the pattern data D[i,j] received at memory component [i,j]. The fourth waveform 35(*d*) shows the internal clock signal CLKD[0,j] that drives the data from the controller. The position of the CLKD[0,j] rising edge is centered on $t_{OFFSETT}+t_{PHASETj}$ where:

$$t_{V,CLK}+t_{PROP,CLKij}+t_{Bij}+t_{SAMPLEij}+t_{CWD,INT}-t_{StoP,D}-t_{S,D}+t_{PROP,Dij}+t_{V,D}=t_{OFFSETT}+t_{PHASETj} \quad (9)$$

Most of the terms on the left side of Eqn. (9) can change as temperature and supply voltage vary during system operation. The rate of change will be relatively slow, however, so that periodic calibration operations can keep the $t_{PHASETj}$ value centered on the write data bits.

The calibration is accomplished by maintaining two separate register values (TXA and TXB) which track the left and right side of the write data window 3520, respectively, shown in the lower part of FIG. 35. The pattern data D[i,j] and the CLKD[0,j] rising edge are shown with an expanded scale in waveforms 35(*e*)-(*j*). The CLKD[0,j] rising edge is also shown at three different positions: $t_{PHASETj(TXA)}$, $t_{PHASETj(TX)}$ and $t_{PHASETj(TXB)}$ in waveforms 35(*f*), 35(*h*) and 35(*j*), respectively. These three positions result from setting the PhaseT[j][11:0] bus 3375 to carry the TXA[11:0], TX[11:0], and TXB[11:0] signals in logic 3300, respectively. Here, TX represents the average value of TXA and TXB.

The TXA value, shown at 35(*f*), will hover about the point 3525 at which $t_{PHASETj(TXA)}$ precedes the end of the D[i,j][0] bit by $t_{V,D,MIN}+t_{CLK4CYCLE}$ (3530). If the sampled pattern data is correct (pass), the TXA value is decremented, and if the data is incorrect (fail), the TXA value is incremented. Note that the D[i,j][0] bit is sampled by the memory component, which requires a data window of $t_{S,D}$ 3540 and $t_{H,D}$ 3550 on either side of the sampling point 3545. Also note that the sampled write data must be returned to the controller to evaluate the pass/fail criterion. However, this return of sampled write data might not be required in other implementations.

In a similar fashion, the TXB value shown in FIG. 35(*j*) will hover about the point 3555 at which $t_{PHASETj(TXB)}$ precedes the start of the D[i,j] [0] bit by $t_{V,D,MAX}$ (3560). If the sampled pattern data is correct (pass), the TXB value is incremented, and if the data is incorrect (fail), the TXA value is decremented.

For both TXA and TXB values, a pass will cause the timing to change in the direction that makes it harder to pass (reducing the effective data window size). A fail will cause the timing to change in the direction that makes it easier to pass (increasing the effective data window size). In the steady state, the TXA and TXB values will alternate between the two points that separate the pass and fail regions. As noted earlier, this behavior is called "dithering". In a preferred embodiment, calibration of TXA stops when the adjustments to TXA change sign (decrement and then increment, or vice versa), and similarly calibration of TXB stops when that value begins to dither. Alternatively, the TXA and TXB values can be allowed to dither, since the average TX value will still remain well inside the pass region.

Figure 36:
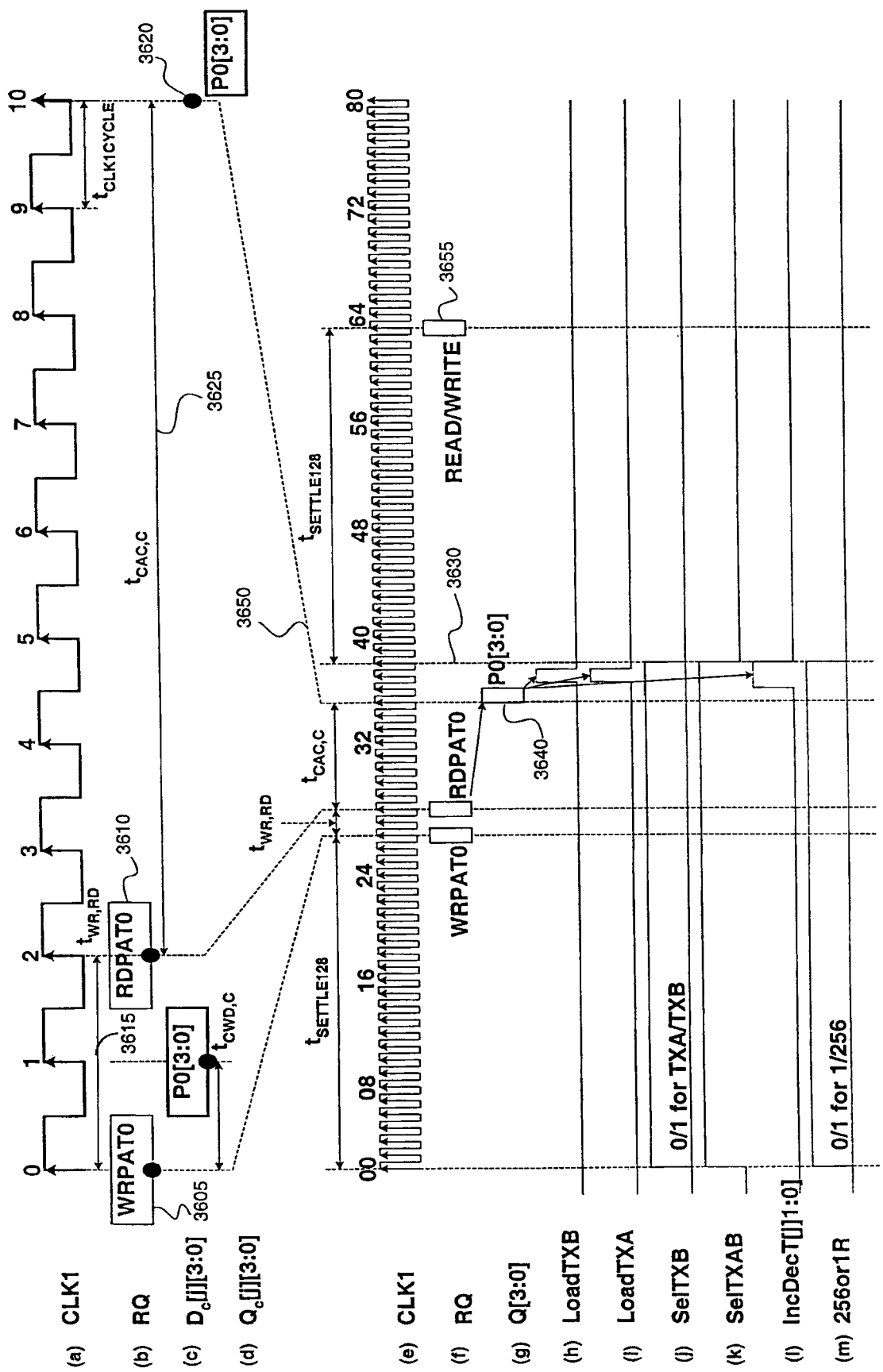
FIG. 36 shows a sequence of transmit timing signals that illustrate a calibration sequence for transferring bus signals.

FIG. 36 shows transmit timing signals 36(a)-(m) that illustrate the complete sequence that is followed for a calibration timing operation for TXA/TXB. Waveforms 36(a)-(d) are shown in an expanded view of the pattern read transaction. The first waveform 36(a) shows the CLK1 signal and the second waveform 36(b) shows the RQc bus in the controller (see FIG. 20). The third waveform 36(c) shows the pattern data $D_C[j][3:0]$ in the controller (see FIG. 20). The fourth timing waveform 36(d) shows the returned pattern data $Q_C[j][3:0]$ in the controller. Note that the time interval between the CLK1 edges associated with the WRPAT0 command 3605 and RDPAT0 command 3610 is $t_{WR,RD}$ 3615. Parameter 3615 is two CLK1 cycles in this example. Also note that the time interval between the CLK1 edges associated with the RDPAT0 command 3610 and the returned data P0[3:0] 3620 is $t_{CAC,C}$ 3625, the same as for the receive calibration and normal read operations described relative to FIG. 29.

The ten cycle pattern access is one step in the calibration operation shown in the lower part of the diagram in timing signals 36(e)-(m). The calibration sequence for this example takes 63 CLK1 cycles (here, associated with 00 to 63 in 36(e)). Before the sequence begins, all ongoing transfers to or from the memory components must be allowed to complete. At the beginning of the sequence, the SelTXB, SelTXAB, and 256or1T signals (see 3050, 3055, 3065 in FIG. 30) are set to static values that are held through rising edge 38, associated with time 3630. The following table summarizes the values to which these signals are set:

| Case | SelTXB | SelTXAB | 256or1T |
|---|---|---|---|
| TXA calibrate | 0 | 1 | 0 |
| TXB calibrate | 1 | 1 | 0 |

Changing the value of the SelTXAB from 0 to 1 means that a time interval $t_{SETTLE128}$ (25 CLK1 cycles in this example) must elapse before any pattern commands are issued. The time elapse allows the new value of PhaseT[j][11:0] 3375 to settle in the phase selection and phase blending logic 3210 of the T2 block. The pattern data 3640 is available in the controller after rising edge 35 associated with time 3650. The new value is compared to the expected value, and a pass or fail determination is made if it matches or does not match, respectively. The IncDecT[j] signal in block T3 (FIG. 30) is asserted or deasserted, as a result, and the LoadTXA or LoadTXB signal (signal 36(h)) is pulsed for one CLK1 cycle to save the incremented or decremented value. The following table summarizes the values to which these signals are set:

| Case | IncDecT[j][1:0] | LoadTXA | LoadTXB |
|---|---|---|---|
| TXA calibrate (pass) | 11 | 1 (pulse) | 0 |
| TXA calibrate (fail) | 01 | 1 (pulse) | 0 |
| TXB calibrate (pass) | 01 | 0 | 1 (pulse) |
| TXB calibrate (fail) | 11 | 0 | 1 (pulse) |

At rising edge 38 (at time 3630), all signals can be returned to zero. Changing the value of the SelTXAB from 1 to 0 as shown in signal 36(j) means that another time interval $t_{SETTLE128}$ must elapse before any read or write commands 3655 are issued. The calibration sequence described may be performed on all slices of a memory system in parallel. Control signals can be shared between the slices except for IncDecT[j], which depends upon the pass/fail results for the pattern data for that slice.

The calibration sequence must be performed for registers TXA 3335 and TXB 3340 at periodic intervals that are spaced closely enough to ensure that timing adjustments can keep up with timing changes due to, for example, temperature and supply voltage variations.

When the sampling point of the RQ[i,j] bus 1352 by the CLKB[i,j] clock signal on line 1347 (FIG. 13) is changed in the memory component, the driving point of the CLKD[0,j] transmit clock on line 1332 in the controller must be adjusted. The adjustment is accomplished by an update sequence for the TXA and TXB register values. This is similar to the calibration sequence of FIG. 36, but with some simplifications. Typically this update sequence would be performed immediately after the RQ sampling point was updated.

The SelTXB 3050, SelTXAB 3055, and 256or1T 3065 signals are set to static values that are held through the update sequence. The PhaseT[j][11:0] value 3375 is not changed (SelTXAB remains low), so that the pattern transfer doesn't need to wait for circuitry to settle as in the calibration sequence. The following table summarizes the values to which these signals are set:

| Case | SelTXB | SelTXAB | 256or1T |
|---|---|---|---|
| TXA update | 0 | 0 | 1 |
| TXB update | 1 | 0 | 1 |

The reason that an increment/decrement value of 256 is used instead of 1 is because when the sample point of the RQ[i,j] bus is changed, it will be by {+1,0,−1} CLK4 cycles. A CLK4 cycle corresponds to the value of 256 in the range of PhaseT[j][11:0]. When the sample point changes by a CLK4 cycle, the data that is received in the D[j][3:0] bus 2060 will shift by one bit to the right or left. By comparing the pattern data to the expected data, it can be determined whether the TXA and TXB values need to be increased or decreased by 256, or left the same. The following table summarizes the values to which these signals are set:

| Case | IncDecT[j][1:0] | LoadTXA | LoadTXB |
|---|---|---|---|
| TXA update (shifted right) | 11 | 1 (pulse) | 0 |
| TXA update (pass) | 00 | 1 (pulse) | 0 |
| TXA update (shifted left) | 01 | 1 (pulse) | 0 |
| TXB update (shifted right) | 11 | 0 | 1 (pulse) |
| TXB update (pass) | 00 | 0 | 1 (pulse) |
| TXB update (shifted left) | 01 | 0 | 1 (pulse) |

Both TXA and TXB can be updated successively using the same pattern read transfer. Note that the update sequence may be performed on all slices in parallel. The control signals can be shared between the slices except for IncDecT[j], which depends upon the pass/fail results for the pattern data for that slice.

Once the update sequence has completed, a time interval $t_{SETTLE256}$ must elapse before any write commands are issued. This time elapse allows the new value of PhaseT[j]

[11:0] to settle in the phase selection and phase blending logic 3210 of the T2 block (FIG. 32).

Before TXA and TXB register values can go through the calibration and update sequences just described, the values must be initialized to appropriate starting values. This initialization can be done relatively easily with the circuitry that is already in place.

The initialization sequence begins by setting the TXA register 3335 to the minimum value of $000_{16}$ and by setting the TXB register 3340 to the maximum value $fff_{16}$. These will both be failing values, but when the calibration sequence is applied to them, both values will move in the proper direction (TXA in increment and TXB will decrement).

Thus, the initialization procedure involves performing the TXA calibration repeatedly until it passes. Then the TXB calibration will be performed repeatedly until it passes. The settings of the various signals will be:

| Case | SelTXB | SelTXAB | 256or1T |
|---|---|---|---|
| TXA calibrate | 0 | 1 | 0 |
| TXB calibrate | 1 | 1 | 0 |

| Case | IncDecT[j][1:0] | LoadTXA | LoadTXB |
|---|---|---|---|
| TXA calibrate (pass) | 11 | 1 (pulse) | 0 |
| TXA calibrate (fail) | 01 | 1 (pulse) | 0 |
| TXB calibrate (pass) | 01 | 0 | 1 (pulse) |
| TXB calibrate (fail) | 11 | 0 | 1 (pulse) |

There will be approximately 3840 (=4096−256) iterations performed (since the total range is 4096 and 256 is the maximum width of a bit).

Each iteration can be done with little settling time, $t_{SETTLE1}$, because the TXA or TXB value will change by only a least-significant-bit (and therefore the $t_{SETTLE1}$ time will be very small). It will still be necessary to observe a settling time at the beginning and end of each iteration sequence when the PhaseT[j][11:0] value is changed by a large amount. PhaseT[j][11:0] changes by large amounts when SelTXAB is changed in the normal calibration process described above.

Note that the initialization sequence may be performed on all slices in parallel. All of the control signals can be shared between the slices except for IncDecT[j], which depends upon the pass/fail results for the pattern data for that slice.

Calibration State Machine Logic

Figure 37:
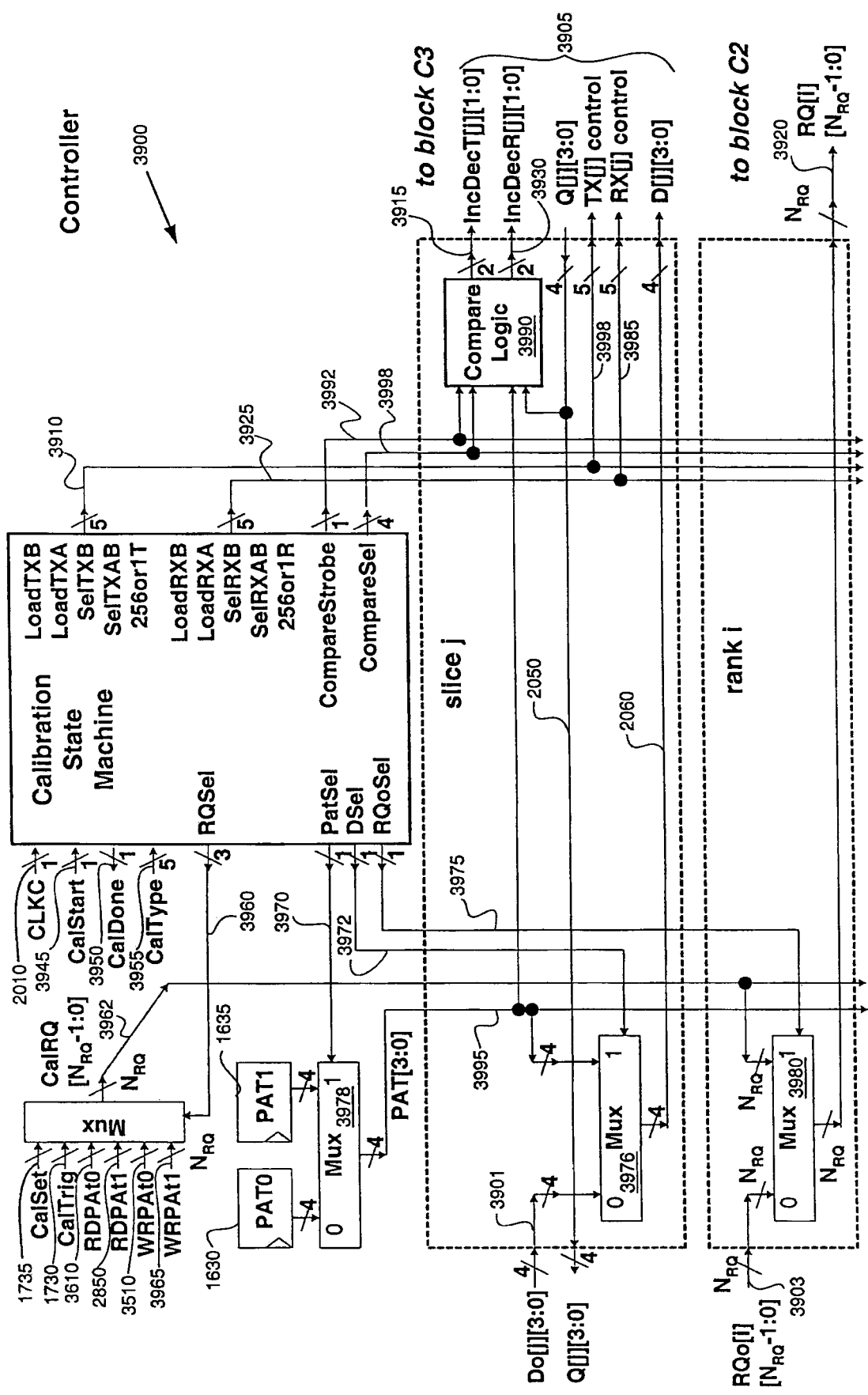
FIG. 37 is a block diagram of the logic needed to perform the calibration processes of a preferred embodiment of the present invention.

FIG. 37 shows a sample block diagram 3900 of the logic for performing the calibration processes that have been described above. For example, these processes include the calibration process in which the PhaseT[j][11:0] or PhaseR[j][11:0] values are incremented or decremented by one, the "update" calibration process in which the PhaseT[j][11:0] or PhaseR[j][11:0] values are incremented or decremented by 256, the "initialize" calibration process in which the PhaseT[j][11:0] or PhaseR[j][11:0] values are incremented or decremented from an initial value, by up to 4096 bits, until an initial calibration is achieved, and the "CALSET/CALTRIG" calibration process in which the RQ sampling cycle of the memory components is updated. FIGS. 18, 29 and 36 are timing diagrams illustrating the pulsing of the control signals that perform the steps of each calibration process.

The logic in FIG. 37 drives these control and data signals. The control and data signals include two sets of signals that are carried on busses that connect to the C3 block in FIG. 20. The first set of control signals includes signals 2060 ($D_C[j][3:0]$), 3910 (LoadTXA, LoadTXB, SelTXB, SelTXAB and 256or1T) and 3915 (IncDecT[j][1:0]). This first set of signals corresponds to signals 2030 and 2060 in FIG. 20. The second set of control and data signals includes signals 2050 ($Q_C[j][3:0]$), 3925 (LoadRXA, LoadRXB, SelRXB, SelRXAB and 256or1R) and 3930 (IncDecR[j][1:0]). This second set of signals corresponds to signals 2040 and 2050 in FIG. 20.

The control signals also include the set of signals 3920 ($RQ_C[i][N_{RQ}-1:0]$) that connect to the C2 block in FIG. 20.

The logic 3900 is controlled by the following signals:

CLKC 2010, the primary clock used by the memory controller;

CalStart 3945, a signal that is pulsed to indicate that a calibration operation should be performed;

CalDone 3950, a signal that is pulsed to indicate the calibration operation is completed; and CalType 3955, a five bit bus that specifies which calibration operation is to be performed.

The controller is configured to ensure that the $RQ_C[i][N_{RQ}-1:0]$ 3920, Q[j][3:0] 2050, or $D_C[j][3:0]$ 2060 buses are not busy with normal read or write operations when the calibration operation is started. This is preferably accomplished with a hold-off signal (not shown) that is sent to the controller and which allows presently executing read or write operations to complete, and prevents any queued read or write operations from starting. Additionally, a decision to start a calibration operation could be made by a timer circuit (not shown), which uses a counter to measure the time interval between successive calibration operations. It is also possible that a calibration operation could be started early if there was an idle interval that allowed it to be performed with less interference with the normal read and write transactions. In any case, the calibration operations can be scheduled and executed with only hardware. However, this hardware-only characteristic would not preclude using a software process in some systems to either schedule calibration operations, or to perform the sequence of pulsing on the control signals. It is likely that a full hardware implementation of the calibration logic would be preferred for use in most systems because of the ease of design and convenience of operation.

In a preferred embodiment, the CalType[2:0] signal selects the type of calibration operation using the following encodings:

| Operation Type | CalType[2:0] |
|---|---|
| TXA/TXB calibrate | 000 |
| TXA/TXB update | 001 |
| TXA/TXB initialize | 010 |
| CALSET/CALTRIG calibrate | 011 |
| RXA/RXB calibrate | 100 |
| RXA/RXB update | 100 |
| RXA/RXB initialize | 100 |
| Reserved | 111 |

An additional bit (the CalType[3] bit) selects between an update to the TXA/RXA edge and the TXB/RXB edge (in other words, each calibration operation updates either TXA or TXB, but not both at the same time). Another bit (the CalType[4] bit) select whether PAT0 1630 or PAT1 1635 pattern register is used for the calibration operation. Note that the CalType[4:3] signal would not be used during a "CALSET/CALTRIG" operation.

Once the calibration operation type has been specified, the calibration state machine in logic 3900 begins counting through a sequence that produces the appropriate pulsing of the control signals. In addition to the control and data signals 3905 for the C3 block, the RQSel signal 3960 selects the appropriate request to be placed on the CalRQ[$N_{RQ}$-1:0] signals 3962. The choices are based on the CALSET 1735 and CALTRIG 1730 commands (which are used to update the sampling point for the RQ signals in each memory component), and the RDPAT0 3610, RDPAT1 2850, WRPAT0 3510, and WRPAT1 3965 commands (used to read and write the pattern registers in the memory components). A NOP command (not shown) is the default command selected by decode logic 1722 (FIG. 17) when no other command is specified by the RQ[i,j] signal 1604.

The PatSel signal 3970 selects which of the pattern registers 1630, 1635 are to be used for the operation. Pattern registers 1630 and 1635 in FIG. 37 are the pattern registers in the calibration logic 3900 that correspond to the pattern registers 1630, 1635 in the memory component whose timing is being calibrated. Other embodiments could use a different number of registers in the controller and memory components. The DSel signal 3972 allows a selected pattern register to be steered onto the $D_C$[j][3:0] signals 2060 by way of multiplexers 3976, 3978, and the RQoSel signal 3975 allows the CalRQ[$N_{RQ}$-1:0] signals 3962 to be steered onto the RQ[i][$N_{RQ}$-1:0] signals 3920 by way of multiplexer 3980. In this embodiment, all slices perform calibration operations in parallel.

During an RXA or RXB operation, the contents of a pattern register 1630 or 1635 are read from a memory component and compared to the contents of the corresponding pattern register 1630 or 1635 in the controller. Depending upon whether the two sets of values match in the compare logic 3990, the IncDecR[j][1:0] signals 3930 will be set to appropriate values to cause the PhaseR[j][11:0] value, such as on line 2675 of FIG. 26, to be incremented, decremented, or left unchanged. Note that only the IncDecR[j][1:0] signals 3930, can be different from slice to slice; the other five RX[j] control signals 3925 will have the same values for all the slices.

During a TXA or TXB calibration operation, the contents of a controller pattern register are written to a pattern register in each memory component, read back from the memory component, and compared to the contents of the original pattern register in the controller. Depending upon whether the two sets of values match in the compare logic 3990, the IncDecT[j][1:0] signals 3915 will be set to appropriate values to cause the PhaseT[j][11:0] value, such as on line 3375 of FIG. 33, to be incremented, decremented, or left unchanged. Note that only the IncDecT[j][1:0] signals 3915 can be different from slice to slice; the other five TX[j] control signals 3910 will have the same values for all the slices.

There are two sets of signals that are compared by the compare logic block 3990: $Q_C$[j][3:0] 2050 and PAT[3:0] 3995 from multiplexer 3978. The results from the compare are held in the Compare Logic 3990 when the CompareStrobe signal 3992 is pulsed. The CompareSel[3:0] signals 3998 indicate which of the operation types is being executed. The CompareSel[3] signal selects between an update to the TXA/RXA edge and the TXB/RXB edge. The CompareSel[2:0] signals select the calibration operation type as follows:

| Operation Type | CompareSel[2:0] |
|---|---|
| TXA/TXB calibrate | 000 |
| TXA/TXB update | 001 |
| TXA/TXB initialize | 010 |
| reserved | 011 |
| RXA/RXB calibrate | 100 |
| RXA/RXB update | 100 |
| RXA/RXB initialize | 100 |
| reserved | 111 |

In the case of the TXA/TXB operations the IncDecT[j][1:0] signals 3915 are adjusted, and in the case of the RXA/RXB operations the IncDecR[j][1:0] signals 3930 are adjusted. In the case of the update operations, the compare logic 3990 looks for a left or right shift of the read data relative to the controller pattern register, indicating that the memory component has changed its RQ sampling point. If there is no shift, no change is made to the phase value. In the case of the calibrate and initialize operations, the compare logic 3990 checks if the read data and the controller pattern register are equal or not. The phase value is either incremented or decremented, as a result.

The Do[j][3:0] 3901 signals are outgoing write data signals, being sent from elsewhere in the controller to a memory component. Similarly the Rqo[i][$N_{RQ}$-1:0] signals are outgoing request signals, being sent from elsewhere in the controller to a memory components. These signals are not used by the calibration logic 3900 of the memory controller (they are used for normal read and write operations) and thus are not further discussed here.

Alternate Embodiments

The preferred system described above with reference to FIGS. 7-37 provided a complete description of a memory system topology that could benefit from the methods of dynamic mesochronous clocking. A number of variations from this baseline system will now be described individually. Any of these individual variations may, in general, be combined with any of the others to form composite variations. Any of the alternate systems formed from the composite variations can benefit from the methods of dynamic mesochronous clocking.

The preferred system described routed the CLK signal on bus 1320 with the Y bus signals (the RQ bus 1315). As a result, the CLK signal and RQ bus connected to two or more memory components on a memory rank. However, two memory components in the same rank could have different timing parameters ($t_{Bij}$, in particular), and as a result it may not be possible to adjust the transmit timing of CLK and RQ signals in the controller so that a component of the memory system is able to receive RQ signals 1604 with the CLKB signal 1606. This problem necessitated the use of the RQ sampling method, in which the CLK signal 1340 has 4 timing events (rising edges) per RQ bit time, and in which a calibration process is performed to select the proper timing event for sampling. It is possible to use more than 4 timing events and fewer than 4 timing events to set a sampling point. For example, the lower sampling limit can be three when calibration pulses on the RQ signals 1604 are limited to the bit time and phase offset of normal RQ signals. In alternate preferred embodiment, described below, the RQ calibration pulses are allowed to have phase offsets with respect to normal RQ signals.

The RQ calibration process of the preferred embodiment is very simple: a high pulse of duration $t_{CLK1CYCLE}$, depicted in timing diagram 18, is sampled by the CLKB signal (with a CLK4 frequency) in a component of the memory system, and looks for a string on three high values, choosing the center high value as the sample point. This approach can be extended to look for a string of 3, 4, or 5 high values (the possible outcomes for all possible phase alignments of RQ and CLKB) in order to select a better-centered sample point.

Another embodiment uses a second RQ signal for calibration. In one variation, this second signal carries a high value during NOP commands and carries a low pulse of duration $t_{CLK1CYCLE}$ at the same time that the first RQ signal carries its high pulse. The calibration logic 1310, 1355 would search the high and low sampled values to select a better-centered sample point.

Yet another variation to the preferred embodiment is based on the fact that it is not necessary to use a CLK signal (on bus 1320) having four rising edges per RQ bit time in order to get enough timing events to perform the sampling. It would be possible to route four separate CLK signals on separate wires, each with one rising edge per RQ bit time, but offset in phase across the $t_{CLK1CYCLE}$ interval. These phase-shifted clock signals would need to be recombined in the memory component 1600 for transmitting and receiving on the DQ bus 1612. It would be beneficial to route multiple clock signals on a main printed circuit board and modules so as to minimize propagation delay differences.

In the description of the preferred embodiment, reference was often made to the rising edges of various clock and timing signals. But it is also possible to use both the rising and falling edges of a clock signal. When using both rising and falling edges, it is preferable to use differential signaling for the clock signal to minimize any duty cycle error. Such differential signaling would permit the use of a clock signal with two rising edges and two falling edges per RQ bit time, reducing the maximum frequency component of the clock signal. Though such elements are not shown, this approach would require the use of register elements in the memory system that use both the rising edge and falling edge of clock.

As noted earlier, in yet another alternate embodiment it would be possible to use a smaller number of timing events on the CLK signal per RQ bit interval. In principle, two timing events are possible (e.g., a rising edge and a falling edge of a clock with cycle time of $t_{CLK1CYCLE}$). This alternate embodiment is performed by transmitting high pulses on four RQ signals, each pulse offset by ¼ of a $t_{CLK1CYCLE}$ from one another. The four pulses could be sampled by the rising and falling edge of CLKB on bus 1347. The resulting pattern of eight sample values will indicate where the bit time of the normal RQ signals lie, and the memory component can select either the rising edge or falling edge of CLKB for sampling. This approach would require transmit circuitry in the controller that could adjust the relative phase of RQ signals to generate the calibration pulses. While not shown, such circuitry could be provided by one skilled in the art and based on the requirements of a particular embodiment.

In a further variation to the preferred embodiment, it would be possible to use more complex calibration patterns instead of, or in combination with, the simpler pattern consisting of a high pulse of duration $t_{CLK1CYCLE}$. For example, a high pulse could be used to indicate the start of the calibration sequence, with further pulses chosen to elicit the worst case pattern sequence for the RQ receivers in the memory. These worst case patterns could be chosen at initialization time from a larger set of predefined candidate patterns and then stored for use during calibration operations.

As noted, the preferred embodiment system routed the CLK signal with the Y bus signals (the RQ bus 1315). As a result, the CLK signal 1320 and RQ bus connected to two or more components on a memory rank. However, the fact that two memory components could have very different timing parameters ($t_{Bij}$, in particular) means that it may not be possible to adjust the transmit timing of CLK and RQ in the controller so that each memory component is able to receive RQ with CLK. This restriction necessitated the use of the RQ sampling method in which the CLK signal is provided with two or more selectable timing events (edges) per RQ bit time.

If the CLK signal is routed with the X bus signals, the sampling method is no longer necessary because each memory component in a memory rank receives its own clock signal. The transmit timing of each CLK signal can be adjusted in the controller so that CLKB[i,j] 1345 has the proper phase to sample the RQ bus 1315. The transmit and receive timing of the DQ bus 1325 is adjusted as in the preferred embodiment.

Routing the clock signal with X bus signals on bus 1325 has the benefit that the RQ signals can use a bit time similar to that of the DQ signals on bus 1325. However, if the RQ signals on bus 1315 connect to significantly more memory components of the memory system than the DQ signals, this benefit may not be fully realized since the wiring topology may limit the maximum signaling frequency of the RQ signals. Additionally, this method may require more clock pins on the controller if the number of slices in a rank is more than one. This increase is because there is one CLK signal per slice but only one CLK signal per rank with the preferred embodiment.

This method of routing the clock signal with X bus signals will also have a performance penalty when multiple ranks are present. This penalty occurs either because there are multiple ranks on one module or because there are multiple modules in the memory system. A read or write operation consists of one or more commands transferred on the RQ bus 1315 followed by a data transfer on the DQ bus 1325. While commands and data are spread out over a time interval, they are usually overlapped with read or write operations to other independent banks of the same rank, or to banks of other ranks. But this method of routing requires that transfers on the RQ or DQ bus of a particular rank [j] use a CLK signal for each slice [i] with a particular phase offset. A transfer to an RQ or DQ bus of a different rank [k] (where [k] is different than [j]) needs a CLK signal for each slice [i] that has a different phase offset. As a result, interleaved transfers to different ranks on the RQ or DQ buses would require a settling interval between phase adjustments to the CLK signal for each slice impacting overall performance. This performance impact could be addressed by generating a CLK signal for each slice of each rank (a CLK signal per memory component). It could also be addressed by limiting the number of ranks to one, but if such a limitation on the number of ranks is not desired, a performance penalty will result.

An alternate preferred embodiment uses the falling CLK edges to receive and transmit data bits on the DQ bus 1325. The preferred embodiment uses the rising edge of CLKB to receive and transmit a bit of information on the DQ bus 1325. It is possible to use the falling edge of CLKB at 1347 to also receive and transmit a DQ bit. As noted, the falling edge would probably necessitate the use of differential signaling for CLK to minimize any duty cycle error. However, such an approach would equalize the maximum frequency component of the CLK signal and the DQ signals and would require the use of register elements in the memory components that use both the rising edge and falling edge of clock. It is also possible to use the falling edge of CLKB to also receive an RQ bit from the RQ bus 1315. As noted, this approach would probably necessitate the use of differential signaling for CLK to minimize any duty cycle error. As with the above case, this approach would equalize the maximum frequency component of the CLK signal and the RQ signals and would require the use of register elements in the memory components that use both the rising edge and falling edge of clock.

While the description of the preferred embodiment concentrated on the operation of the system with respect to a single rank, the timing methods of the present invention work equally well when multiple ranks of the memory components are present. A system can have multiple ranks on one module and/or multiple modules in the memory system. The controller includes a storage array to store a separate set of RXA/RXB/TXA/TXB phase adjustment values for each rank and each slice in the system (4×12 bits of phase values for each memory component using 12 bit phase resolution). The phase adjustment values for a particular rank would be copied into the appropriate registers in the R3 (see FIG. 26) and T3 (see FIG. 33) blocks in the preferred embodiment for each slice when a data transfer was to be performed to that rank. It is possible that a settling time would be needed between data transfers to different ranks to give the phase selection and phase blending logic of the R2 (see FIG. 25) and T2 (see FIG. 32) blocks for each slice time to stabilize the clocks they are generating.

The settling time needed between data transfers to different ranks will likely impact system performance. This performance impact can be minimized by a number of techniques in the memory controller. The first of these techniques is to perform address mapping on incoming memory requests. This technique involves swapping address bits of a memory request so that the address bit(s) that selects an applicable rank (and module) come from address fields that change less frequently. Typically, these will be address bits from the upper part of the address.

The second of these techniques would be to add reordering logic to the memory controller, so that requests to a particular rank are grouped together and issue sequentially from the controller. In this way, the settling time penalty for switching to a different rank can, in effect, be amortized across a larger number of requests.

If the CLK signal is routed with the X bus signals, as in a previous alternate preferred embodiment, there will need to be a separate set of RXA/RXB/TXA/TXB register values for receiving and transmitting on the DQ bus 1325 for each rank and each slice in the system. This separate set of values will require 4×12 bits of phase values with 12 bit phase resolution. In addition, there will need to be a separate set of TXA/TXB register values for transmitting the CLK signal for each rank and each slice in the system (24 bits of phase values for each memory component). This embodiment requires that transfers on the RQ 1315 or DQ 1325 bus of a particular rank [j] use a CLK signal for each slice [i] with a corresponding, separately calibrated phase offset. A transfer to an RQ or DQ bus of a different rank [k] needs a CLK signal for each slice [i] that has a different phase offset. As a result, interleaved transfers to different ranks on the RQ or DQ buses would require a settling interval between phase adjustments to the CLK signal for each slice, and a simultaneous settling interval for phase adjustments to the CLKD [0,j] or CLKQ[0,j] clock signal for each slice (see phase adjustment logic 1365 and 1368 in FIG. 13). The values for a particular rank, i, would be copied into the R3 (FIG. 26) and T3 (FIG. 33) blocks for each slice, j, when a data transfer was to be performed to that rank. An additional settling time would likely be needed between data transfers to different ranks to give the phase selection and phase blending logic of the R2 (FIG. 25) and T2 (FIG. 32) blocks for each slice time to stabilize the clocks generated.

In still a further variation, the description of the preferred system related to calibration logic M4 used two registers PAT0 and PAT1 (registers 1630 and 1635, respectively, FIG. 16) to hold patterns for use in the calibration, update, and initialization sequences needed to maintain the proper phase values in the RXA/RXB/TXA/TXB registers for each slice. In an alternate preferred embodiment, it would be possible to add more registers to add flexibility and robustness to the calibration, update, and initialization sequences. Adding registers would require at least the following: 1) enlarging the fields in the calibration commands that select calibration registers; 2) adding more registers to the memory; and 3) controller hardware that performs calibration, update, and initialization sequences to ensure that the added registers are loaded with the proper values.

In a further variation to the above, the description of the preferred embodiment used a single four bit transfer per DQ signal for performing calibration. Since calibration operations can be pipelined (like any read or write transfer), it would possible to generate a pattern of any length, provided there is enough register space to hold a multicycle pattern. The use of a longer calibration pattern in an alternate preferred embodiment ensures that the phase values used during system operation have more margin than in the preferred embodiment.

The preferred embodiment used the same data or test patterns for calibrating the RXA/RXB/TXA/TXB phase values. In a further variation, one could use different patterns for each of the four phase values provided there is enough register space. The use of customized calibration patterns for the two limits of the read and write bit windows ensures that the phase values used during system operation are provided with added margin.

Additionally, the preferred embodiment assumed that the calibration, update, and initialization sequences used the same patterns. However, an initialization sequence may have access to more system resources and more time than the other two sequences. This means that during initialization, many more candidate patterns can be checked, and the ones that are, for example, the most conservative for each RXA/RXB/TXA/TXB phase values for each slice can be saved in each memory component for use during the calibration and update sequences.

The description of the preferred embodiment did not specify how the patterns are placed into the pattern registers at the beginning of the initialization sequence. Various approaches are possible here. One possible way would be to use sideband signals. Sideband signals are signals that are not part of the RQ and DQ buses and which do not need the calibration or initialization sequence to be used. Such sideband signals could load the pattern registers with initial pattern values.

A second possible way to accomplish placing patterns in the pattern registers is to use a static pattern that is hardwired into a read-only pattern register. This pattern could be used to initialize the phase values to a usable value, and then refine the phase values with additional patterns.

A third possible way to place patterns in the pattern registers is to use a circuit that detects when power is applied to the memory component. When power is detected, the circuit could load pattern registers with initial pattern values.

A fourth possible way is to use a reset signal or command to load pattern registers with initial pattern values.

Again returning to the preferred embodiment, the phase values in the RXA/RXB and TXA/TXB registers were averaged to give the best sampling point and drive point for read bits and write bits. For some systems, it might be preferable to pick a point that is offset one way or the other to compensate for the actual transmit and receive circuitry.

While the preferred embodiment did not explicitly show how the calibration, update, and initialization sequences generate the control signals for manipulating the RXA/RXB/TXA/TXB registers, there are a number of ways to do this. One approach is to build a state machine which sequences through the 60 or so cycles for the update and calibration sequences and pulsing the control signals, as indicated in the timing diagrams in FIGS. 29 and 34. Systems could be configured to handle longer sequences needed for initialization. Such systems would be triggered by software, in the case of the initialization sequence, or by a timer, in the case of the update and calibration sequences. The update and calibration sequences could arbitrate for access to the memory system and hold off the normal read and write requests. A second way to generate the control signals for manipulating the RXA/RXB/TXA/TXB registers would be to use software to schedule the sequences and generate the control signals. This could be an acceptable alternative in some applications.

In regards to other alternate embodiments, it was mentioned earlier that the dynamic mesochronous clocking techniques are suitable for systems in which power dissipation is important (such as portable computers). There are a number of methods for reducing power dissipation (at the cost of reducing transfer bandwidth) that allow such a system to utilize a number of different power states when power is more important than performance.

Figure 38:
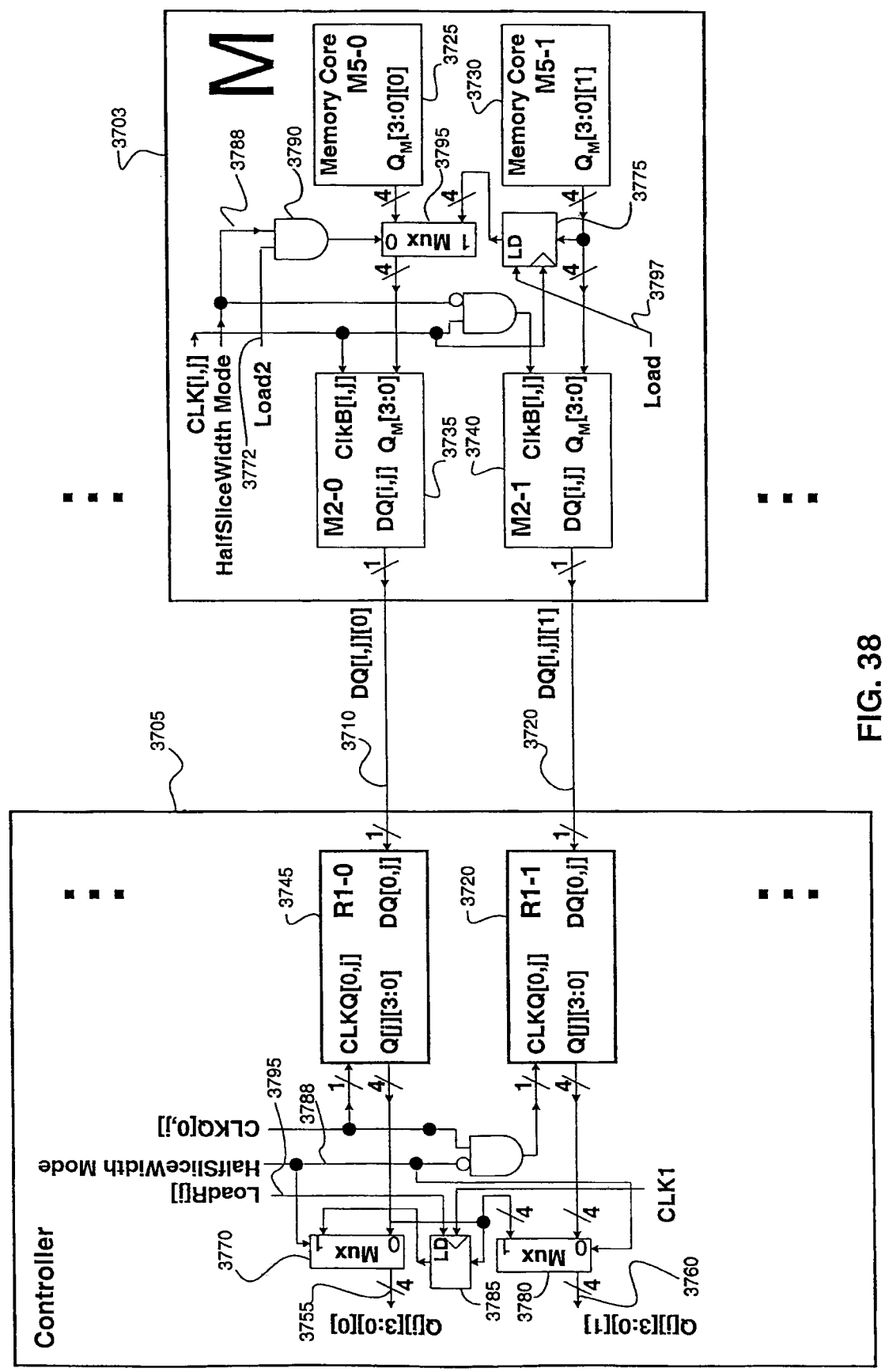
FIG. 38 is a block diagram for a memory system to implement a power reduction mechanism.

FIG. 38 shows an example of the logic needed in the memory controller 3705 and the memory 3703 to implement a "dynamic slice width" power reduction mechanism. In this figure, it is assumed that each memory component 3703 connects to two DQ signals 3710 and 3720. This means that there will be two M5 blocks (3725 and 3730) and two M2 blocks (3735 and 3740) inside each memory. In the figure, the two M5 blocks and two M2 blocks are appended with a "-0" and "-1" designation. It is noted that only a read operation is discussed; a write operation would use similar blocks of logic. The internal $Q_M$ signals in blocks 3725 and 3730 and external DQ signals 3710 and 3720 are appended with "[0]" and "[1]".

During a normal read operation (HalfSliceWidthMode=0), the two M5 blocks will each access a four bit parallel word of read data ($Q_M[3:0][0]$ and $Q_M[3:0][1]$). These data bits are converted into serial signals on DQ buses 3710 and 3720, and transmitted to the controller 3705. The serial signals propagate to the controller where they are received (DQ[0,j][0] and DQ[0,j][1]). The R1-0 block 3745 and R1-1 block 3750 in the controller convert the serial signals into four bit parallel words ($Q_C[j][3:0][0]$ and $Q_C[j][3:0][1]$) at 3755, 3760, respectively.

During a reduced power mode (HalfSliceWidthMode=1), the clocks to the R1-1 3750 and M2-1 3740 blocks in the controller and memory are disabled. The DQ[ij][1] signal 3720 of each slice is not used, reducing the available bandwidth by half. The read data from the M5-1 block 3730 must be steered through the M2-0 block 3735 and onto the DQ[i,j][0] signal bus 3710. In the controller, this data must be steered from the R1-0 block 3745 onto the Q[j][3:0][1] signal bus 3760. This steering is accomplished by a four-bit 2-to-1 multiplexer 3795 and a four bit register 3775 in memory 3703, and by two four-bit 2-to-1 multiplexers, 3770 and 3780, and a four bit register 3785 in the controller. The select control input of the multiplexers are driven by the HalfSliceWidthMode signal 3788. In the memory component, this signal is gated with a Load2 signal 3772 (by logic gate 3790) that alternates between selecting the M5-0 read data and the M5-1 read data. The load control input of the registers are driven by the LoadR[j] signal 3795 in the memory controller and by the Load signal 3797 in the memory 3703.

Figure 39:
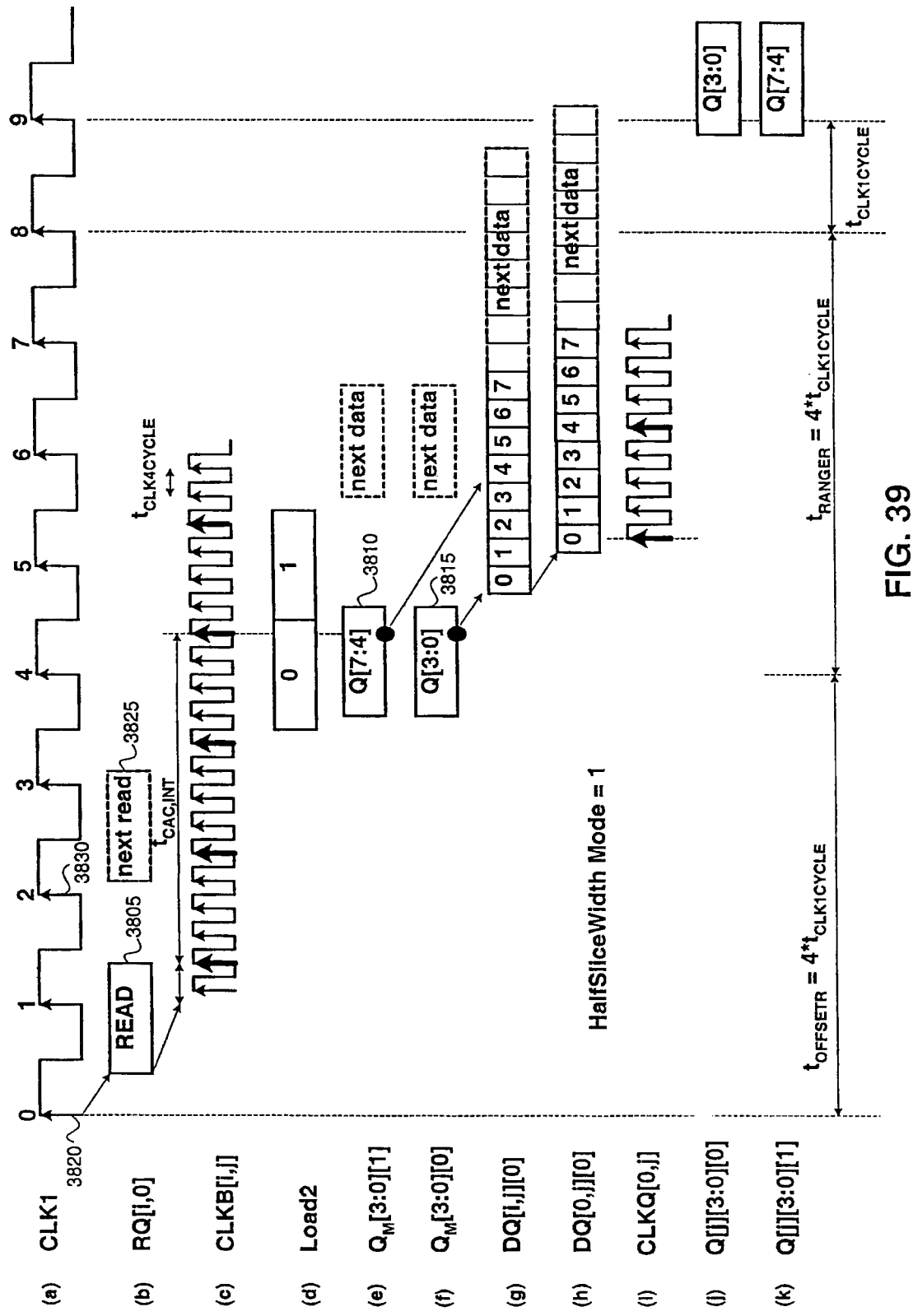
FIG. 39 shows a sequence of timing signals for a read transaction in the memory system of FIG. 38.

FIG. 39 shows timing signals 39(a)-(k) for a read transaction performed by the system of FIG. 38. These timing signals are similar to the previous read transaction diagram (FIG. 14A) except where noted. The Read command 3805 is transmitted as the RQ[i,j] signal 39(b), causing an internal read access to be made to the two memory core blocks R5-0 and R5-1. The parallel read data Q[7:4] 3810 and Q[3:0] 3815 is available on the two internal buses $Q_M[3:0][1]$ and $Q_M[3:0][0]$ in blocks 3730 and 3725, respectively, as represented in signals 39(e) and 39(f). Q[3:0] is selected first because the Load2 signal 39(d) is low and is converted to four serial bits on the DQ[i,j][0] bus, shown as waveform 39(g). Q[7:4] is selected next because the Load2 signal goes high and this signal is also converted into four serial bits on the DQ[i,j][0] bus.

The first four bits Q[3:0] are received on the DQ[0,j][0] bus (waveform 39(g)) by the R1-0 block and converted to four parallel bits, which are loaded into the register 3785. The next four bits Q[7:4] are received on the DQ[0,j][0] bus (waveform 39(g)) by the R1-0 block and converted to four parallel bits. These are multiplexed onto the $Q_C[j][3:0][1]$ signals while the register 3785 is multiplexed onto the $Q_C[j][3:0][0]$ signals by multiplexer 3770.

Note that the eight bits on the $Q_C[j][3:0][0]$ and $Q_C[j][3:0][1]$ signals will be valid for one cycle, and can be asserted at the maximum rate of once every two cycles. In other words, the next read transaction must be asserted after a one cycle gap. In FIG. 39, this may be seen in the top waveform when one READ command 3805 is asserted after CLK1 edge 0 (3820), and the next READ command 3825 (with dotted outline) cannot be asserted until after CLK1 edge 2 (3830). This separation is necessary because each READ command transfers a total of eight bits on the DQ[i,j][0] signal, requiring two CLK1 cycles.

An alternative implementation of a reduced slice width could reduce the number of bits returned by each READ command, in addition to reducing the number of DQ signals driven by each slice in block 3703. This approach would have the benefit of not requiring a one CLK1 cycle between READ commands. Instead, this approach would require that another address bit be added to the request information on the RQ bus so that the one of the four bit words from the M5-0 and M5-1 blocks can be chosen. In the controller, only one of the four bit buses $Q_C[j][3:0][0]$ and $Q_C[j][3:0][1]$ (3775 and 3760, respectively) will contain valid read data in each CLK1 cycle. Alternatively, if each memory component were connected to the controller with more than two DQ signals (four for example), then the reduced slice width modes could include several slice widths.

Note that the above examples represent ways that power usage may be lowered, by reducing the number of signals that each memory slice drives. Other alternatives are also possible.

The HalfSliceWidthMode signal on the controller component and the memory component would typically be driven from a storage register on the memory component, although it could also be a signal that is directly received by each memory component. The HalfSliceWidthMode signal would be asserted and deasserted during normal operation of the system so that power could be reduced. Alternatively, it could be asserted or deasserted during initialization of the system so that power dissipation could be set to the appropriate level. This could be important for reducing the system's temperature or for reducing the system's power consumption. This might be an important feature in a portable system that had limited cooling ability or limited battery capacity.

Note that a write transaction would use a similar set of logic in the controller and memory, but operating in the reverse direction. In other words, the multiplexer 3765 and register 3775 in the memory component of FIG. 38 would be in the T0 cell of the controller 3705, and the two multiplexers (3770, 3780) and register 3785 in the memory controller of FIG. 38 would be in component 3703.

The System shown in FIG. 38 represents one way in which power might be lowered by reducing the number of signals that a component in the memory system transmits or receives. Other methods may include reducing the number of signals that a rank transmits or receives, or reducing the number of bits transmitted or received during each read or write transaction. These alternate methods are described below.

If individual components of memory 3703 connect to the memory controller 3705 with a single DQ signal (such as 3710 and 3720 for blocks 3735 and 3740), it will not be possible to offer a reduced power mode using the dynamic slice width method just described. Instead, a dynamic rank width method could be used. For example, a HalfRankWidthMode signal 3788 could be asserted causing each read transaction or write transaction to access only half of the memory of the rank (e.g., with two or more memory components sharing the same slice within a rank). An address bit could be added to the request information on the RQ bus to select between the two sets of memory components. Selected components would perform the access as in a normal read or write transaction. Memory components not selected would not perform any access and would shut off the internal clock signals as in the dynamic slice width example in FIG. 38.

Likewise, transmit and receive slices of the controller corresponding to the selected memory components could perform the access as in a normal read or write transaction. Transmit and receive slices of the controller corresponding to memory not selected would then not perform any access and would shut off the internal clock signals as in the dynamic slice width example in FIG. 38.

In the above approaches where one is using selected and non-selected memory components for power reduction, it is important to carefully choose the address bit that selects between the two sets of memory components. The address bit taken should probably come from high in the physical address so that successive requests to the memory components tend to access the same half-rank. The selection from high in the physical address could be accomplished with multiplexing logic in the address path of the controller that selected an address bit from a number of possible positions, possibly under the control of a value held in a register set during system initialization.

It would also be possible to adjust the order of successive requests by pulling them out of a queue so that successive requests to the memory components tend to access the same half-rank. Again, this could be accomplished by logic in the controller. The logic would need to ensure that out-of-order request submission produced the same results as in-order submission, permitting one of the two half-ranks to remain in a lower power state for longer periods of time.

By extending the above method, it would be possible to support several rank widths in a memory system. For example, a rank could be divided into quarters, requiring two address bits in the controller and each memory component to select the appropriate quarter-rank.

The HalfRankWidthMode signal 3788 on the controller 3705 and memory would typically be driven from a storage register in component 3703, although it could also be a signal that is directly received by memories. The HalfRankWidthMode signal could be asserted and deasserted during normal operation of the memory system so that power could be effectively reduced. Alternatively, the signal could be asserted or deasserted during initialization of the system so that power dissipation could be set to an optimal or appropriate level.

Reducing the number of bits that are accessed in each read or write transaction could also reduce power. A dynamic depth mode could be defined, in which a HalfDepthMode signal (not shown) is asserted, which causes each read transaction or write transaction to access only half of the normal number of bits for each transaction. As with a prior variation described above, an address bit would have to be added to the request information on the RQ bus to select between the two sets of bits that can be accessed. Likewise, the controller would need to use the same address bit to decide which of the two sets of bits are being accessed. The transmit and receive slices of the controller and memory would shut off the internal clock signals during the periods that no bits are being transferred. This would effectively reduce power by reducing bandwidth.

It would be possible to support several programmable depths in the system by extending the above HalfDepthMode method. For example, the transfer size could be divided into quarters, requiring two address bits in the controller and each memory component to select the appropriate quarter-transfer-block.

The HalfDepthMode signal on the controller component (such as component 3705) and memory components (such as component 3703) would typically be driven from a storage register, although it could also be a signal that is directly received by each component. The HalfDepthMode signal would be asserted and deasserted during normal operation of the system so that power could be reduced. Alternatively, it could be asserted or deasserted during initialization of the system so that power dissipation could be set to an optimal or appropriate level.

Power could also be reduced by reducing the operating frequency of the memory components. This approach is particularly appropriate for dynamic mesochronous clocking systems such as the systems described in this document because there is no clock recovery circuitry in the memory component. The memory component will therefore tolerate a very wide range of input clock frequency, unlike memory components that utilizes DLL or PLL circuits that typically operate in a narrow range of clock frequencies.

A dynamic frequency mode could be defined, in which a HalfFrequencyMode signal is asserted, which caused all signals connecting the controller and memory components to operate at half their normal signaling rate.

In reducing the operating frequency, there would be no change in a memory component such as memory component 3703, except that any timing parameter that is expressed in absolute time units (e.g., nanosecond units, as opposed to clock cycle units) would need to be adjusted for optimal operation. This timing parameter adjustment would typically be done in the controller by changing the interval between commands on the RQ bus. For example, the interval between a row access and a column access to that row must be greater than the $t_{RCD}$ parameter, a core characteristic that is expressed in nanoseconds. The controller will typically insert the appropriate number of clock cycles between the row access command and the column access command to account for this parameter. If the clock rate is reduced by one-half, the number of cycles between the two commands can also be reduced by one-half. If this reduction is not done, the memory component will still operate correctly, but not optimally.

The controller will also need to provide logic to manage the reduction in bandwidth of a memory system if portions of the controller are not operated at a lower clock frequency. In other words, if the controller runs at the normal clock rate and the memory components run at half the clock rate, then the controller will need to wait twice as long for each memory access. Holding registers and multiplexers can handle this process using techniques similar to those for dynamic slice width in FIG. 38. It is noted that it could be possible to support several programmable frequencies in the system by extending this method. For example, the transfer rate could be reduced to one-quarter of the normal rate.

The HalfFrequencyMode signal on the controller of a memory system would typically be driven from a storage register in the controller, although it could also be a signal that is directly received by the controller. The HalfFrequencyMode signal would be asserted and deasserted during normal operation of the system so that power could be reduced. Alternatively, it could be asserted or deasserted during initialization of the system so that power dissipation could be set to an appropriate level.

The preferred embodiments discussed above utilize slices of memory components that each had one DQ (data) signal connecting the memory components in each slice to the controller. As mentioned previously with respect to FIGS. 38 and 39, the benefits of dynamic mesochronous clocking are also realized with memory components that have widths that are greater than one DQ signal.

For example, each memory component could have two DQ signals connecting to the memory controller. In such a system, it would be important to maintain different sampling and driving points in the controller for each slice of DQ signals. However, there is also some benefit to maintaining different sampling and driving points in the controller for the individual DQ signals within each slice.

For example, there could be some dynamic variation of the external access times between the different DQ signals of one memory component. While this variation would be much smaller than the variation between the DQ signals that connect to two different memory components, it is possible that the variation would be large enough to matter. This variation could be easily compensated by using an additional instance of the calibration circuitry described above.

Also, there is a possible static variation needed for the sampling and driving points of the DQ signals connecting to a single memory component because of differences in the length of the interconnect wires between the controller and memory component. This variation could be easily "calibrated out" using an additional instance of the calibration circuitry described above.

Finally, it is likely that a memory controller will be designed to support memory components that have a variety of DQ widths, including a DQ width of one signal as well as a DQ width of two or more signals. This means that such a controller will need to be able to independently adjust the sample and drive points of each DQ signal. This means that when memory components with a DQ width of two or more signals are present, the signals for each memory component can still be given different sample and drive points at no extra cost.

In the preferred embodiment, within a particular rank, each slice contains a single memory component. However, in other embodiments, within a particular rank two or more slices may be occupied by a single memory component (i.e., where the memory component communicates with the memory controller using two or more parallel DQ signal sets). In yet other embodiments, within a particular rank a slice may contain two or more memory components (which would therefore share a single DQ signal set and a set of calibration circuitry within the memory controller, for example using the HalfRankWidthMode signal described above to select one of the two memory components within each slice).

The techniques described for a memory system in accordance with the preferred embodiments permitted phase offsets of clocked components to drift over an arbitrarily large range during system operation in order to remove clock recovery circuits (DLL and PLL circuits) from the memory components. This technique could be applied to a non-memory system just as easily, resulting in similar benefits.

For example, assume there are two logic components (integrated circuits that principally contain digital logic circuits, but which might also include other types of circuits including digital memory circuits and analog circuits) that must communicate at high signaling rates. Prior art methods include placing clock recovery circuitry in both components to reduce timing margin lost because of timing imprecision.

Alternatively, clock recovery circuitry could be entirely removed from one of the logic components, with all phase adjustments performed by another component that still retains the clock recovery circuitry. Periodic calibration similar to that performed in the memory system of the preferred embodiment would keep the required phase offsets near their optimal values for communication between the two components. Keeping phase offsets near their optimal values could be important if there was some design or cost asymmetry between the two components. For example, if one component was very large, or was implemented with a better process technology, it might make sense to place all the clock recovery and phase adjustment circuitry in that component. This placement of the circuitry in one component would allow the other component to remain cheaper or to have a simpler design or use an existing or proven design. Also, if one of the components went through frequent design updates, and the other component remained relatively stable, it might make sense to place all the clock recovery and phase adjustment circuitry in the stable component.

As noted, the term "mesochronous system" refers to a set of clocked components in which the clock signal for each component has the same frequency, but can have a relative phase offset. The techniques described for a preferred system permitted the phase offsets of the clocked components to drift over an arbitrarily large range during system operation in order to remove clock recovery circuits (DLL and PLL circuits) from the memory components. If these clock recovery circuits are left in a memory portion (i.e., not in the controller), the phase offsets of the memory portion will drift across a much smaller range during system operation. However, such a system could still benefit from the techniques utilized in the preferred embodiment to maximize the signaling rate of the data (and request) signals. In other words, in such a system, static phase offsets for the memory components would be determined at system initialization. However, during system operation, these static offsets would be adjusted by small amounts to keep them closer to their optimal points. As a result, the signaling bandwidth of the data (and request) signals could be higher than if these periodic calibration operations were not carried out.

The above could be considered a pseudo-static mesochronous system since it will be expected that the phase offsets of the memory components will not drift too far from the initial values. The hardware to support this could include all the hardware described for a system in accordance with the preferred embodiment. However, because the dynamic phase offset range is expected to be smaller, it is possible that the hardware required could be reduced relative to the preferred embodiment, reducing cost and design complexity.

Dynamic Mesochronous Techniques for
Intra-Device Clocking and Communication

The various techniques described permit the phase offsets of clocked components to drift over an arbitrarily large range during system operation in order to remove clock recovery circuits (e.g., the above DLL and PLL circuits) from a subset of the components in the system. These techniques result in potential benefit in system cost, system power, and system design complexity.

These techniques could also be applied to the internal blocks of a single integrated circuit. As internal clock frequencies of integrated circuits increase, it becomes more difficult to operate all the blocks of a device in a single synchronous clock domain. It may be advantageous to operate the blocks in a mesochronous fashion where clocks for internal blocks are frequency-locked, but having arbitrary phases.

If the internal blocks form a static-mesochronous clocking system, then clock-recovery circuits (such as DLL or PLL) must be present in each block to keep the phase locked to a static value. These clock recovery circuits could introduce unacceptable cost in terms of area, power, or design complexity.

An alternative approach would be to use the dynamic mesochronous techniques for intra-component clocking and communication (instead of for inter-component clocking and communication described in the preferred embodiments above). When a pair of blocks communicates with one another, one block (the "master") would send a clock signal to the other block (the "slave"). The phase difference between the clocks for the master and slave blocks would slowly drift during the operation of the circuit because of temperature and supply voltage variations. In accordance with one alternative preferred embodiment, the master block would perform calibration operations to ensure that it could transmit and receive to the slave block, regardless of the current state of the phase of the slave clock. The calibration hardware and the calibration process would be similar to what has been shown for the above-described preferred embodiments systems. Periodic calibration would keep the required phase offsets near their optimal values for communication between the two blocks.

If the clock recovery circuits are left in the slave block of the integrated circuit, the phase offsets of the clock of the slave block will drift across a much smaller range during system operation. However, such a clocking arrangement could still benefit from the techniques utilized in the preferred embodiment to maximize the signaling rate. In such a system, static phase offsets for the slave blocks would be determined at initialization. However, during operation, these static offsets would be adjusted by small amounts to keep them closer to their optimal points. As a result, signaling bandwidth could be higher than the case where these periodic calibration operations were not carried out.

This intra-device clocking and communication system is similar to a pseudo-static mesochronous clocking system described above, since it will be expected that the phase offsets of the slave blocks will not drift too far from their initial values. The hardware to support a pseudo-static mesochronous device could include all the hardware for a dynamic mesochronous device. However, because the dynamic phase offset range is expected to be smaller, it is possible that the hardware required could be reduced relative to the dynamic mesochronous device, reducing cost and design complexity.

Figure 40:
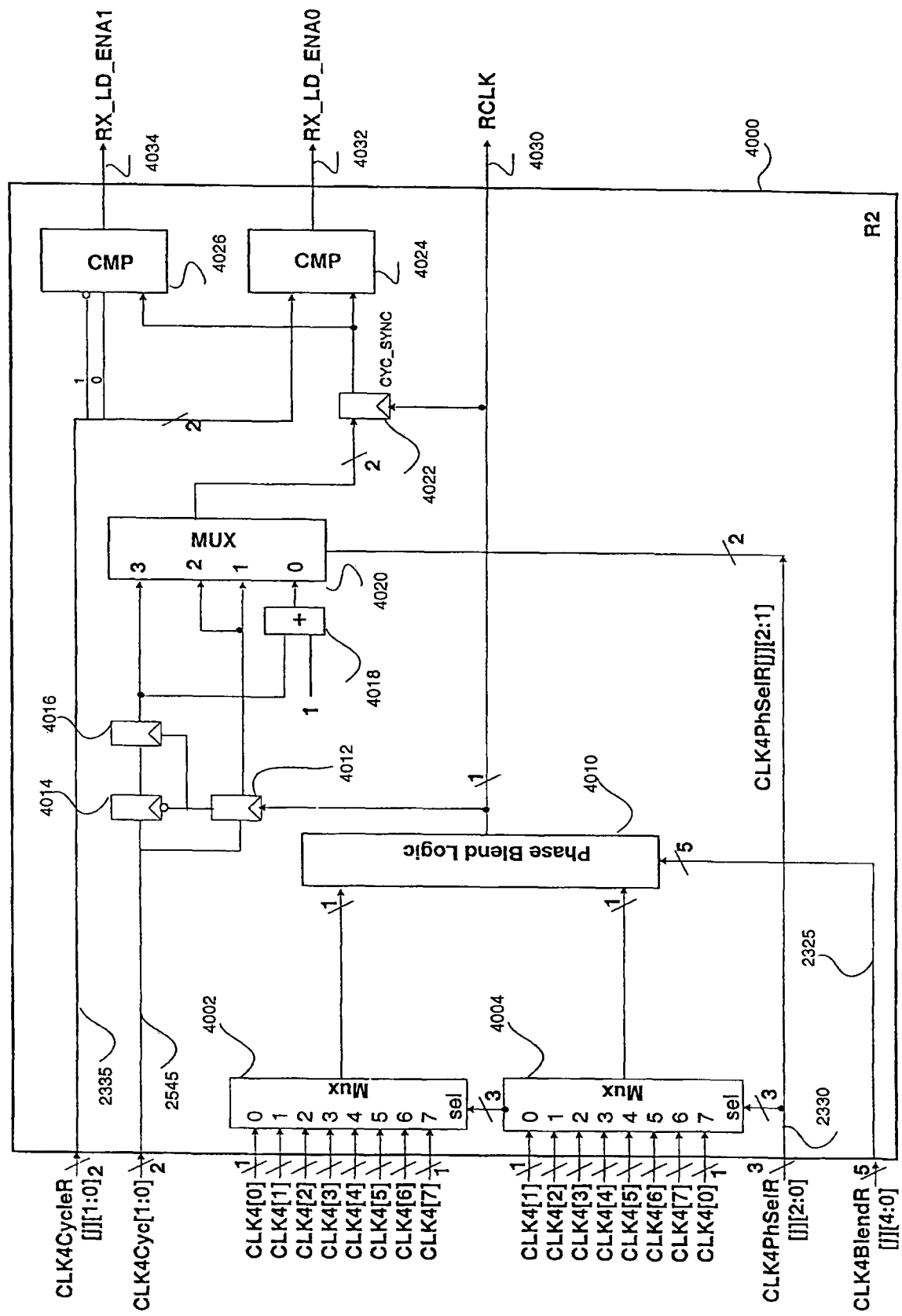
FIG. 40 is another embodiment of a logic diagram of a controller module for creating a clock and control signals for receiving read data.
Figure 41:
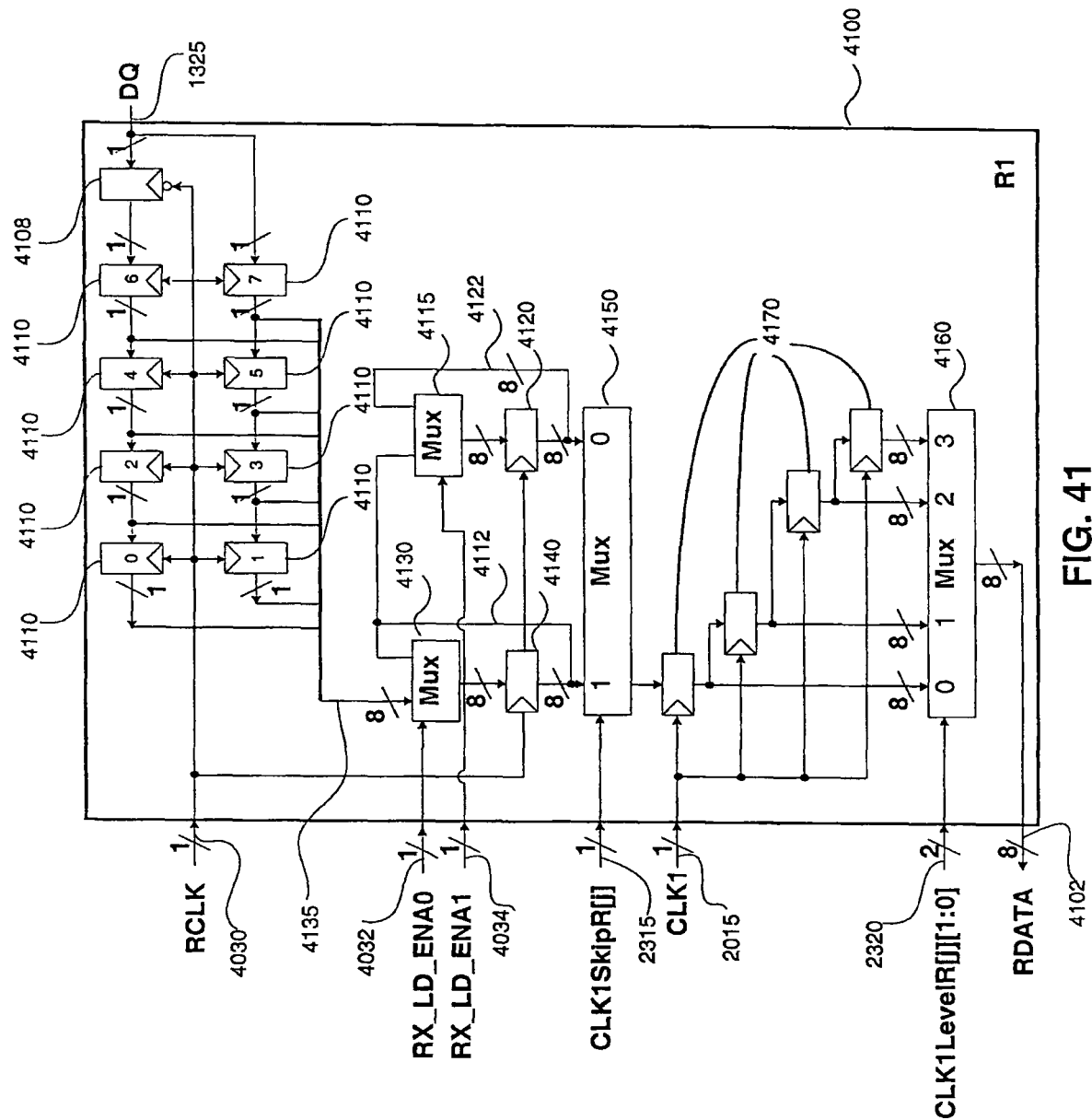
FIG. 41 is another embodiment of a logic diagram of a controller module for receiving read data from a memory and inserting a programmable delay.

FIG. 40 shows another approach to implement the circuit for the controller block R2 2500. This circuit is responsible for creating the RCLK 4030 clock signal needed for receiving the read data from the memory components, and for creating the RX_LD_ENA0 4032 signal for performing serial-to-parallel conversion and the RX_LD_ENA1 4034 signal for synchronizing receive data between the RCLK and CLK1 clock domains in block 4100 (FIG. 41). The inputs to this circuit are CLK4Blend[j][4:0] (line 2325), CLK4PhSelR[j][2:0] (line 2330) and CLK4CycleR[j][1:0] (line 2335) from block R3. This circuit also receives CLK4 [7:0], and CLK4Cyc[1:0] from outside of block R0 (from block C1 in FIG. 20).

The circuit for generating the RCLK 4030 signal is the same as the circuit for generating the CLKQ[0,j] 1334 and its functionality is explained in the description for FIG. 25.

The RX_LD_ENA0 signal indicates when the eight receive data bits have been serially shifted into bit registers 4110 (FIG. 41) and are ready to be loaded onto the parallel bus 4135 (FIG. 41). The CLK4CycleR[j][1:0] signal, generated by block R3, picks one of the four possible load points. When the CLK4PhSelR[j][2:1] signal equals 01 or 10, indicating the phase offset of the CLK4Cyc[1:0] is not within +/−90 degrees of RCLK, then the value of the CLK4Cyc[1:0] is used directly to compute the LD_ENA_0 signal since there is sufficient setup and hold time margins for the sampling clock RCLK (FIG. 40). In the alternative if the CLK4PhSelR[j][2:1] signal equals 11, indicating the phase offset of the CLK4Cyc[1:0] is within −90 degrees of RCLK, then the previous value of CLK4CYC[1:0] is sampled at the negative edge of RCLK at the latch 4014. This pre-sampled CLK4CYC[1:0] value, having sufficient setup and hold time margins for the sampling clock RCLK, is used to compute the LD_ENA_0 signal. In the alternative if the CLK4PhSelR[j][2:1] signal equals 00, indicating the phase offset of the CLK4Cyc[1:0] is within 90 degrees of RCLK, then the previous value of CLK4CYC[1:0] is sampled at the negative edge of RCLK at the latch 4014. This pre-sampled CLK4CYC[1:0] value is then incremented by 1 by the Adder 4018. The resultant value, having sufficient setup and hold time margins for the sampling clock RCLK, is used to compute the LD_ENA_0 signal. Finally, a comparator 4024 compares a RCLK synchronized output of the multiplexer 4020, i.e., a selected CLK4Cyc[1:0] value, to the CLK4CycleR[j][1:0] value. The comparator generates a positive output, i.e. RX_LD_ENA0 is asserted, when its two inputs are equal. This signal is asserted once every 4 RCLK clock cycles.

The RX_LD_ENA1 signal is generated in a similar fashion as the RX_LD_ENA0 signal except the CLK4CycleR [j][1] bit is inverted before it is sent to the comparator 4026. The net effect is that the RX_LD_ENA1 signal is asserted two RCLK cycles after the RX_LD_ENA0 signal is asserted.

FIG. 41 shows another approach to implement the controller block R1 2400 of system 2300 for an 8-bit read data path. This circuit 4100 consists of three stages and is responsible for receiving read data from the memory components and inserting a programmable delay. The first stage is called the de-serialization stage. In this stage, read data input from the DQ 1325 bus is converted to a parallel 8-bit bus 4135 by shifting the serial read data into the latches 4110 through four successive RCLK clock cycles. The latch 4108 is clocked by the negative edge of the RCLK signal so that the even bits are latched during the negative phase of the RCLK signal. Meanwhile, the odd bits are latched during the positive phase of the RCLK signal.

The second stage of controller block R1 2400 is called the synchronization stage, and is also sometimes called the skip circuit. The synchronization stage determines whether the read data is delayed by an additional two RCLK clock cycles (which is equal to a half CLK1 clock cycle), as governed by the CLK1SkipR[j] control signal. The synchronization stage is responsible for transferring the read data from the RCLK clock domain to the CLK1 clock domain, which runs at one fourth of the frequency of RCLK clock. In this stage, the latch 4140 stores the parallel read data selected by RX_LD_ENA0 signal 4032 via the multiplexer 4130. The latch 4120 stores a two-RCLK-cycles-delayed read data selected by RX_LD_ENA1 signal 4034 via the multiplexer 4115. The output of latch 4140 is coupled to an input of the multiplexer 4130 and an input of multiplexer 4115 by signal line 4112. The output of latch 4120 is coupled to an input of the multiplexer 4115 by signal line 4122.

The control signal CLK1SkipR[j] selects either the output of latch 4120 or latch 4140 via the multiplexer 4150 to provide the most optimal setup and hold time margins of the read data with respect to the latch 4170, which is sampled by the CLK1 signal 2015.

The final stage of controller block R1 2400 is called the levelization stage, where a delay of zero to three CLK1 cycles is inserted into the read data path. A four-bit version of this circuit is described above in detail with respect to FIG. 24. The output of the levelization stage is the 8-bit RDATA 4102.

Figure 42:
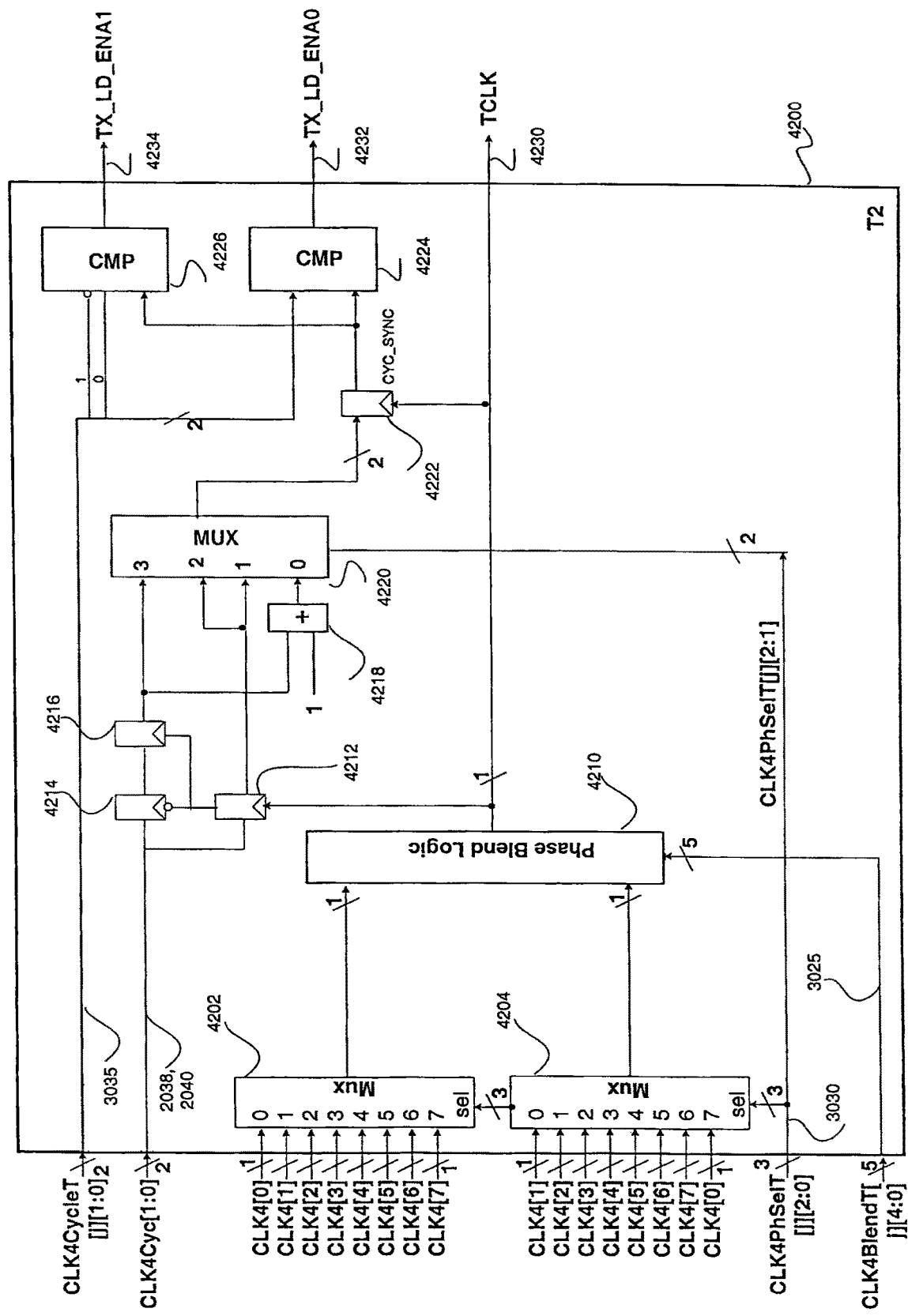
FIG. 42 is another embodiment of a logic diagram of a controller module for creating a clock signal and control signals for transmitting write data.

FIG. 42 shows another approach to implement the controller block T2 3200, which is responsible for creating the TCLK clock signal 4230, TX_LD_ENA0 signal 4232 and TX_LD_EN1 signal 4234 needed for transmitting the write data to the memory component 1310 as shown in FIG. 30. This circuit is exactly the same as the one described in FIG. 40 except the inputs to this circuit are CLK4BlendT[j][4:0], CLK4PhSelT[j][2:0] and CLK4CycleT[j][1:0] from block T3. This circuit also receives CLK4[7:0] and CLK4Cyc[1:0] from outside of block T0 (from block C1 in FIG. 21).

Figure 43:
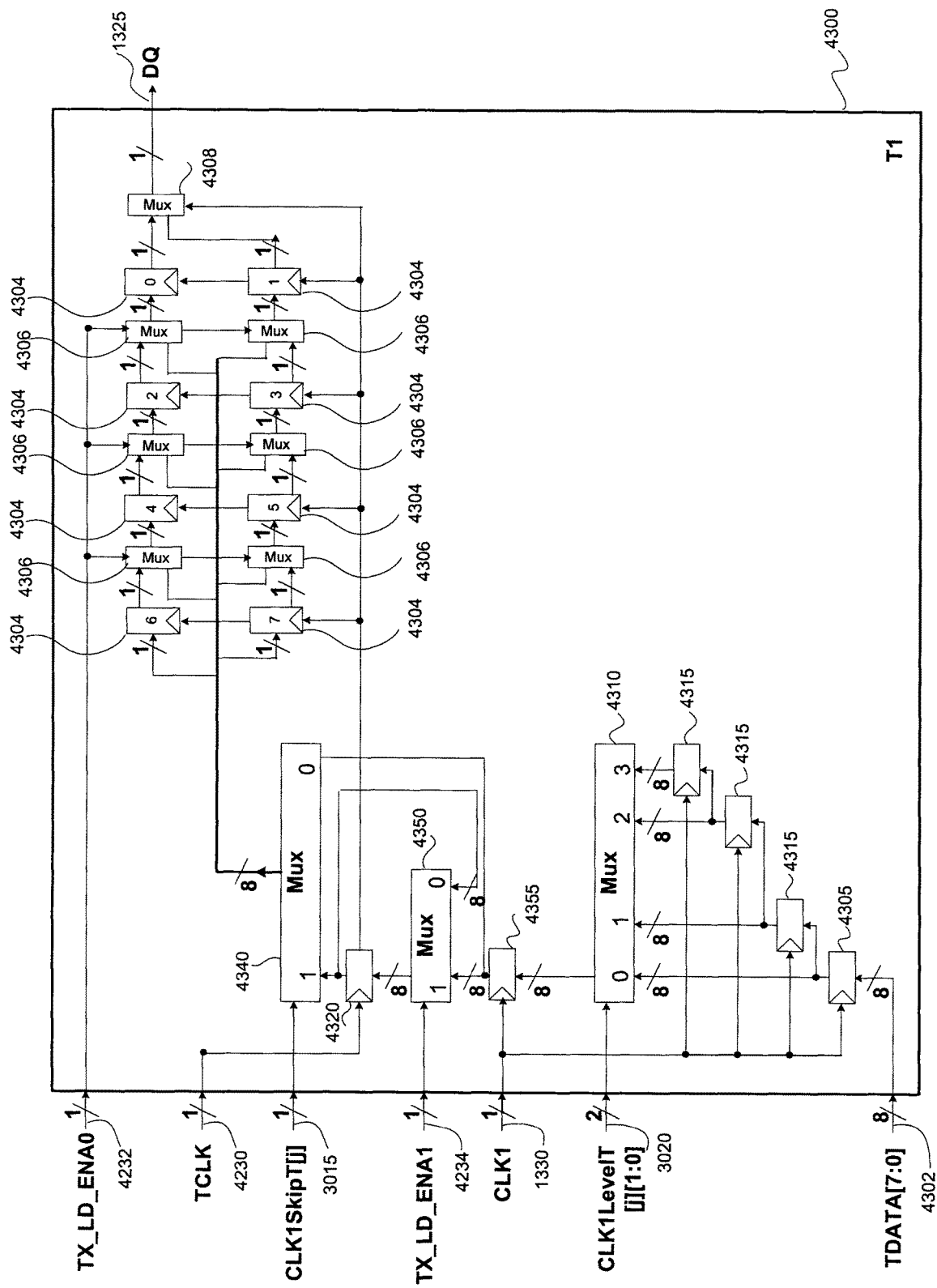
FIG. 43 is another embodiment of a logic diagram of a controller module for transmitting write data and inserting a programmable delay.

FIG. 43 shows another approach for implementing the controller block T1 3100, which is responsible for transmitting write data on an 8-bit parallel bus 4302 to memory and inserting a programmable delay. Similar to the receive read data path, this circuit also consists of three stages, namely levelization, synchronization and serialization.

The first stage of levelization is the same as the embodiment shown in FIG. 31, except that in this embodiment the data path is eight bits wide instead of four bits wide.

In the synchronization stage, the write data is written into and then sent from latch 4355 in the CLK1 domain. This write data is selected via the multiplexer 4350 by the TX_LD_ENA1 signal 4234 prior to being sampled by the TCLK signal 4230 and stored in latch 4320. The CLK1SkipT[j] selects either the output of latch 4320 (TX_LD_ENA1-delayed write data) or the output of latch 4355 via multiplexer 4340 to provide the most optimal setup and hold time margins of the write data with respect to the latches 4304, which are sampled by the TCLK signal 4230.

The final serialization stage is similar to the embodiment described in FIG. 31 except that two parallel sets of 4-bit shift registers 4304 are used to store the 8 bit parallel write data. Six of the write data bits, 0 through 5, are independently loaded via a set of 2-to-1 multiplexers 4306 controlled by the TX_LD_ENA0 signal 4232. Another multiplexer 4308 is controlled by the TCLK, which alternatively selects an even bit during the positive phase of the TCLK and an odd bit during the negative phase of the TCLK. The selected transmit write data bit is sent to the memory via DQ bus 1325.

The data signals on the DQ bus 1325 may be transmitted and received as either single ended or differential data signals. In other embodiments, the number of bits transmitted through the T1 and R1 circuits during each CLK1 clock cycle may be fewer or greater than in the embodiments described above. Further, in other embodiments the ratio of the RCLK and TCLK clock rates to the CLK1 clock rate could be greater than or less than the four-to-one clock rate ratio used in the preferred embodiments. For instance, clock rate ratios of two or eight might be used in other embodiments.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A memory component, comprising:
circuitry to detect when the memory component is first powered up;
a first register and a second register to respectively store a first register content value and a second register content value that are initialized to known values in response to the circuitry detecting the memory component is first powered up;
a first interface to receive commands from a memory controller; and,
a second interface to transmit, to the memory controller, a one of the first register content value and the second register content value as selected by a first command received via the first interface.

2. The memory component of claim 1, wherein the first interface is to receive a second command that specifies the first register content value.

3. The memory component of claim 2, wherein the first interface is to receive a third command that specifies the second register content value.

4. The memory component of claim 3, further comprising:
a memory core, the first interface to receive a fourth command that specifies data to be accessed from the memory core, the data accessed from the memory core to be transmitted, to the memory controller, by the second interface.

5. The memory component of claim 4, wherein the first command and the fourth command are read commands.

6. The memory component of claim 5, wherein the first command and the fourth command use different encodings of bits.

7. The memory component of claim 3, wherein the second command and the third command are write pattern commands.

8. A method of operating a memory component, comprising:
detecting when the memory component is first powered up;
in response to detecting the memory component is first powered up, initializing a first register to a first register content value and a second register to a second register content values, the first register content value and the second register content values to be known values;
receiving a first command to output a one of the first register content value and the second register content value as selected by the first command; and,
outputting the one of the first register content value and the second register content value as selected by the first command.

9. The method of claim 8, further comprising:
receiving a second command that specifies the first register content value.

10. The method of claim 9, further comprising:
receiving a third command that specifies.

11. The method of claim 10, further comprising:
receiving a fourth command that specifies data to be accessed from a memory core; and,
transmitting the data accessed from the memory core to a memory controller.

12. The method of claim 11, wherein the first command and the fourth command are read commands.

13. The method of claim 12, wherein the first command and the fourth command use different encodings of bits.

14. The method of claim 10, wherein the second command and the third command are write pattern commands.

15. A memory component, comprising:
a first terminal to receive a reset indicator;
a first register and a second register to respectively store a first register content value and a second register content value that are initialized to known values in response to the reset indicator;
a second interface to receive commands from a memory controller; and,
a third interface to transmit, to the memory controller, a one of the first register content value and the second register content value as selected by a first command received via the second interface.

16. The memory component of claim 15, wherein the second interface is to receive a second command that specifies the first register content value.

17. The memory component of claim 16, wherein the second interface is to receive a third command that specifies the second register content value.

18. The memory component of claim 17, further comprising:
a memory core, the second interface to receive a fourth command that specifies data to be accessed from the memory core, the data accessed from the memory core to be transmitted, to the memory controller, by the third interface.

19. The memory component of claim 18, wherein the first command and the fourth command are read commands.

20. The memory component of claim 19, wherein the first command and the fourth command use different encodings of bits.

* * * * *